(12) United States Patent
Lee et al.

(10) Patent No.: US 12,717,579 B2
(45) **Date of Patent: *Aug. 25, 2026**

(54) MEMORY SYSTEM AND DATA PROCESSING SYSTEM INCLUDING THE SAME

(71) Applicant: SK hynix Inc., Icheon (KR)

(72) Inventors: Dong Uk Lee, Seoul (KR); Seung Gyu Jeong, Gwangmyeong (KR); Dong Ha Jung, Yongin (KR)

(73) Assignee: SK hynix Inc., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/745,042

(22) Filed: Jun. 17, 2024

(65) Prior Publication Data

US 2024/0338215 A1 Oct. 10, 2024

Related U.S. Application Data

(60) Continuation of application No. 18/061,370, filed on Dec. 2, 2022, now Pat. No. 12,073,217, which is a (Continued)

(30) Foreign Application Priority Data

Nov. 21, 2018 (KR) ........................ 10-2018-0144288
Nov. 30, 2018 (KR) ........................ 10-2018-0152527
Nov. 30, 2018 (KR) ........................ 10-2018-0152528

(51) Int. Cl.
*G06F 9/30* (2018.01)
*G06F 9/48* (2006.01)
(Continued)

(52) U.S. Cl.
CPC ........ *G06F 9/30047* (2013.01); *G06F 9/4818* (2013.01); *G06F 12/0246* (2013.01);
(Continued)

(58) Field of Classification Search
CPC ............... G06F 9/30047; G06F 9/4818; G06F 12/0246; G06F 12/0882; G06F 13/1663;
(Continued)

(56) References Cited

U.S. PATENT DOCUMENTS 5,434,533 A 7/1995 Furutani
5,717,884 A 2/1998 Gzym et al.
(Continued)

FOREIGN PATENT DOCUMENTS

CN 101739357 A 6/2010
CN 102576350 A 7/2012
(Continued)

OTHER PUBLICATIONS

Notice of the First Office Action dated Jan. 18, 2023 for Chinese Application No. 201910197794.8.
(Continued)

*Primary Examiner* — Phong H Dang

(57) ABSTRACT

A data processing system includes a compute blade generating a write command to store data and a read command to read the data, and a memory blade. The compute blade has a memory that stores information about performance characteristics of each of a plurality of memories, and determines priority information through which eviction of a cache line is carried out based on the stored information.

23 Claims, 55 Drawing Sheets

Related U.S. Application Data division of application No. 16/860,850, filed on Apr. 28, 2020, now Pat. No. 11,544,063, which is a continuation-in-part of application No. 16/383,371, filed on Apr. 12, 2019, now Pat. No. 10,963,395, and a continuation-in-part of application No. 16/352,676, filed on Mar. 13, 2019, now Pat. No. 10,762,012, and a continuation-in-part of application No. 16/288,015, filed on Feb. 27, 2019, now Pat. No. 10,860,498.

(51) Int. Cl.

| | |
|---|---|
| ***G06F 12/02*** | (2006.01) |
| ***G06F 12/0882*** | (2016.01) |
| ***G06F 13/16*** | (2006.01) |
| ***G11C 5/02*** | (2006.01) |
| ***G11C 11/4093*** | (2006.01) |
| ***G11C 29/42*** | (2006.01) |
| ***G11C 29/44*** | (2006.01) |

(52) U.S. Cl.
CPC ...... *G06F 12/0882* (2013.01); *G06F 13/1663* (2013.01); *G11C 5/025* (2013.01); *G11C 11/4093* (2013.01); *G11C 29/42* (2013.01); *G11C 29/44* (2013.01)

(58) Field of Classification Search
CPC ..... G11C 5/025; G11C 11/4093; G11C 29/42; G11C 29/44
See application file for complete search history.

(56) References Cited

U.S. PATENT DOCUMENTS

| | | | | |
|---|---|---|---|---|
| 5,754,567 | A | 5/1998 | Norman | |
| 7,206,902 | B2 | 4/2007 | Hakura et al. | |
| 7,606,982 | B2 | 10/2009 | Hwang | |
| 8,095,738 | B2 | 1/2012 | Benhase et al. | |
| 8,200,911 | B2 | 6/2012 | Jeong | |
| 8,433,852 | B2 | 4/2013 | Hu et al. | |
| 8,792,511 | B2 | 7/2014 | Raikar et al. | |
| 8,819,390 | B1 | 8/2014 | Sivasubramanian et al. | |
| 9,432,298 | B1 | 8/2016 | Smith | |
| 9,612,975 | B2 | 4/2017 | Li | |
| 10,860,498 | B2 | 12/2020 | Jeong | |
| 11,569,216 | B2 * | 1/2023 | Park | H10W 20/023 |
| 12,073,217 | B2 * | 8/2024 | Lee | G06F 12/0882 |
| 2005/0195635 | A1 | 9/2005 | Conley et al. | |
| 2006/0041723 | A1 | 2/2006 | Hakura et al. | |
| 2006/0175697 | A1 * | 8/2006 | Kurosawa | H01L 24/83 257/E21.705 |
| 2008/0009124 | A1 * | 1/2008 | Ishino | H01L 25/0652 257/E21.705 |
| 2008/0291767 | A1 | 11/2008 | Barnes et al. | |
| 2009/0089466 | A1 | 4/2009 | Cunningham et al. | |
| 2011/0129225 | A1 | 6/2011 | Gostin et al. | |
| 2012/0311269 | A1 | 12/2012 | Loh et al. | |
| 2012/0317356 | A1 | 12/2012 | Ignatowski | |
| 2013/0290643 | A1 | 10/2013 | Lim et al. | |
| 2014/0048947 | A1 | 2/2014 | Lee et al. | |
| 2014/0068209 | A1 | 3/2014 | Lim et al. | |
| 2014/0115225 | A1 | 4/2014 | Chandrakar et al. | |
| 2014/0149653 | A1 | 5/2014 | Udipi et al. | |
| 2014/0149694 | A1 | 5/2014 | Lee et al. | |
| 2014/0176187 | A1 * | 6/2014 | Jayasena | H01L 25/18 326/39 |
| 2014/0181417 | A1 | 6/2014 | Loh et al. | |
| 2014/0181458 | A1 | 6/2014 | Loh et al. | |
| 2014/0379995 | A1 | 12/2014 | Kwon et al. | |
| 2015/0039968 | A1 | 2/2015 | Orion | |
| 2016/0041902 | A1 | 2/2016 | Atkisson et al. | |
| 2016/0055089 | A1 | 2/2016 | Kim et al. | |
| 2018/0113815 | A1 | 4/2018 | Eckert et al. | |
| 2018/0157782 | A1 | 6/2018 | Rossi et al. | |
| 2018/0210830 | A1 | 7/2018 | Malladi et al. | |
| 2018/0276126 | A1 * | 9/2018 | Ito | G06F 12/0815 |
| 2018/0277224 | A1 | 9/2018 | Shirota et al. | |
| 2018/0300265 | A1 | 10/2018 | Roberts et al. | |
| 2020/0174952 | A1 | 6/2020 | Lee | |
| 2021/0175161 | A1 * | 6/2021 | Park | H01L 24/06 |
| 2022/0077127 | A1 * | 3/2022 | Park | H01L 21/78 |

FOREIGN PATENT DOCUMENTS

| | | | |
|---|---|---|---|
| KR | 10-2012-0059075 | A | 6/2012 |
| KR | 20140067740 | A | 6/2014 |
| KR | 10-2014-0132424 | A | 11/2014 |
| KR | 20190074823 | A | 6/2019 |

OTHER PUBLICATIONS

Somogyi, et al., Spatio-Temporal Memory Streaming, ISCA, Proceedings of the 36th Annual International Symposium on Computer Architecture, 2009, p. 12.

* cited by examiner

420A
FIRST-GROUP MEMORY
FAST DRAM
FAST DRAM
SLOW DRAM
SLOW DRAM
...
220A
211
ADDRESS DECODER
ADD
CHARACTERISTIC STORAGE CIRCUIT
215
EVICTION CIRCUIT
214
213
WAY BLOCK
WAY 3
WAY 2
WAY 1
WAY 0
212
CACHE MEMORY
220B
CPU
210A
CPU
210B

MEMORY SYSTEM AND DATA PROCESSING SYSTEM INCLUDING THE SAME

CROSS-REFERENCE TO RELATED APPLICATION

The present application is a continuation of U.S. application Ser. No. 18/061,370, filed on Dec. 2, 2022, which is a division of U.S. application Ser. No. 16/860,850, filed on Apr. 28, 2020, which is a continuation in part of U.S. application Ser. No. 16/288,015, filed on Feb. 27, 2019, U.S. application Ser. No. 16/383,371, filed on Apr. 12, 2019, and U.S. application Ser. No. 16/352,676, filed on Mar. 13, 2019, which respectively claim priority under 35 U.S.C. § 119 (a) to Korean application number 10-2018-0144288, filed on Nov. 21, 2018, Korean application number 10-2018-0152527, filed on Nov. 30, 2018, and Korean application number 10-2018-0152528, filed on Nov. 30, 2018, in the Korean Intellectual Property Office, each of which is incorporated herein by reference in its entirety.

BACKGROUND OF THE INVENTION

1. Technical Field

Embodiments of the present disclosure may generally relate to a data processing system, and more particularly to a technology for implementing a convergence memory system provided with a plurality of memories.

This patent document relates to a semiconductor technology, and more particularly, to a semiconductor package in which a plurality of semiconductor chips are stacked in a vertical direction, and a method for fabricating the semiconductor package.

2. Related Art

In recent times, various mobile communication terminals, for example, smartphones, tablet PCs, etc. have been widely used throughout the world. In addition, demand for a Social Network Service (SNS), a Machine to Machine (M2M) service, a sensor network, etc. accessible from anywhere at any time is rapidly increasing. Therefore, the amount of data, the speed of creating data, and diversity of data are geometrically increasing. In order to process increasing quantities of data, data processing rates of memory are important, and a high-capacity memory device and a high-capacity memory module are also needed.

Therefore, a memory system includes a plurality of memory devices to increase storage capacity. However, the plurality of memory devices contained in the memory system may have different memory characteristics. Therefore, when cache management is executed in the memory system, memory devices with different memory characteristics can cause access errors, resulting in miss penalties in a memory system.

BRIEF SUMMARY OF THE INVENTION

Various embodiments of the present disclosure are directed to providing a data processing system that substantially obviates one or more issues due to limitations and disadvantages of the related art.

The embodiments of the present disclosure relate to a memory system for assigning priority information in response to memory characteristics during eviction of one or more cache lines, resulting in reduction in a miss penalty.

The embodiments of the present disclosure relate to a memory system for analyzing requests by a host, predicting data that may be subsequently accessed by the host, and transmitting data selected according to the prediction from among data of an entire page, thus reducing overhead.

Embodiments of the present disclosure relate to a memory system in which each memory includes a shared channel, such that a plurality of chips contained in the memory system may share the memory through the shared channel.

In accordance with an embodiment of the present disclosure, a data processing system includes a compute blade configured to generate a write command needed to store data and a read command needed to read the data, and a memory blade configured to selectively perform read and write operations in response to the read and write commands in a plurality of memories. The compute blade has a cache memory that stores information about performance characteristics of each of the plurality of memories, and is configured to determine priority information through which eviction of a cache line is carried out based on the stored information.

In accordance with an embodiment of the present disclosure, a memory system includes a host configured to generate memory information by profiling history information about a memory access pattern, and at least one memory device configured to predict a data pattern of a page to be accessed by the host, using the memory information, generate subset data from the pate according to the predicted data pattern, and transmit the generated subset data to the host, wherein the subset data is less than all the data of the page.

In accordance with another embodiment of the present disclosure, a memory system includes a memory device, a memory profile circuit configured to generate memory information by profiling history information about a memory access pattern, and a data prediction circuit configured to predict a data pattern of a page to be accessed by the host, using the memory information, and generate subset data of the page according to the predicted data pattern wherein the subset data is less than all the data of the page.

In accordance with an embodiment of the present disclosure, a memory system includes a first chip configured to perform a first operation, a second chip configured to perform a second operation, and a stacked memory device configured to include a stacked structure of a plurality of memories. The stacked memory device being configured to be accessed by the first chip and the second chip through a shared bus.

In an embodiment, a semiconductor package may include: a second semiconductor chip including a second body portion, a second through electrode that penetrates the second body portion, and a second connection electrode that is connected to one end of the second through electrode; a first semiconductor chip stack disposed over the second semiconductor chip and including a plurality of first semiconductor chips stacked in a vertical direction, wherein each of the plurality of first semiconductor chips includes a first body portion, a first through electrode penetrating the first body portion, and a first connection electrode connected to one end of the first through electrode; a molding layer surrounding a side surface of the second semiconductor chip and the first semiconductor chip stack; a third semiconductor chip disposed over the molding layer and the first semiconductor chip stack; and an external connection electrode electrically connected to an other end of the second through electrode, wherein, the second semiconductor chip and the plurality of first semiconductor chips are electrically connected through the second through electrode, the second connection electrodes, the first through electrode, and the first connection electrodes.

In another embodiment, a method for fabricating a semiconductor package may include: forming a first semiconductor chip stack including a plurality of first semiconductor chips stacked in a vertical direction, over a first surface of a semiconductor wafer, wherein each of the plurality of first semiconductor chips includes a first body portion, a first through electrode penetrating the first body portion, and a first connection electrode connected to one end of the first through electrode; forming a second semiconductor chip including a second body portion, a second through electrode that penetrates the second body portion, and a second connection electrode that is connected to one end of the second through electrode, over the first semiconductor chip stack; forming a molding layer surrounding a side surface of the second semiconductor chip and the first semiconductor chip stack, over the semiconductor wafer; forming an external connection electrode electrically connected to an other end of the second through electrode, over the molding layer; thinning a portion of the semiconductor wafer from a second surface of the semiconductor wafer, which is located opposite to the first surface of the semiconductor wafer; and dicing the semiconductor wafer and the molding layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions. Throughout the specification of the present disclosure, if it is assumed that a certain part is connected (or coupled) to another part, the term "connection or coupling" means that the certain part is directly connected (or coupled) to another part and/or is electrically connected (or coupled) to another part through the medium of a third party. Throughout the specification of the present disclosure, if it is assumed that a certain part includes a certain component, the term "comprising or including" means that a corresponding component may further include other components unless a specific meaning opposed to the corresponding component is written. As used in the specification and appended claims, the terms "a", "an", "one", "the" and other similar terms include both singular and plural forms, unless context clearly dictates otherwise. The terms used in the present application are merely used to describe specific embodiments and are not intended to limit the present disclosure. A singular expression may include a plural expression unless otherwise stated in the context.

Figure 1:
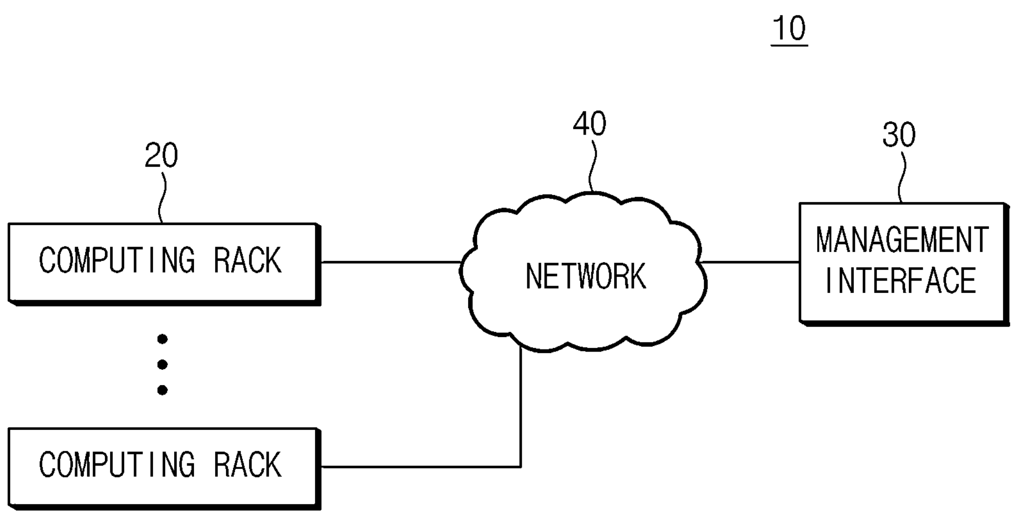
FIG. 1 is a block diagram illustrating an example of a data processing system according to an embodiment of the present disclosure.

FIG. 1 is a block diagram illustrating an example of a data processing system 10 according to an embodiment of the present disclosure.

Referring to FIG. 1, the data processing system 10 may include a plurality of computing racks 20, a management interface 30, and a network 40 through which the computing racks 20 and the management interface 30 can communicate with each other. The data processing system 10 provided with such a rack-scale architecture may be used in a data center for processing a large amount of data, or the like.

Each of the computing racks 20 may independently implement a single computing device. Alternatively, each of the computing racks 20 may be combined with other computing racks, resulting in implementation of a single computing device. Detailed constituent elements and operations of the computing racks 20 will be described later with reference to the attached drawings.

The management interface 30 may provide an interactive interface through which a user can coordinate, administer, or manage the data processing system 10. The management interface 30 may be implemented as an arbitrary computing device including various kinds of devices, for example, a computer, a system, a server, a rack-mount server, a blade server, a laptop, a tablet PC, a wearable computing device, a network device, a Web device, a distributed computing system, a processor based system, and/or a consumer electronic device.

In accordance with one embodiment, the management interface 30 may be implemented as a distributed system having either compute functions capable of being executed by the computing racks 20, or user interface (UI) functions capable of being executed by the management interface 30. In accordance with another embodiment, the management interface 30 may be implemented as a virtual server which is composed of multiple computing devices distributed through the network 40 and operates as a cloud device. In this case, the management interface 30 may include a processor, an input/output (I/O) sub system, a memory, a data storage device, and a communication circuit.

The network 40 may perform data communication between the management interface 30 and each of the computing racks 20, and/or may perform data communication between the computing racks 20. The network 40 may be a wired or wireless network, or have a combination of wired and wireless elements.

The network 40 may be a wired or wireless Local Area Network (LAN), a Wide Area Network (WAN) cellular network, and/or a publicly-accessible global network such as the Internet. In addition, the network 40 may include a number of network devices such as computers, routers, switches, etc.

Figure 2:
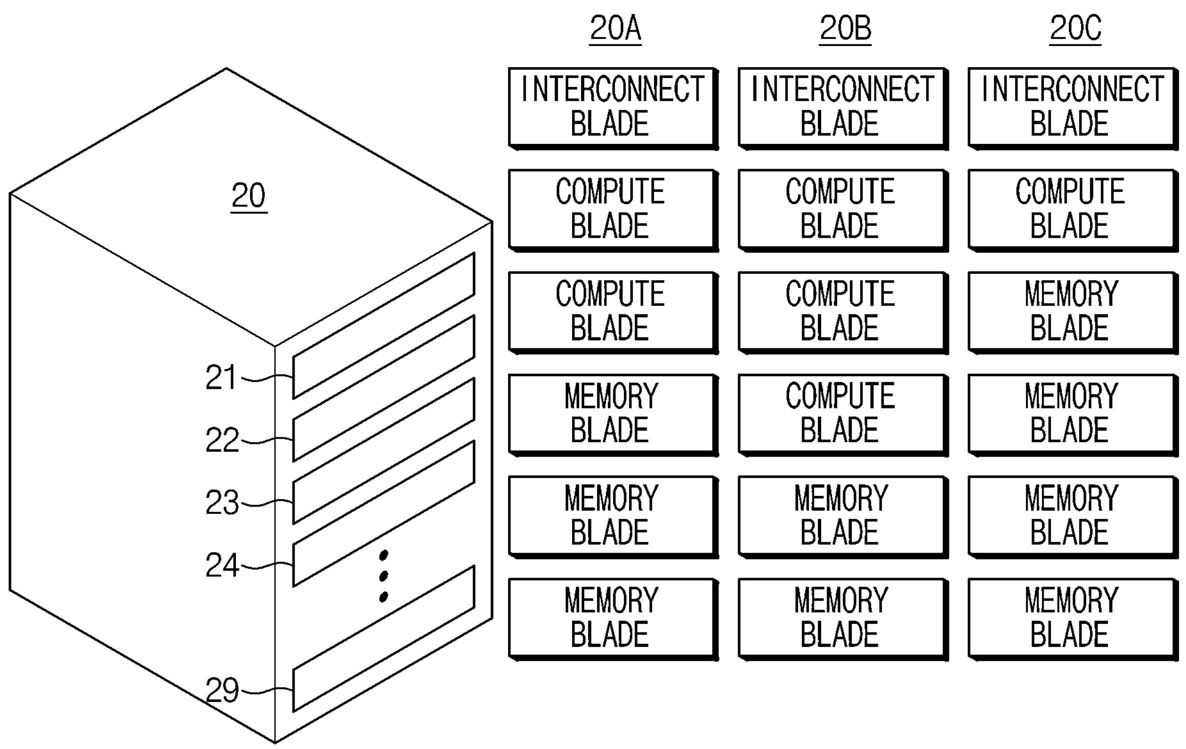
FIG. 2 is a block diagram illustrating an example of a computing rack shown in FIG. 1 according to an embodiment of the present disclosure.

FIG. 2 is a block diagram illustrating a computing rack shown in FIG. 1 according to an embodiment of the present disclosure.

Referring to FIG. 2, the scope of the computing rack 20 is not limited to the specific structures, shapes, names, etc. shown in the figure, and it should be noted that the computing rack 20 may include various components. For example, the computing rank 20 may include a plurality of drawers 21 to 29. Each of the drawers 21 to 29 may include a plurality of modules, and each of the modules may include a plurality of blades.

In accordance with one embodiment, the computing rack 20 may be implemented by a combination of one or more compute blades, one or more memory blades, and/or one or more interconnect blades. Although the term "computing rack" is used by the present disclosure to refer to a combination of the plurality of blades, it should be noted that the computing rack may also be referred to as by other names, for example, drawers, modules, trays, boards, chassis, units, or the like.

The components of a computing rack 20 may be sorted or classified according to their functions. Although the scope of the present disclosure is not limited to any specific embodiment, the computing rack 20 may include one interconnect blade, at least one compute blade, and at least one memory blade in a downward direction.

In various embodiments, a computing device may be implemented by a single computing rack 20. Alternatively, the computing device may be implemented by all blades contained in at least two computing racks 20, by a combination of a portion of the blades contained in at least two computing racks 20, or a portions of the blades in a single computing rack 20.

In accordance with various embodiments, the computing device may be implemented by a combination of compute blades, memory blades, and interconnect blades contained in the computing rack 20. For example, the computing device 20A may include a combination of two compute blades, three memory blades, and a single interconnect blade. In another example, the computing device 20B may include a combination of three compute blades, two memory blades, and a single interconnect blade. In yet another example, the computing device 20C may include a combination of a single compute blade, four memory blades, and a single interconnect blade.

Although FIG. 2 illustrates a computing rack 20 that includes a plurality of compute blades, memory blades, and interconnect blades, the scope of the present disclosure is not limited thereto. The computing rack 20 may include additional constituent elements that are present in a general server, for example, a power system, a cooling system, input/output (I/O) devices, etc.

Figure 3:
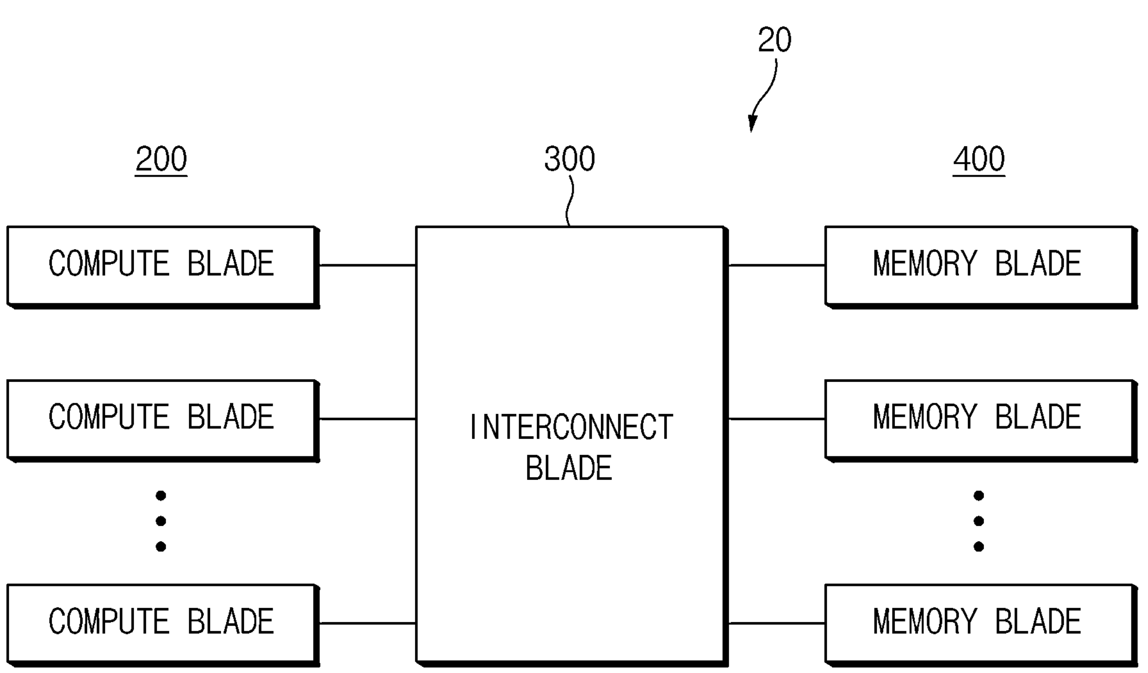
FIG. 3 is a block diagram illustrating an example of a computing rack shown in FIG. 1 according to an embodiment of the present disclosure.

FIG. 3 is a block diagram illustrating the computing rack 20 shown in FIG. 1 according to an embodiment of the present disclosure.

Referring to FIG. 3, the computing rack 20 may include a plurality of compute blades 200, an interconnect blade 200, and a plurality of memory blades 400.

In this case, the plurality of compute blades 200 may be referred to as pooled compute blades, pooled compute systems, or the like. Similarly, the plurality of memory blades 400 may also be referred to as pooled memory blades, pooled memory system, or the like. Each of the compute blades 200 may generate a write command to store data and a read command to read data. Each compute blade 200 may include at least one processing element, for example, at least one processor, at least one processing/control circuit, or at least one central processing unit (CPU).

Each of the memory blades 400 may selectively perform a read or write operation of data in response to a read command or a write command. In more detail, each memory blade 400 may perform a read operation to read data in response to the read command, and may perform the write operation to write data in response to the write command. Each memory blade 400 may include various types of memories, for example, a plurality of volatile memories and/or a plurality of non-volatile memories.

In an embodiment, each of the memory blades 400 may include a plurality of Dynamic Random Access Memories (DRAMs), flash memories, memory cards, Hard Disk Drives (HDDs), Solid State Drives (SSDs), or a combination thereof.

Each of the memory blades 400 may be divided, allocated, or designated by one or more processors contained in each compute blade 200. Each memory blade 400 may store at least one operating system (OS) capable of being initialized and/or performed by the compute blades 200.

The interconnect blade 300 may have a plurality of network interface ports, cards, or switches. The interconnect blade 300 may use protocols related to one or more wired or wireless communication technologies. For example, the interconnect blade 300 may support data communication between each of the compute blades 200 and each of the memory blades 400 according to various protocols such as Peripheral Component Interconnect Express (PCIe), QuickPath Interconnect (QPI), Ethernet, and the like.

A server system or a data processing system, such as a data center, may have a plurality of blades (e.g., compute blades 200, memory blades 400, etc.) mounted into a unit computing rack 20 while simultaneously being distinguished from one another within the computing rack 20. A single memory blade or multiple memory blades may be implemented as a convergence memory device in which the same or different kinds of memories are provided, or may also be implemented as a pooled memory system.

Figure 4:
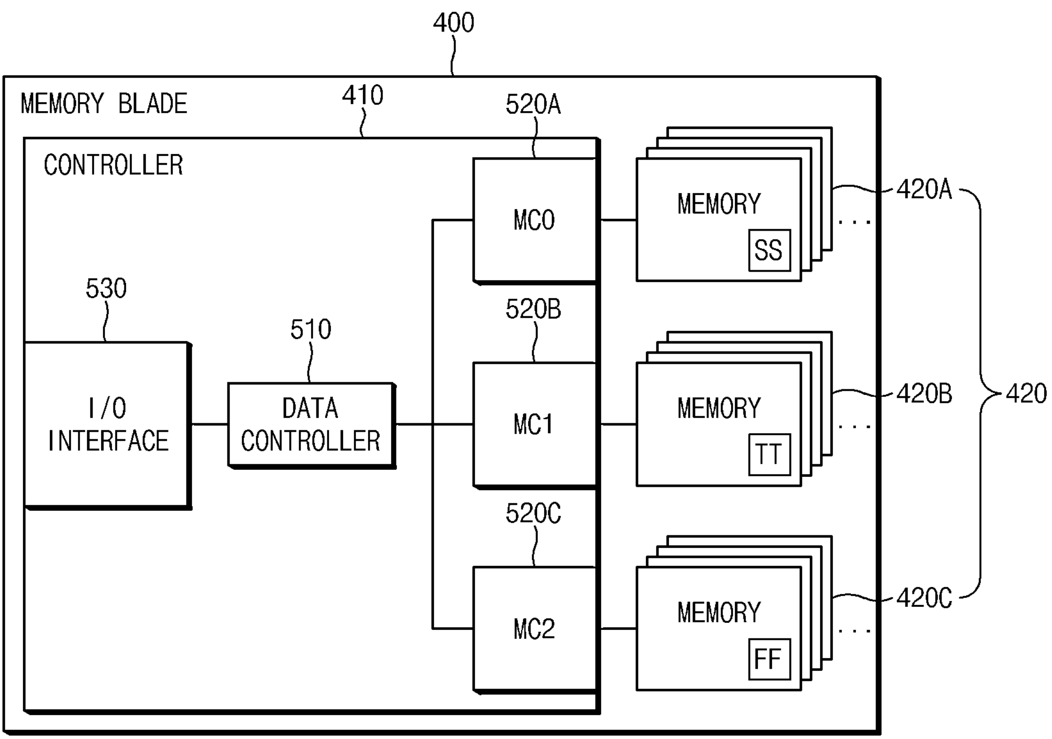
FIG. 4 is a schematic diagram illustrating an example of a memory blade shown in FIG. 3 according to an embodiment of the present disclosure.

FIG. 4 is a schematic diagram illustrating each memory blade shown in FIG. 3 according to an embodiment of the present disclosure.

Referring to FIG. 4, the memory blade 400 may include a controller 410 and a plurality of memories 420.

The controller 410 may include a data controller 510, a plurality of memory controllers 520A~520C, and an Input/Output (I/O) interface 530.

The data controller 510 may control data which is communicated between the compute blades 200 shown in FIG. 3 and the memories 420. For example, the data controller 510 may receive data to be written, from the compute blades 200 in response to a write request or a write command. The data controller 510 may control the write operation for writing the received data in a corresponding memory from among the plurality of memories 420. In another example, the data controller 510 may read data stored in a specific memory from among the plurality of memories 420 in response to a read request or a read command from the compute blades 200. The data controller 510 may control a read operation for outputting read data to the corresponding compute blade from among the compute blades 200.

The memory controllers 520A~520C may be disposed between the data controller 510 and the plurality of memories 420, and may provide an interface between the data controller 510 and the memories 420. The memory controller 520A may control operations of a first group of memories 420A contained in the plurality of memories 420. The memory controller 520B may control operations of a second group of memories 420B contained in the plurality of memories 420. The memory controller 520C may control operations of a third group memories 420C contained in the plurality of memories 420.

Accordingly, the memory controller 520A may be disposed between the data controller 510 and the first group of memories 420A, and may support data communication between the data controller 510 and the first group of memories 420A. The memory controller 520B may be disposed between the data controller 510 and the second group of memories 420B, and may support data communication between the data controller 510 and the second group of memories 420B. The memory controller 520C may be disposed between the data controller 510 and the third group of memories 420C, and may support data communication between the data controller 510 and the third group of memories 420C.

As can be seen from FIG. 4, the controller 410 may exemplarily include three memory controllers 520A~520C for convenience of description. However, the scope of the present disclosure is not limited thereto. In some embodiments, the controller 410 has one memory controller 520 for each type of memory 420. If the first-group memories 420A, the second-group memories 420B, and the third-group memories 420C are the same kind of memories, the controller 410 may have a single memory controller.

The I/O interface 530 may provide an interface between the data controller 510 and the compute blades 200 through the interconnect blade 300. The I/O interface 530 may transmit (Tx) data received from the data controller 510 to the interconnect blade 300 using protocols related to at least one wired or wireless communication technology, and may receive (Rx) data from the interconnect blade 300 and transmit the receive data to the data controller 510.

For example, the I/O interface 530 may support data communication between the data controller 510 and the interconnect blade 300 according to various protocols such as Peripheral Component Interconnect Express (PCIe), QuickPath Interconnect (QPI), Ethernet, and the like.

In response to a control signal received from the controller 410, the plurality of memories 420 may store (or write) data, or may output (or read) the stored data. The plurality of memories 420 may include the first-group memories 420A, the second-group memories 420B, and the third-group memories 420C. The first-group memories 420A, the second-group memories 420B, and the third-group memories 420C may have the same or different characteristics.

In accordance with some embodiments, the first-group memories 420A, the second-group memories 420B, and the third-group memories 420C may have the same or different latency characteristics.

For example, the first-group memories 420A, the second-group memories 420B, and the third-group memories 420C may be DRAM memories with the same characteristics. Alternatively, the first-group memories 420A, the second-group memories 420B, and the third-group memories 420C may be another type of memories, for example, Static Random Access Memories (SRAMs) or flash memories. In addition, the first-group memories 420A, the second-group memories 420B, and the third-group memories 420C may also be implemented as different types of memories.

In accordance with other embodiments, the same kind of memories 420, e.g., volatile memories (DRAMs), contained in the memory blade 400 may share or indicate various performance characteristics according to various temperature environments. In this case, the performance characteristics may include data access speed, a refresh period, or an amount of On-Chip leakage.

That is, the first-group memories 420A, the second-group memories 420B, and the third-group memories 420C may be in different temperature environments. The first-group memories 420A may operate in a first temperature environment, e.g., a room-temperature environment. The second-group memories 420B may operate in a second temperature environment, e.g., a low-temperature environment. The third-group memories 420C may operate in a third temperature environment, e.g., an ultralow-temperature (cryogenic) environment.

For example, when the third-group memories 420C operate in the cryogenic environment, the operating speed of the volatile memories (e.g., DRAMs) may be faster. In addition, as the amount of on-chip leakage decreases, the refresh period may be extended, thereby reducing a total amount of energy consumed by the volatile memory used in the cryogenic environment. As described above, the volatile memory used in the cryogenic environment may have the same characteristics as the non-volatile memory. In an embodiment, in response to a request signal requesting the best system performance, the third-group memories 420C disposed in the cryogenic environment may be selected from among the plurality of memories 420. As a result, the memory blade 400 shown in FIG. 4 may more quickly cope with a request signal (e.g., an urgent request signal) having a relatively higher priority, and at the same time may greatly reduce power consumption.

If a request signal requesting satisfactory system performance is received by a memory controller, the second-group memories 420B may be selected. In addition, when the first-group memories 420A operate in a higher temperature environment such as the room-temperature environment, the operation speed of the volatile memory is reduced. As the amount of on-chip leakage increases, power consumption may also increase in proportion to the increasing on-chip leakage.

Therefore, the first-group memories 420A, the second-group memories 420B, and the third-group memories 420C may be used in environments of various temperatures, resulting in implementation of various performance characteristics. Therefore, the first-group memories 420A may be set to memories operating in the room-temperature environment, each of which has first characteristics (e.g., slow characteristics: SS) corresponding to a slow operation speed. The second-group memories 420B may be set to memories operating in the low-temperature environment, each of which has second characteristics (e.g., normal characteristics: TT) corresponding to a normal operation speed. The third-group memories 420C may be set to memories operating in the ultralow-temperature (cryogenic) environment, each of which has third characteristics (e.g., fast characteristics: FF) corresponding to a fast operation speed.

Figure 5:
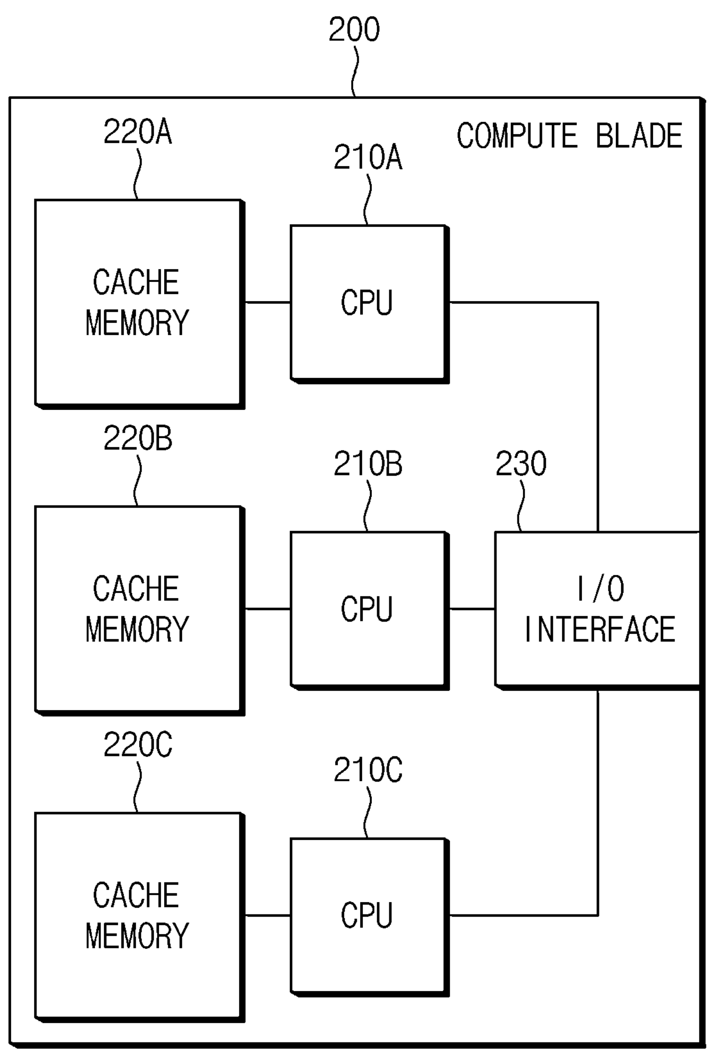
FIG. 5 is a schematic diagram illustrating an example of a compute blade shown in FIG. 3 according to an embodiment of the present disclosure.

FIG. 5 is a schematic diagram illustrating the compute blade shown in FIG. 3 according to an embodiment of the present disclosure.

Referring to FIG. 5, the compute blade 200 may include one or more CPUs 210A~210C, one or more cache memories 220A~220C, and an I/O interface 230.

Each of the CPUs 210A~210C may generate a command for controlling at least one memory blade 400. Each of the CPUs 210A~210C may be used to divide, allocate, or designate at least one memory blade 400 from among the plurality of memory blades 400 shown in FIG. 3. Each of the CPUs 210A~210C may initialize at least one divided, allocated, or designated memory blade 400. Each of the CPUs 210A~210C may control the read or write operation (or the read or write program) performed in the plurality of memory blades 400.

For latency reduction, the cache memory 220A may store data for the CPU 210A, the cache memory 220B may store for the CPU 210B, and the cache memory 220C may store data for the CPU 210C. The cache memories 220A~220C may store data used to operate the CPUs 210A~210C in cache lines, and may determine priority information for each memory in which an eviction operation is performed according to characteristics of the respective memories 420. In accordance with one embodiment, the cache memories 220A~220C may be coupled to the CPUs 210A~210C on a one to one basis. For example, the cache memories 220A~220C may be disposed on respective processor dies for CPUs 210A~210C.

The I/O interface 230 may support communications between the memory blades 400 and the CPUs 210A~210C through the interconnect blade 300 shown in FIG. 3.

The I/O interface 230 may control data input/output (I/O) operations using protocols related to at least one wired or wireless communication technology. That is, the I/O interface 230 may output transmission (Tx) data received from the CPUs 210A~210C to the interconnect blade 300, and may transmit reception (Rx) data received from the interconnect blade 300 to the CPUs 210A~210C.

For example, the I/O interface 230 may support data communication between the interconnect blade 300 and the CPUs 210A~210C according to various protocols such as Peripheral Component Interconnect Express (PCIe), QuickPath Interconnect (QPI), Ethernet, and the like.

Figure 6:
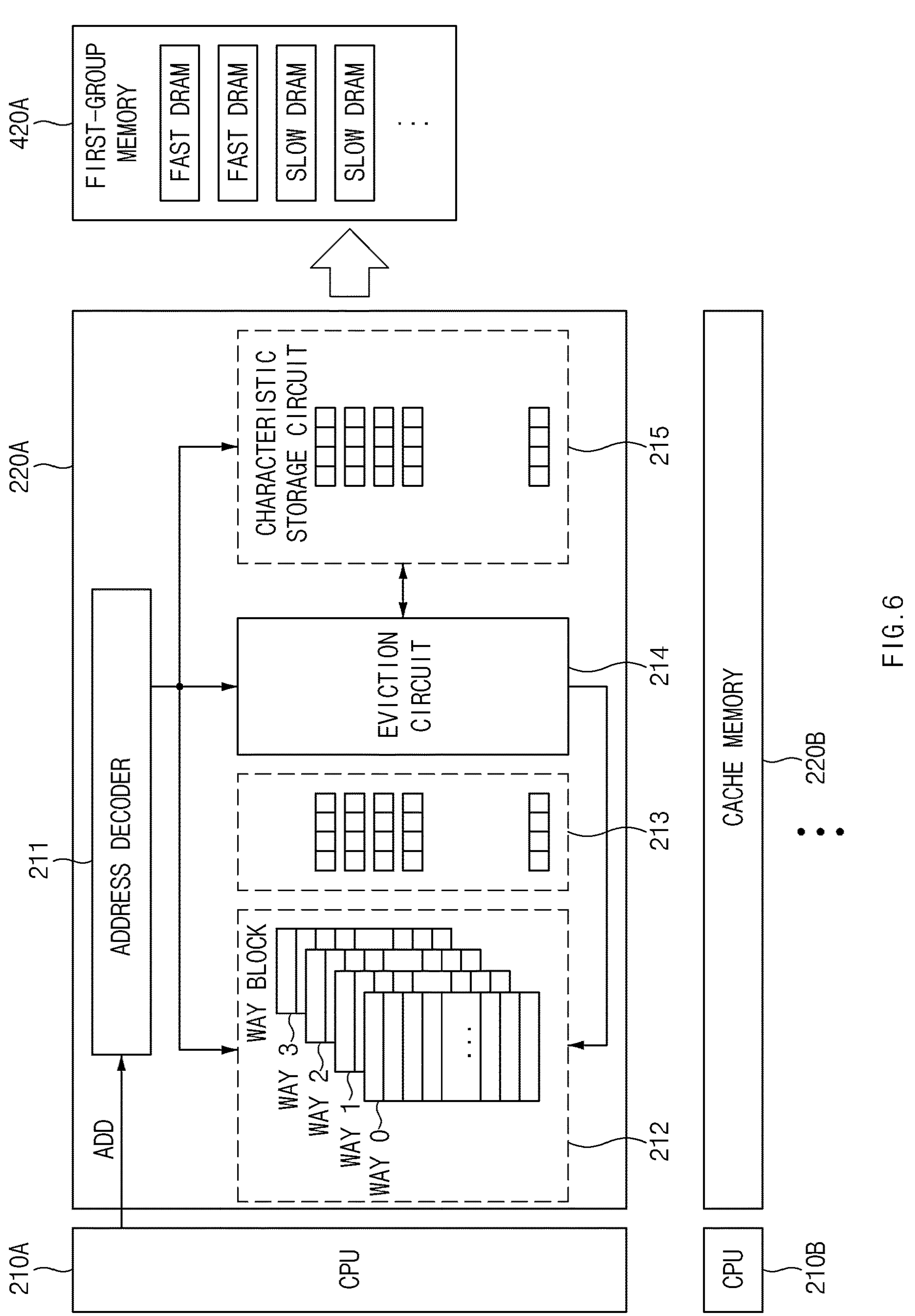
FIG. 6 is a schematic diagram illustrating an example of cache memories shown in FIG. 5 according to an embodiment of the present disclosure.

FIG. 6 is a schematic diagram illustrating the cache memories 220A and 220B shown in FIG. 5 according to an embodiment of the present disclosure. Since the cache memories 220A~220C in this example have the same structure, the following embodiment of the present disclosure will hereinafter be described with reference to detailed constituent elements of only one cache memory 220A from among the plurality of cache memories 220A~220C for convenience of description and better understanding of the present disclosure.

Referring to FIG. 6, the cache memory 220A may include an address decoder 211, a way block 212, a data processor 213, an eviction circuit 214, and a characteristic storage circuit 215.

In this case, the address decoder 211 may decode an address ADD received from the CPU 210A, such that the address decoder 211 may select the corresponding address of the way block 212, the eviction circuit 214, and the characteristic storage circuit 215. The way block 212 may include a plurality of ways WAY0~WAY3 to store data during the operation of CPU 210A.

In this case, each of ways WAY0~WAY3 may include a tag address, a dirty flag, and data. The address ADD requested from the CPU may be created by a combination of a set number and a tag address. Therefore, in order to determine whether a value about the address requested from the CPU 210A was stored in the cache memory 220A, the cache memory 220A may inquire about (or check) tag addresses of the plurality of ways WAY0~WAY3 contained in a set that is automatically decided by the requested address ADD. In an embodiment, a specific value (e.g., "0") may be allocated to the tag address, such that the tag address "0" may indicate an empty state of the corresponding way.

The dirty flag may indicate whether data stored in the cache memory 220A was stored in each of the memories 420. For example, the activated (or enabled) dirty flag may indicate that data stored in each of the ways WAY0~WAY3 has been updated and has not been stored in each of the memories 420. Therefore, if it is confirmed that a dirty flag of a way expelled from the cache memory 220A was activated (or enabled), the memories 420 can be updated using the activated data.

The data processor 213 may process data corresponding to a cache replacement policy. For example, the cache replacement policy may refer to an operation for replacing cache data using a Least Recently Used (LRU) operation or a First-In First-Out (FIFO) operation. In this case, the LRU operation may be a function for sequentially replacing the least recently used data to increase a hit ratio. The FIFO operation may be a function for replacing data in the same order it was input.

The cache memory 220A may be characterized in that, when a cache full state is present due to limited space, the existing data (i.e., legacy data) should be deleted to load new data. To this end, based on operations of the data processor 213 in the cache full state, the eviction circuit 214 may delete data having a low probability that it will be referenced or write back the same data in a main memory, and then may replace data of the corresponding space with new data. An eviction circuit 214 according to an embodiment may determine priority information of each memory that performs eviction operations based on characteristic information stored in the characteristic storage circuit 215.

The characteristic storage circuit 215 may store characteristic information about the first-group memories 420A, characteristic information about the second-group memories 420B, and characteristic information about the first-group memories 420C. For example, the characteristic storage circuit 215 may store data access speed information about the above-mentioned first-group memories 420A. Assuming that each memory of the first-group memories 420A may include four DRAMs, the characteristic storage circuit 215 may store data access speed information of each of the four DRAMs contained in the first-group memories 420A. Two memories from among the four memories contained in the first-group memories 420A may have fast characteristics (FF) corresponding to the fast operation speed, and the remaining two memories may have slow characteristics (SS) corresponding to the slow operation speed.

In this case, the characteristic storage circuit 215 may store data access speed information for each memory as 1-bit data. For example, if a memory has fast characteristics (FF), data "0" may be stored in the characteristic storage circuit 215. If the memory has slow characteristics, data "1" may be stored in the characteristic storage circuit 215. In other embodiments, characteristics may be stored using a larger number of bits to designate larger numbers of graduations in a performance scale.

In a conventional process of evicting (or removing) cache data using only the hit ratio of the data processor 213, a miss penalty is not considered at all. While using a hit ratio does account for misses to a limited extent, e.g. a miss is an inverse of a hit, the miss penalty for those misses manifests as a delay that depends on a number of factors including memory performance characteristics. Therefore, a data processing system according to an embodiment of the present disclosure may store characteristic information of the memories 420 through the characteristic storage circuit 215. The data processing system may evict (or remove) cache data in consideration of the stored characteristics of the memories 420.

Figure 7:
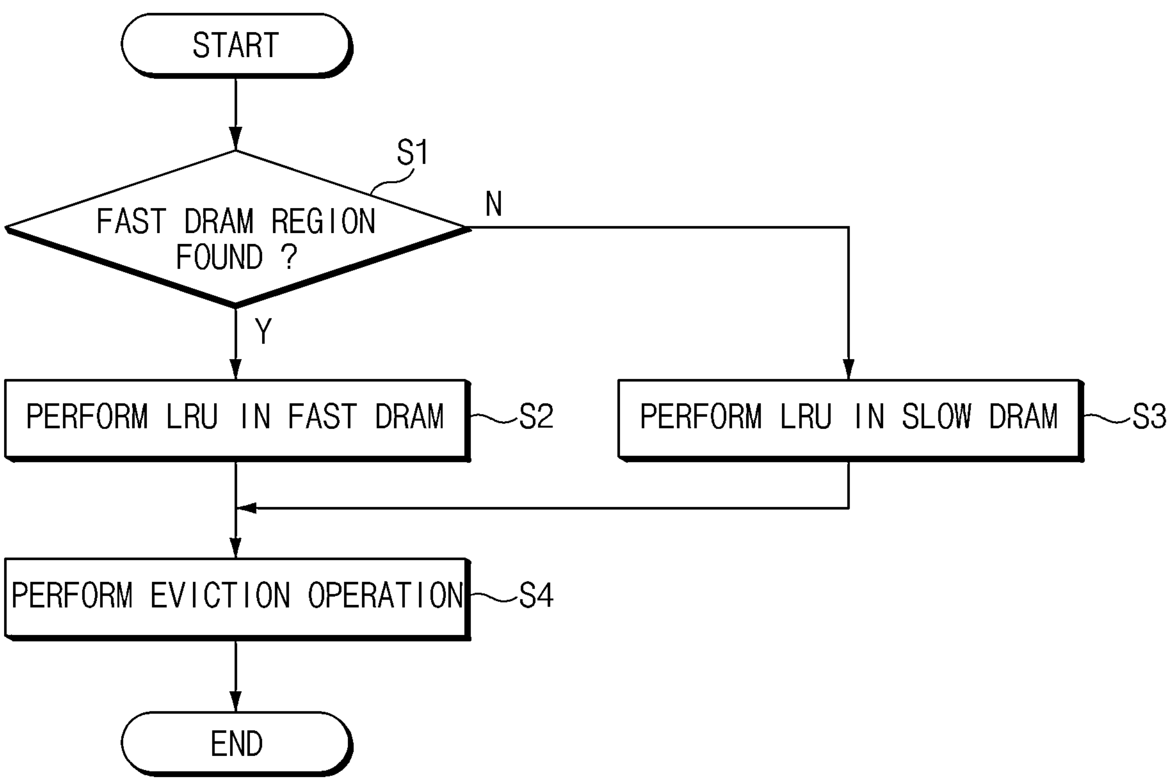
FIGS. 7 and 8 are flowcharts illustrating operations of an eviction circuit shown in FIG. 6 according to an embodiment of the present disclosure.
Figure 8:
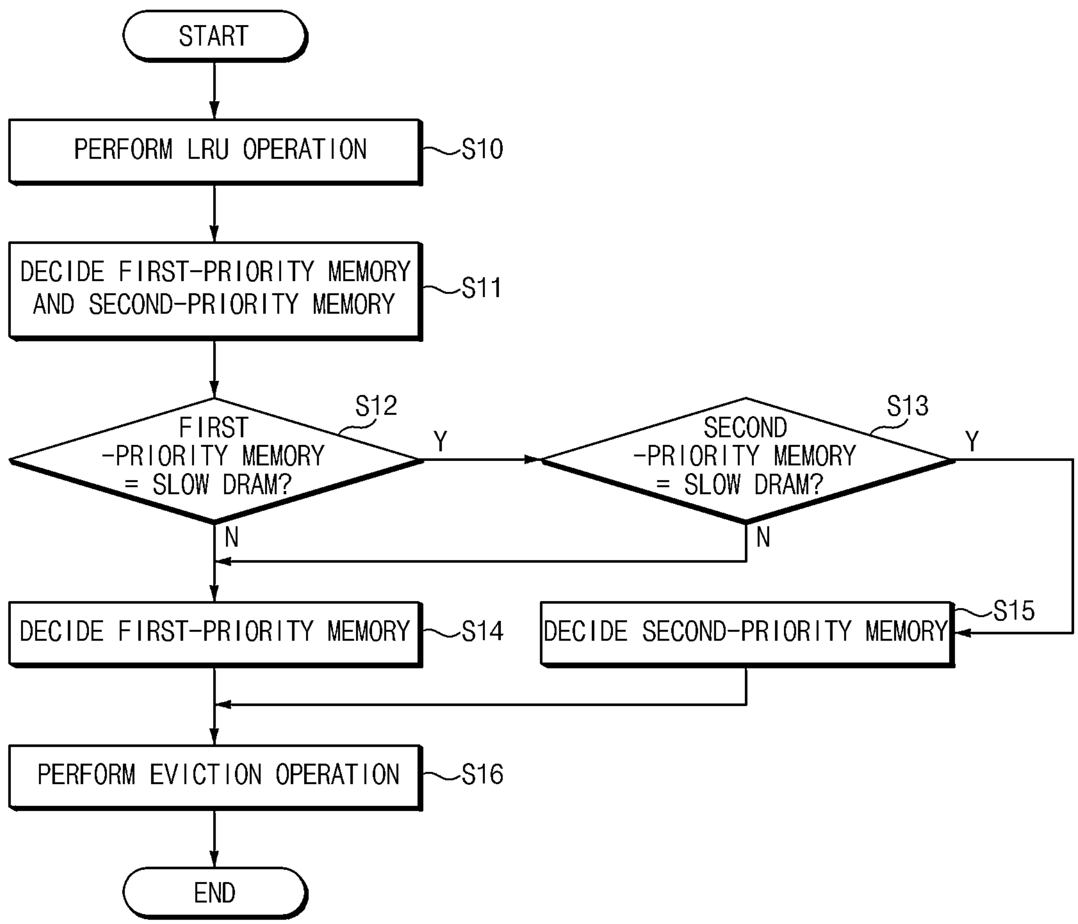

FIGS. 7 and 8 are flowcharts illustrating operations of the eviction circuit 214 shown in FIG. 6 according to an embodiment of the present disclosure. For convenience of description, the examples shown in FIGS. 7 and 8 illustrate an embodiment in which memories 420 are DRAMs. In addition, the examples of FIGS. 7 and 8 illustrate that the data processor 213 replaces cache data using the LRU operation.

As described above, the memories 420 may have different data access speeds according to either a relative position between the CPU 210A and the memories 420 or a temperature environment of the memories 420, such that the respective memories 420 may have different characteristics. In accordance with an embodiment, information about characteristics of the respective memories 420 may be stored in the characteristic storage circuit 215. The eviction circuit 214 may determine priority information of the respective memories, such that the eviction circuit 214 can perform eviction of the cache line according to not only the determined priority information, but also information stored in the characteristic storage circuit 215.

For example, a memory having fast characteristics (FF) may have a different miss penalty from a memory having slow characteristics (SS). For example, the FAST memory may have a lower miss penalty than the other SLOW memory.

In this case, the miss penalty may represent a time to be consumed to perform a line-fill operation caused by occurrence of a missed cache. In more detail, the line-fill operation may indicate that a cache memory accesses an external main memory due to occurrence of at least one missed cache, such that the corresponding line of the cache memory is filled with data stored in the main memory. Since an access time of the FAST memory is faster than an access time of the other SLOW memory, it is possible to reduce a miss penalty by using the FAST memory first to perform the eviction operation.

Accordingly, an eviction operation may first be performed in the FAST memory, such that data having a low miss penalty may be stored in the cache memory 220A.

FIG. 7 is a flowchart illustrating a process in which the eviction circuit 214 searches for a memory in which data eviction will be first carried out and an LRU operation is then performed in the corresponding memory.

Referring to FIG. 7, the eviction circuit 214 may determine the presence or absence of a FAST DRAM region in the cache memory based on characteristic information stored in the characteristic storage circuit 215 in step S1. If the FAST DRAM region is present in the cache memory in step S1, this FAST DRAM region may be determined to be an eviction block. The eviction circuit 214 may perform the LRU operation within the FAST DRAM region through the data processor 213 in step S2. The eviction circuit 214 may perform eviction of cache data according to the LRU operation in step S4. In contrast, if the FAST DRAM region is not present in the cache memory in step S1, i.e., a SLOW DRAM region is determined to exist in the cache memory in step S1, the SLOW DRAM region may be designated as an eviction block. The eviction circuit 214 may perform the LRU operation through the data processor 213 within the SLOW DRAM region in step S3. Thereafter, the eviction circuit 214 may perform eviction of cache data according to the LRU operation in step S4.

FIG. 8 is a flowchart illustrating that the LRU operation is first performed and a memory in which data eviction will be performed is searched for by the eviction circuit 214.

Referring to FIG. 8, the eviction circuit 214 may perform the LRU operation through the data processor 213 in step S10. Thereafter, the eviction circuit 214 may determine priority information for a memory in which data eviction will be carried out, based on characteristic information stored in the characteristic storage circuit 215 in step S11.

Thereafter, the eviction circuit 214 may determine whether a first-priority memory in which data eviction will be first carried out is a SLOW DRAM in step S12. If the first-priority memory is determined to be the SLOW DRAM in step S12, the eviction circuit 214 may determine whether a second-priority memory is a SLOW DRAM in step S13.

If the first-priority memory is not the SLOW DRAM in step S12, the eviction circuit 214 may determine a FAST DRAM to be the first-priority memory. In more detail, the eviction circuit 214 may compare miss penalty values of FAST DRAMs with each other, may determine one FAST DRAM having a lower miss penalty from among multiple FAST DRAMs to be the first-priority memory in step S14, and may perform eviction of at least one cache line within the determined first-priority memory in step S16.

Although the first-priority memory is the SLOW DRAM and the second-priority memory is not the SLOW DRAM, the priority order is changed such that the FAST DRAM may be determined to be the first-priority memory. Although the FAST DRAM is not the first-priority memory, the priority order of the FAST DRAM may be changed to the first-priority memory, such that the eviction operation can first be carried out in the FAST DRAM. That is, miss penalty values of FAST DRAMs may be compared with each other, any FAST DRAM having a lower miss penalty may be determined to be the first-priority memory in step S14, and eviction of the cache line may be carried out in the determined first-priority memory in step S16.

In contrast, when the first-priority memory and the second-priority memory are SLOW DRAMs, a FAST DRAM may be determined to be the second-priority memory instead of the SLOW DRAM determined to the second-priority memory. In other words, miss penalty values of FAST DRAMs may be compared with each other, such that any FAST DRAM having a lower miss penalty may be determined to be the second-priority memory in step S15, and eviction of the cache line may be carried in the determined second-priority memory in step S16.

As is apparent from the above description, the data processing system according to the embodiments of the present disclosure may determine an eviction block in consideration of memory characteristics during cache management, resulting in reduction in a miss penalty.

Figure 9:
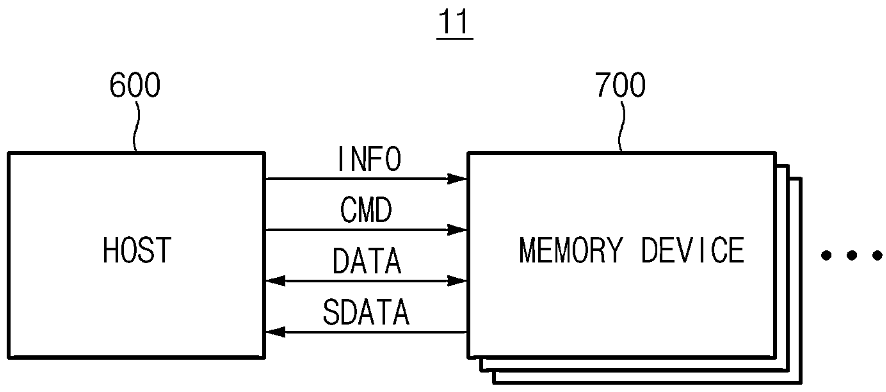
FIG. 9 is a block diagram illustrating a memory system according to an embodiment of the present disclosure.

FIG. 9 is a block diagram illustrating a memory system 11 according to an embodiment of the present disclosure.

The memory system 11 may include a host 600 and a plurality of memory devices 700. The host 600 may generate a control signal to control the memory devices 700. In accordance with one embodiment, the host 600 may generate memory information INFO, and may transmit the memory information INFO to the memory devices 700. The memory information INFO generated by the host 600 may include history information about a pattern used to access each of the memory devices 700. The memory information INFO generated by the host 600 may include memory region information. The memory region information may indicate how to classify all memories allocated to a process, and may indicate which one of usages is allocated to each of the classified memories. The host 600 may further include an interface (not shown) to interface with the memory devices 700.

The host 600 may generate a command signal CMD, and may transmit the command signal CMD to the memory devices 700. The command signal CMD may include one or more of a write command to write data in the memory devices 700, a read command to read stored data from the memory devices 700, and the like. In accordance with one embodiment, the host 100 may include a request command to request required data from among all the data stored in a page (to be described later) of each memory device 700.

The host 100 may transmit and receive data DATA to and from each of the memory devices 700. In other words, the host 600 may transmit data DATA to the memory devices 700 during a write operation, and may receive data DATA read from the memory devices 700 during a read operation. In an embodiment, the host 100 may receive subset data SDATA from among the data stored in a requested page (e.g., all the data stored in the requested page) of each memory device 700, as will be described subsequently.

In addition, the memory device 600 may provide data DATA in response to the command signal CMD received from the host 600. For example, the memory device 700 may store data received from the host 600 therein, or may read stored data and transmit the data that was read to the host 600.

The memory device 700 may receive memory information INFO from the host 600, may predict, based on the received memory information INFO, a data pattern for accesses to a subsequent page, and may generate subset data SDATA requested by the host 600 based on the received memory information INFO. Upon receiving from the host 600 the command signal CMD for reading data, the memory device 700 may transmit prepared subset data SDATA to the host 600.

The memory devices 700 according to the embodiment of the present disclosure may be a pooled memory system in which the same or different kinds of memories are provided in a unified form (or an integrated form). Any one selected from among the memory devices 700 may be accessed by a request of the host 600.

In addition, each of the memory devices 700 according to this embodiment may include a volatile memory, such as a Dynamic Random Access Memory (DRAM) or a Static Random Access Memory (SRAM). However, the scope or spirit of the present disclosure is not limited thereto, and each of the memory devices 700 may be implemented as any one of non-volatile memories, for example, a NAND flash memory, a NOR flash memory, a Phase-Change RAM (PRAM), a Ferroelectric RAM (FRAM), a Magnetic RAM (MRAM), etc., or may also be implemented as a combination thereof.

As described above, the memory system according to the embodiment may predict a data pattern of a page to be subsequently accessed in response to history information about a memory access pattern, and may generate subset data SDATA based on the predicted data pattern of the page. In addition, upon receiving a request from the host 600, the memory devices 700 may transmit the subset data SDATA to the host 600, instead of transmitting all the data of the page to the host 600. Therefore, the memory system according to the embodiment can greatly reduce a data transfer time and overhead as compared to a conventional memory system for transmitting data of all pages to a destination.

Figure 10:
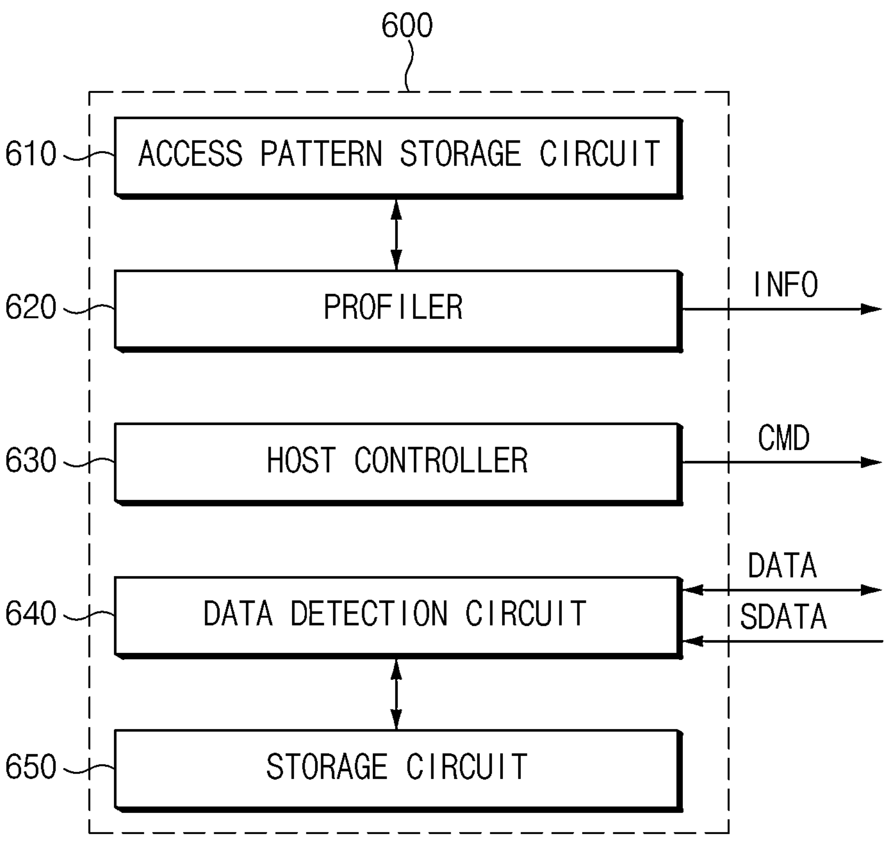
FIG. 10 is a block diagram illustrating a host according to an embodiment of the present disclosure.

FIG. 10 is a block diagram illustrating a host 600 according to an embodiment, such as the host 600 shown in FIG. 9.

The host 600 may include an access pattern storage circuit 610, a profiler 620, a host controller 630, a data detection circuit 640, and a storage circuit 650.

The access pattern storage circuit 610 may store history information of a memory access pattern of access to the memory devices 700 by the host 600.

The profiler 620 may include information about either a kernel level or an application level of memory regions of the memory devices 700, such that the profiler 620 may profile a memory access pattern based on the kernel level or application level information.

In addition, the profiler 620 may profile which pattern will be used by the host 600 accessing the memory devices 700. The profiler 620 may generate a profiled memory access pattern as memory information INFO, and may transmit the generated memory information INFO to the memory devices 700. The profiler 620 may generate information about a memory region accessed in the memory devices 700 as memory information INFO, and may transmit the memory information INFO to the memory devices 700.

The profiler 620 may analyze an inter-page access pattern or an intra-page access pattern, and may extract a memory access pattern based on the analyzed result.

For example, the profiler 620 may collect exception information that is generated after access protection for each page has been established, such that the profiler 620 may extract an inter-page access pattern based on the collected exception information. (That is, a protection mechanism (not shown) may be set to prohibit access to each page, so that an exception is generated when an attempt to access a previously un-accessed page is made. In response to the exception, access to the page is enabled, the access information is collected by the profiler 620, and the attempted access is then successfully completed.) In order to extract the inter-page access pattern, the profiler 620 may perform sampling of exception information for a specific time, and may then extract the inter-page access pattern using the sampling result. In addition, the profiler 620 may generate exception information about all pages, such that the profiler 620 may extract the intra-page access pattern based on the generated exception information. The page access pattern extracted from the profiler 620 may be stored in the access pattern storage circuit 610.

The host controller 630 may generate a command signal CMD for requesting subset data SDATA be accessed from among the data stored in each page of the memory devices 700. In other words, when a page requested by an application of the host 600 is present in the memory devices 700, the host controller 630 may generate a command signal CMD requesting that page, and may transmit the generated command signal CMD to the memory devices 700.

The data detection circuit 640 may receive the subset data SDATA requested from among the data stored in each page of the memory devices 700 (e.g., a subset of all the data in a page), and may detect data corresponding to a non-present cache line (that is, an absence of data for a memory region having an alignment and size corresponding to that of a cache line of the storage circuit 650) in the received subset data SDATA. In this case, when a present data region in the received subset data SDATA is accessed, the data detection circuit 640 may transmit the accessed subset data SDATA to the host controller 630.

The storage circuit 650 may store data DATA transmitted to or received from the data detection circuit 640. The storage circuit 650 may store subset data SDATA received through the data detection circuit 640.

Figure 11:
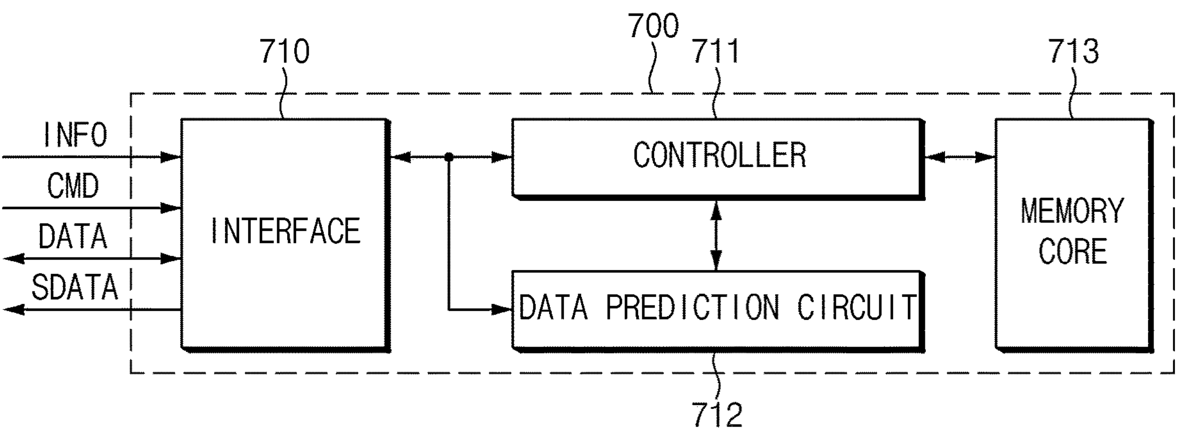
FIG. 11 is a block diagram illustrating a memory device according to an embodiment of the present disclosure.

FIG. 11 is a block diagram illustrating a memory device 700 according to an embodiment, such as each of the memory devices 700 shown in FIG. 9.

Each of the memory devices 700 may include an interface 710, a controller 711, a data prediction circuit 712, and a memory core 713.

The interface 710 may perform interfacing between the host 600 and the memory device 700. For example, the interface 710 may receive the memory information INFO and the command signal CMD from the host 600, and may transmit the memory information INFO and the command signal CMD to the controller 711 and the data prediction circuit 712. The interface 710 may receive data DATA and subset data SDATA from the controller 711 and the data prediction circuit 712, and may transmit the received data DATA and the received subset data SDATA to the host 600.

The controller 711 may analyze and process the command signal CMD received from the host 600. That is, upon receiving the command signal CMD from the host 600, the controller 711 may control operations of background functional blocks using firmware or software as needed to drive the memory core 713.

Upon receiving memory information INFO through the interface 710, the data prediction circuit 712 may predict, using profiled memory access pattern information, a data pattern of access to a subsequent page, and may generate subset data SDATA from the data within the subsequent page. The data prediction circuit 712 may extract data in consideration of a stride of the profiled memory access pattern information, and generate packetized subset data SDATA based on the extracted data. In this case, the term “stride” may refer to a distance between memory addresses. In another embodiment, the stride may refer to either a predicted stride or prediction of a memory address to be subsequently requested, and may be usefully used in prefetch.

The data prediction circuit 712 may predict a data pattern of access to a subsequent page through pattern learning. In this case, the term “pattern learning” may include a scheme for learning the existing address access history and searching for a pattern based on the learned result. For example, during pattern training, the data prediction circuit 712 may learn a necessary stride through a register (not shown) or may learn such a stride through machine learning, such that the data prediction circuit 712 may predict a data pattern of accesses to a subsequent page.

If the memory access pattern is considered unclear (or indefinite), the data prediction circuit 712 may prepare subset data SDATA by minimizing the number of false negatives. That is, when the memory access pattern is unclear (or indefinite) the data prediction circuit 712 may include additional data (beyond that clearly predicted by the memory access pattern) from each page in the generated subset data SDATA. In addition, when access regions are densely present in the page (that is, when a large fraction or threshold of the page is predicted to be accessed), the data prediction circuit 712 may transmit all the data of the page to the host 600. In an embodiment, the threshold of the page is 40 or greater, 50% or greater, 60% or greater, or 70% or greater, or 80% or greater, or 90% or greater. Upon receiving the command signal CMD through the interface 710, the data prediction circuit 712 may transmit the prepared subset data SDATA to the host 100 through the interface 710. When less than all the data of the page is transmitted to the host 600, the transmission of the prepared subset data SDATA to the host 600 may include an indication of the data pattern used to prepare the subset data SDATA. When all the data of the page is transmitted to the host 600, the transmission of the prepared subset data SDATA to the host 600 may include an indication of that all the data of the page is included in the subset data SDATA.

During the write operation, the memory core 713 may store data in a bank (not shown) under control of the controller 711. During the read operation, the memory core 713 may read stored data from the bank (not shown) under control of the controller 711.

Figure 12:
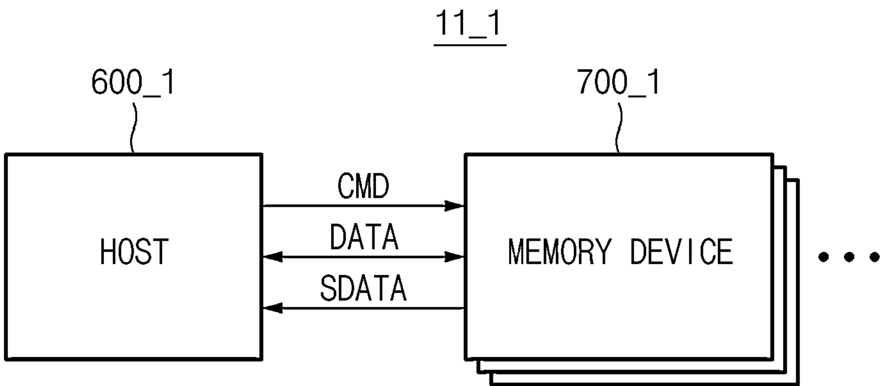
FIG. 12 is a block diagram illustrating a memory system according to another embodiment of the present disclosure.

FIG. 12 is a block diagram illustrating a memory system 11_1 according to another embodiment of the present disclosure.

The memory system 11_1 according to another embodiment of the present disclosure may include a host 600_1 and a plurality of memory devices 700_1.

The memory system 11_1 may allow an operation of profiling a memory access pattern to be processed in each of the memory devices 700_1 instead of the host 600_1. Therefore, unlike the host 600 of FIG. 9, the host 600_1 shown in FIG. 12 may not generate memory information INFO.

The remaining constituent elements and operations of the host 600_1 and the memory devices 700_1 are identical to those of FIG. 11, and as such a detailed description thereof will herein be omitted for convenience of description. In addition, the profile operation processed in the memory devices 700_1 will be described later.

Figure 13:
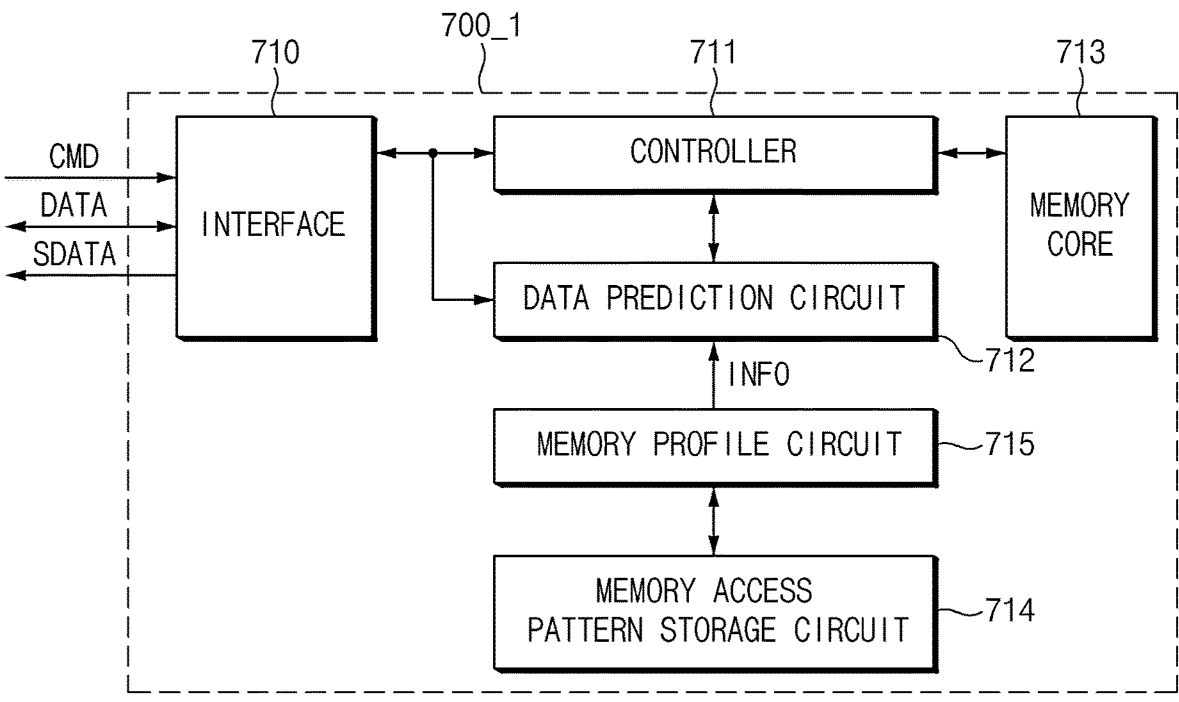
FIG. 13 is a block diagram illustrating a memory device according to another embodiment of the present disclosure.

FIG. 13 is a block diagram illustrating a memory device 700_1, such as one of the memory devices 700_1 shown in FIG. 12.

In addition to the interface 710, controller 711, data prediction circuit 712, and the memory core 713 of the memory device 700 of FIG. 11, the memory device 700_1 may further include a memory access pattern storage circuit 714 and a memory profile circuit 715.

The embodiment of FIG. 10 illustratively discloses that the host 600 includes the access pattern storage circuit 610 and the profiler 620 such that the profile operation of the memory access pattern is performed within the host 600. The embodiment of FIG. 13 discloses that the profile operation of the memory access pattern is performed in the memory devices 700_1. In another embodiment, the profile operation of the memory access pattern maybe performed in the host and/or in the memory devices.

Referring back to FIG. 13, when the profile operation of the memory access pattern is performed in the memory devices 700_1, the controller 711 may receive a data request in units of a cache line from the host 600_1, without receiving a data request in units of a page from the host 600_1. In embodiments, a cache line may comprise, for example, 32, 64, 128, or 256 data bytes, but embodiments are not limited thereto.

The memory access pattern storage circuit 714 may store a memory access pattern in response to a stride occurring in a series of virtual addresses. That is, the application generating addresses in the host 600 may be generating virtual addresses. As a result, the memory access pattern storage circuit 714 may store a memory access pattern in response to virtual addresses received from the host 600. However, embodiments are not limited thereto.

A stride of a memory access pattern may be intermixed with other strides. However, along with memory region information received from the host 600, application information and the like may also be recorded in the memory access pattern storage circuit 714, so that the stride of the memory access pattern can be distinguished from other strides. The recorded information may indicate how the memory allocated to a process is divided, and the use (such as text, data, heap, or stack) intended for each division of the allocated memory. The application information may be used to distinguish between processes, that is, to distinguish memory accesses of one process from memory accesses of other processes.

The remaining constituent elements and operations of the memory device 700_1 shown in FIG. 13 are substantially identical to those of the memory devices 700 shown in FIG. 10, and as such a detailed description thereof will herein be omitted for convenience of description.

Figure 14:
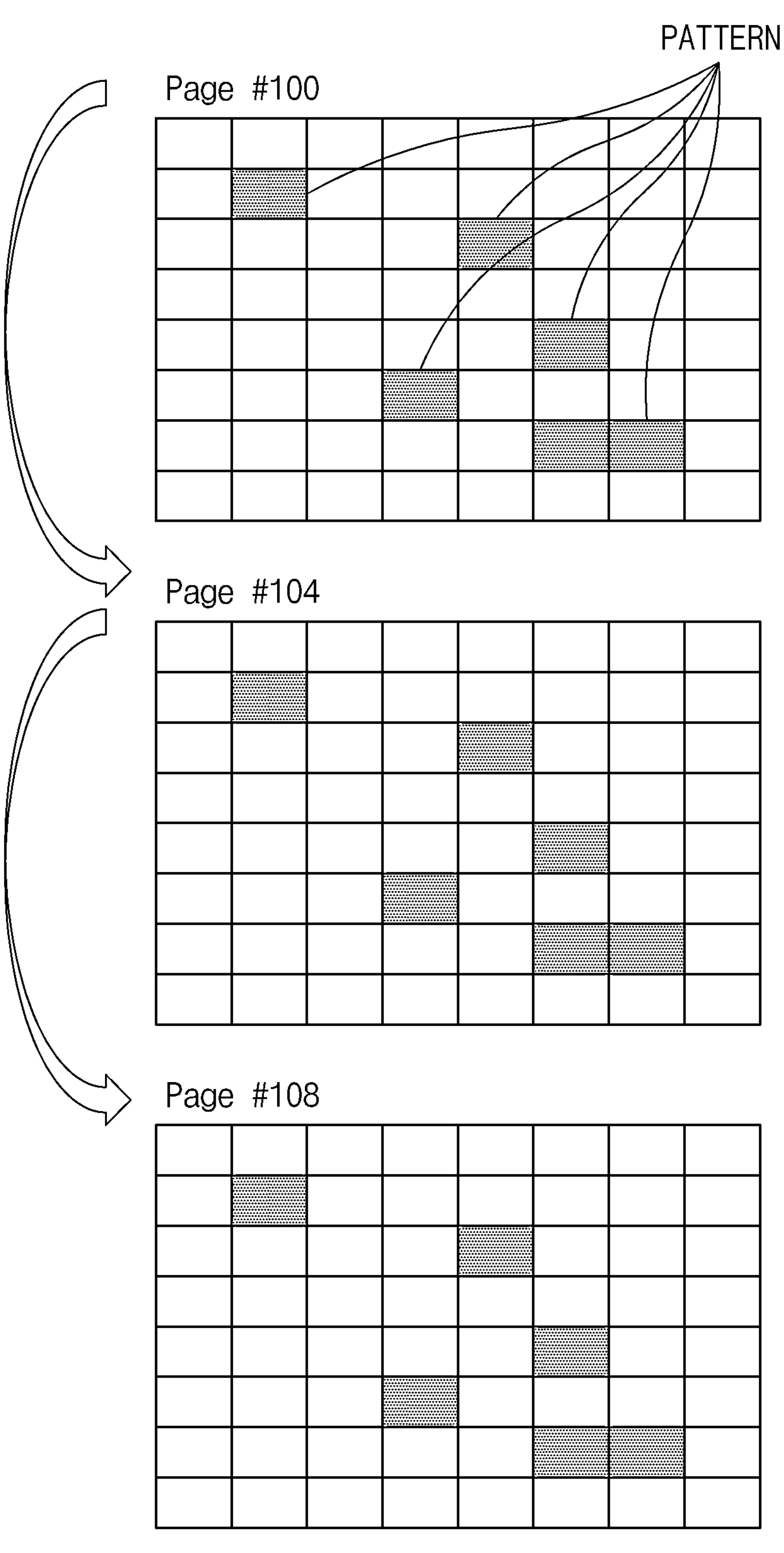
FIG. 14 illustrates a profile process of a host according to an embodiment of the present disclosure.

FIG. 14 illustrates a profile process of the host 600 shown in FIG. 10, such as may be performed by the profiler 620. Operations of FIG. 14 will hereinafter be described with reference to the embodiment of FIG. 10. However, in another embodiment, the operations similar to those described below may also be performed by the memory profile circuit 715 of FIG. 13 in the memory device 700_1 of FIG. 12.

The profiler 620 of the host 600 may read information stored in the access pattern storage circuit 610. The profiler 620 may profile history information of a previous memory access pattern, and may thus generate memory information INFO based on the profiled history information.

For example, the profiler 620 may profile pattern information of data accessed at page #100, pattern information of data accessed at page #104, and pattern information of data accessed at page #108. From the viewpoint of history information of the previous memory access pattern, it can be recognized that data requisite for the host 600 is some data of the page, but not all the data of the page.

If data accessed at page #100, data accessed at the page #104, and data accessed at page #108 are identical in location to each other, the host 600 may generate the corresponding access pattern as memory information INFO, and may transmit the generated memory information INFO to the memory devices 700. For example, if, as shown in FIG. 14, the host 600 access data within each of pages #100, #104, and #108 at offsets of 9, 20, 37, 43, 53, and 54, then in an embodiment the memory information INFO would indicate an access pattern including 9, 20, 37, 43, 53, and 54. In an embodiment, the memory pattern might apply only to pages having numbers equal to 100+4N, where N is an integer greater than or equal to 0.

Figure 15:
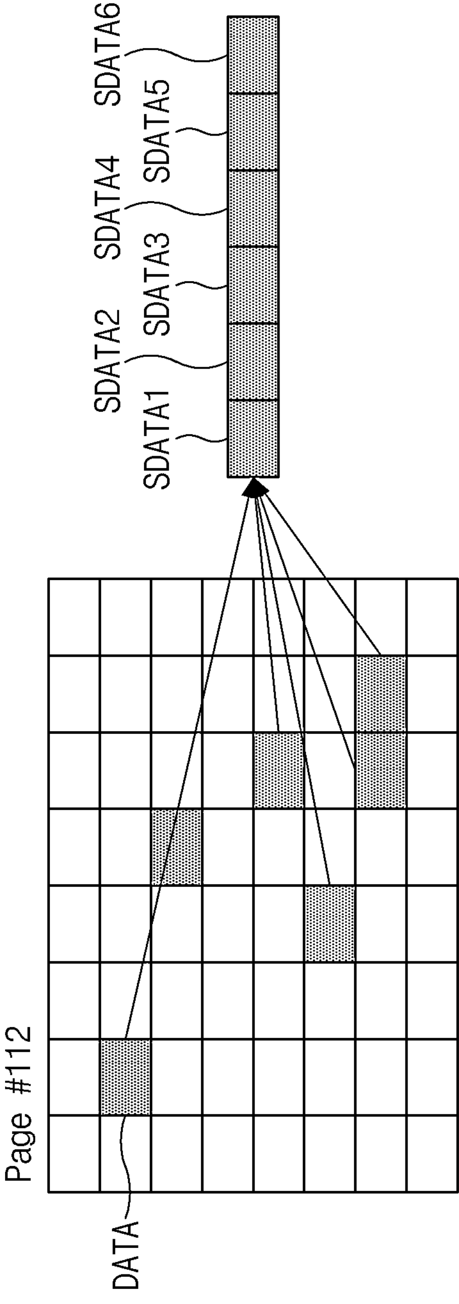
FIG. 15 is a conceptual diagram illustrating a data prediction process of the memory device shown in FIG. 11 according to an embodiment of the present disclosure.

FIG. 15 is a conceptual diagram illustrating a data prediction process of each memory device 700 shown in FIG. 11. Operations of FIG. 15 will hereinafter be described with reference to the embodiment of FIG. 11, however, embodiments are not limited thereto, and similar operations to those described below may occur in each memory device 200_1 of FIG. 13.

The data prediction circuit 712 of each of the memory devices 700 may predict a data pattern to be accessed at a subsequent page in response to memory information INFO received from the profiler 620.

For example, memory information INFO received from the profiler 620 may include specific information indicating that the memory access pattern at page #100, the memory access pattern at page #104, and the memory access pattern at page #108 are identical in location to each other. From that it is determined that the application of the host 600 tends to access the memory devices 700 using regular patterns. Accordingly, the data prediction circuit 712 may predict that data DATA corresponding to the same relative locations as were previously accessed in page #100, page #104, and page #108 will be accessed at a subsequent page #112.

The data prediction circuit 712 may generate subset data SDATA predicted to be required by the host 600 in response to a request for data DATA of the predicted page. The subset data SDATA generated by the data prediction circuit 712 may be transmitted to the host 600 through the interface 710. For example, when data about only one cache line is requested, the data prediction circuit 712 may transmit all the packets of the subset data SDATA to the host 600. In an embodiment, each packet of the transmitted subset data SDATA includes data having a size corresponding to a cache line from respective locations in the memory core 713 indicated by the memory information INFO.

If necessary, the data prediction circuit 712 may also adjust or control the amount of transmitted subset data SDATA in consideration of a reception speed of the command signal CMD generated by a data request from the host 600. For example, when the command signal CMD from the host 600 is received at low speed, the data prediction circuit 712 may reduce the amount of transmitted subset data SDATA. In an embodiment, the amount of transmitted subset data SDATA is reduced in order to complete the transmission of the subset data SDATA before a subsequent command signal CMD is received.

Meanwhile, the host 600 may recognize information about where the subset data SDATA is located in one or more pages of the memory devices 700. That is, when the controller 711 of each memory device 700 transmits the subset data SDATA to the host 600, the controller 711 may also transmit format information of the subset data SDATA.

For example, the controller 711 may include information about a distance to each subset data SDATA in the format information, and may transmit the resultant format information including the distance information to the host 600. A format of the distance information about the subset data SDATA may indicate how far the corresponding subset data SDATA is spaced apart from another subset data SDATA. That is, the format applied to the host 600 may include "Value of Subset Data SDATA" and "Information about Distance to Previous Subset Data SDATA".

For example, it is assumed that the number of subset data SDATA is set to 6 for convenience of description. Thus, the format of the subset data SDATA may be set to "{(9, SDATA1), (11,SDATA2), (17,SDATA3), (6,SDATA4), (10, SDATA5), (0,SDATA6)}". In each parenthesis of the above-mentioned {(9,SDATA1), (11,SDATA2), (17,SDATA3), (6,SDATA4), (10,SDATA5), (0, SDATA6)} format, a former number (9, 11, 17, 6, 10, 0) may indicate the distance to previous subset data SDATA, and a latter number (SDATA1~SDATA6) may indicate a value of subset data SDATA.

The controller may transmit the above-mentioned data format to the host 600. Therefore, the host may recognize location information of the subset data SDATA in each page of the memory devices 700.

Although the format of the subset data SDATA shown in FIG. 15 has been established as described above, the scope of the format of the subset data SDATA the present disclosure is not limited thereto.

Figure 16:
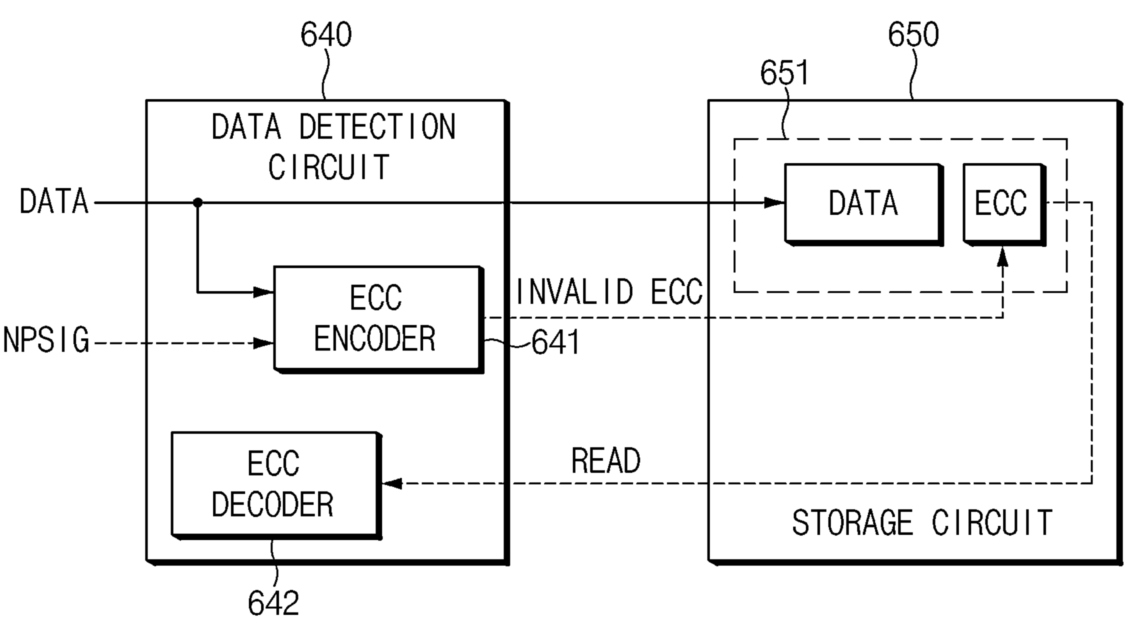
FIGS. 16 and 17 illustrate operations of a data detection circuit according to an embodiment of the present disclosure.
Figure 17:
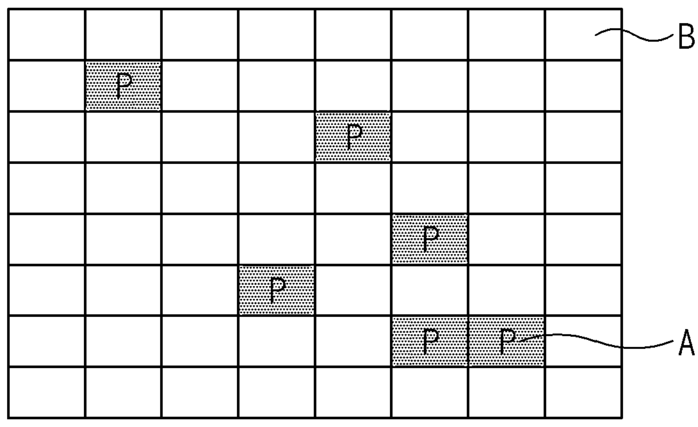

FIGS. 16 and 17 illustrate operations of a data detection circuit 640, such as the data detection circuit 640 shown in FIG. 10, according to an embodiment.

The data detection circuit 640 may include an Error Correction Code (ECC) encoder 641 and an ECC decoder 642. The storage circuit 650 may store not only data DATA but also an ECC received from the ECC encoder 641 in a cache line 651. The ECC can be an invalid ECC, that is, an ECC that is not equal to the calculated result of the ECC algorithm as applied to the data DATA.

A method for storing the subset data SDATA in the storage circuit 650 using the data detection circuit 640 will hereinafter after be described in detail.

The host 600 may allocate an empty page to the storage circuit 650 so as to write data received from the memory devices 700. The data detection circuit 640 may allocate invalid data to all data fields of the corresponding page of the storage circuit 650.

The data detection circuit 640 may receive the subset data (SDATA) format from the memory devices 700 through the controller 711. The data detection circuit 640 may analyze the received data format, and may discriminate between "Value of Subset Data SDATA" and "Distance to Previous Subset Data SDATA". The data detection circuit 640 may store the subset data SDATA in the allocated location of the storage circuit 650 by referring to the distance information about each subset data SDATA.

Meanwhile, a method for determining a non-present region from among the pages of the storage circuit 650 using the data detection circuit 640 will hereinafter be described with reference to the attached drawings.

For convenience of description and better understanding of the present disclosure, it is assumed that the host 600 performs the write operation of data from a specific address in units of a cache line 651 in the storage circuit 650, that is, if the cache line 651 can store N bytes of data, the host 600 performs the write operations in blocks of N bytes. The cache line 651 may be one of a plurality of cache lines in the storage circuit 650, each cache line including data storage, address tag storage, and storage for an Error Correction Code (ECC). Upon receiving a non-present detection signal NPSIG, the ECC encoder 641 may encode the data to generate an invalid error correction code (ECC), and may store the generated invalid ECC in a cache line 651 to mark the cache line 651 as not including valid data. In other words, the data detection circuit 640 may intentionally generate an invalid ECC through the ECC encoder 641, and may output the invalid ECC to the storage circuit 650 to indicate that the cache line does not presently store valid data.

During the read operation, the invalid ECC stored in the cache line 651 may be transmitted to the ECC decoder 642. The ECC decoder 642 may decode the ECC read from the corresponding cache line 651. The data detection circuit 640 may determine whether valid data is present in the cache line 651 according to the result produced by the ECC decoder 642.

The data detection circuit 640 may also detect the presence or absence of errors based on the decode result of the ECC decoder 642. If the decode result indicates an error but is not identical to the intentional invalid ECC, the data detection circuit 640 may determine that the detected error is an actual fault, that is, that the data and/or the ECC values read from the cache line 651 is not the same as the data and/or ECC values that were stored in the cache line 651. That is, the data detection circuit 640 may determine whether the intentional invalid ECC previously stored into the cache line 651 has been detected or whether an actual fault has been default. The ECC encoder 641 may receive a non-present detection signal NPSIG as an input, and may thus encode the ECC using the received non-present detection signal NPSIG. Therefore, if the non-present detection signal NPSIG is activated (or enabled), the data detection circuit 640 may determine that an error has occurred in the intentional invalid ECC.

For example, the ECC encoder 641 may receive data DATA and an ECC corresponding to the data DATA. If a predetermined ECC bit corresponding to the corresponding data DATA is set to "0", the ECC encoder 641 may encode an invalid ECC by changing the predetermined ECC bit set to "0" into "1", and may store the encoded result in the cache line 651. Subsequently, the data detection circuit 640 may decode the ECC stored in the cache line 651, and may compare the decoded ECC with an original ECC bit. In an embodiment, the original ECC bit is generated by ECC encoding the data stored in the cache line 651.

If an ECC bit decoded by the ECC decoder 642 is set to "0", when the original ECC bit was also set to "0", this means that data has already been stored in the cache line 651 such that the region corresponding to the ECC bit "0" is considered to be a present region. In contrast, if an ECC bit decoded by the ECC decoder 642 is set to "1", when the original ECC bit was also set to "0", this means that data has not been stored in the cache line 651 such that the region corresponding to the ECC bit "1" is considered to be a non-present region. That is, when an ECC value stored in a cache line differs from an ECC value generated by ECC encoding the data stored in the cache line in a predetermined way, this is interpreted as meaning that valid data has not been stored in the cache line 651 and the corresponding region is considered to be a non-present region.

Referring to FIG. 17, the data detection circuit 640 may display information about whether data is stored in the cache line 651 using a bitmap. For example, if an ECC error has occurred, this means that the corresponding region is a non-present region in which no data is stored, such that each of the non-present regions is denoted by B (that is, a bit value represented by a blank) of FIG. 17. Here, "B" may denote invalid data. In contrast, if no ECC error has occurred, this means that the corresponding region is a present region in which data is stored, such that each of the present regions is denoted by A (that is, a bit value represented by the character "P") of FIG. 17.

In an embodiment, the data detection circuit 640 may have a specific rule to discriminate between an intended ECC error and an actual memory error. For example, in an embodiment the specific rule may be denoted by "+1". In the case of using the specific rule "+1", when a correct ECC encoding of data is "C", an ECC value of "C+1" may be generated to indicate the non-present data. Thereafter, if the complementary rule "−1" is applied to ECC check processing, it can be confirmed that the corresponding region is a non-present region and not an ECC error resulting from a fault or corruption of the memory store. That is, if the rule "+1" is used to generate ECC indicating a non-present regions, then when an ECC check of a cache line generates a value equal to the stored ECC value thereof, the data detection circuit 640 determines that data is present and correct in the cache line, when the ECC check generates a value equal to the stored ECC value minus 1, the data detection circuit 640 determines that the non-present region is indicated for the cache line, and when the ECC check generates a value equal to any other value, the data detection circuit 640 determines that an error occurred in reading the cache line.

That is, since the host 600 is designed to access the memory devices 700 in units of a page, the host 600 may have difficulty in accessing regions contained in each page. Accordingly, from the viewpoint of the host 600, the host 600 may have difficulty in deciding the presence or absence (for example, in the storage circuit 650) of a non-present region in each page of the memory devices 700. Thus, the memory system according to the embodiments of the present disclosure may detect non-present data in the host 600 through the data detection circuit 640.

As is apparent from the above description, the memory system according to the embodiments of the present disclosure may increase a data transfer rate by reducing overhead.

Figure 18:
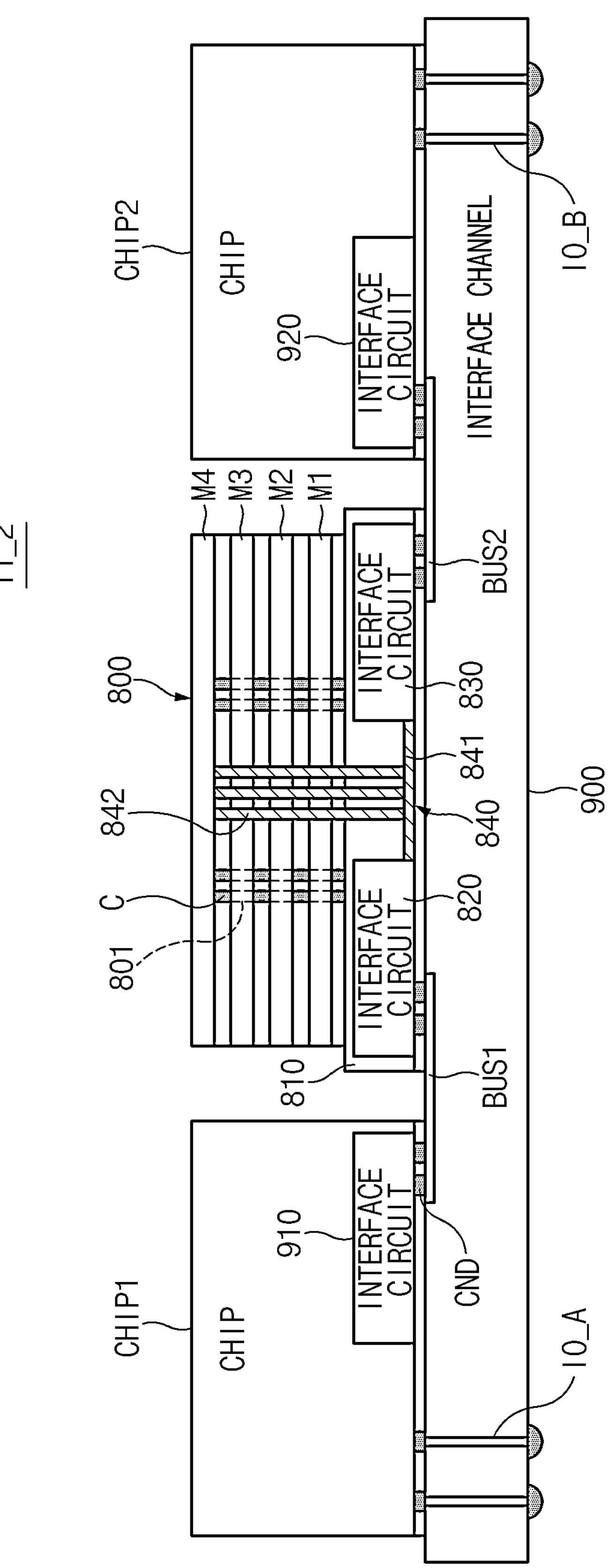
FIG. 18 illustrates a memory system according to an embodiment of the present disclosure.

FIG. 18 illustrates a memory system 11_2 according to an embodiment of the present disclosure.

Referring to FIG. 18, the memory system 11_2 may include a stacked memory (or a stacked memory device) 800, a plurality of chips (e.g., first and second chips CHIP1 and CHIP2), and an interface channel 900.

In this case, the stacked memory 800 may be disposed between the first chip CHIP1 and the second chip CHIP2, and may be shared by the first and second chips CHIP1 and CHIP2. Specifically, two chips (e.g., first chip CHIP1 and second chip CHIP2) may be combined to share a single stacked memory 800. In other embodiments, more than two chips (e.g., 3, 4 or more chips) may be combined to share the stacked memory 800.

The stacked memory 800 may be implemented as a packaged memory device in which a plurality of memories M1~M4 are stacked such that the plurality of memories M1~M4 may be integrated in a single memory device. Each of the memories M1~M4 may be selected from various memory device types, for example, Dynamic Random Access Memory (DRAM), Phase-Change Random Access Memory (PCRAM), Resistive Random Access Memory (ReRAM), flash memory, etc. In an embodiment, the memories M1~M4 comprise of the same memory types. In another embodiment, the memories M1~M4 do not comprise of the same memory types.

The memories M1~M4 may be coupled through at least one contact C. The memories M1~M4 may be electrically coupled through one or more Through Silicon Vias (TSVs) 801. The contacts C serve as contacts for corresponding TSVs 801.

In an embodiment, the TSVs 801 may be used to transmit a power-supply voltage to each of the memories M1~M4. For convenience of description and better understanding of the present disclosure, four memories M1~M4 may be stacked in the stacked memory 800 according to the embodiment shown in FIG. 18 of the present disclosure. However, embodiments of the present disclosure are not limited thereto, and the number of memories contained in the stacked memory 800 may vary.

The stacked memory 800 may be implemented as a High Bandwidth Memory (HBM) in which the memories M1~M4 are electrically coupled through the TSVs 801 so as to increase the number of input/output (I/O) units, resulting in an increased bandwidth.

The high bandwidth memory (HBM) may be a memory configured to have a higher bandwidth and higher density as compared to a conventional memory. For example, a plurality of memory chips may be stacked in the high bandwidth memory (HBM) using three-dimensional Through Silicon Via (3D-TSV) technology, and the high bandwidth memory (HBM) may include a large number of data pins to increase an input/output (I/O) bandwidth. The high bandwidth memory (HBM) may normally operate using the stacked memory chips and the large number of data pins.

A preferred semiconductor package in which multiple semiconductor chips are stacked and a method for fabricating the same, which includes multifunctional and high-volume data processing circuit is disclosed in U.S. patent application Ser. No. 11,569,216, issued Jan. 1, 2023 and entitled, "SEMICONDUCTOR PACKAGE INCLUDING STACKED SEMICONDUCTOR CHIPS AND METHOD FOR FABRICATING THE SEMICONDUCTOR PACKAGE," the entire disclosure of which is incorporated herein by reference. Specifically, the subject matter of U.S. patent application Ser. No. 11,569,216, which is incorporated herein by reference in its entirety, is included below, referring to FIGS. 25A to 31.

A buffer layer 810 may be disposed between the plurality of memories M1~M4 and the interface channel 900. In an embodiment, the buffer layer 810 is provided below the memories M1~M4. The buffer layer 810 may include a shared bus 840 and interface circuits 820 and 830. In an embodiment, the buffer layer 810 may function as an interposer to electrically couple the memories M1~M4 to first and second buses BUS1 and BUS2 of an interface channel 900.

The interface circuit 820 of the buffer layer 810 may be coupled to the first bus BUS1 of the interface channel 900 through one or more contact nodes CND. Because the first bus BUS1 is electrically coupled to the first chip CHIP1, the interface circuit 820 may be electrically coupled to the first chip CHIP1 through the first bus BUS1. The interface circuit 830 of the buffer layer 810 may be coupled to the second bus BUS2 of the interface channel 900 through one or more contact nodes CND. Because the second bus BUS2 is electrically coupled to the second chip CHIP2, the interface circuit 830 may be electrically coupled to the second chip CHIP2 through the second bus BUS2.

In an embodiment, the interface circuit 820 of the buffer layer 810 may include a physical layer (PHY) for electrically coupling the stacked memory 800 to the first chip CHIP1 such that the stacked memory 800 may exchange signals with the first chip CHIP1 through the interface circuit 820. The interface circuit 830 of the buffer layer 810 may include a physical layer (PHY) for electrically coupling the stacked memory 800 to the second chip CHIP2, such that the stacked memory 800 may exchange signals with the second chip CHIP2 through the interface circuit 830.

The shared bus 840 may be coupled between the interface circuits 820 and 830 and the memories M1~M4. The shared bus 840 may transmit signals that have been received through the interface circuits 820 and 830 to the memories M1~M4. The shared bus 840 may transmit signals that have been received from the memories M1~M4 to the first and second chips CHIP1 and CHIP2 through the interface circuits 820 and 830, respectively. In an embodiment, the shared bus 840 may be used to transmit at least one signal to each of the memories M1~M4.

The shared bus 840 may include a horizontal bus 841 disposed between the two interface circuits 820 and 830, and a vertical bus 842 including a plurality of lines each extending in a first direction substantially perpendicular to the horizontal bus 841. The horizontal bus 841 may be shared by two interface circuits 820 and 830.

For electrical coupling between the two interface circuits 820 and 830, the horizontal bus 841 may include a line extending in a second direction (e.g., a horizontal direction in FIG. 18) that crosses the first direction. For example, the second direction may be substantially perpendicular to the first direction and substantially parallel to a top surface of the interface channel 900. For electrical coupling between the horizontal bus 841 and each of the memories M1~M4, the vertical bus 842 may include the plurality of lines each extending in the second direction (e.g., a vertical direction in FIG. 18). In the embodiment shown in FIG. 18, the shared bus 840 may have an inverted T-shape resulting from the shapes of the horizontal bus 841 and the vertical bus 842.

In an embodiment, the vertical bus 842 may include the plurality of lines each having an integrated line shape. For example, each of the plurality of lines of the vertical buses 842 may be a single body and have a line shape, such that each of the plurality of lines is coupled to a bottom surface of the uppermost memory M4 and passes through the remaining memories M1~M3. The plurality of lines of the vertical bus 842 (e.g., three vertical lines in FIG. 18) may be arranged substantially parallel to each other and be disposed in a center region of the stacked memory 800.

Although the shared bus 840 according to the above-described embodiment includes the plurality of lines of the vertical bus 842 each having the integrated line shape for convenience of description and better understanding of the present disclosure, embodiments of the present disclosure are not limited thereto. In another embodiment, each of the plurality of lines of the vertical bus 842 may include one or more of TSVs (not shown) respectively formed through one or more of the memories M1~M4 and one or more contacts (not shown) each coupling adjacent TSVs.

The first chip CHIP1 may exchange signals with the stacked memory 800 through the first bus BUS1. In the embodiment shown in FIG. 18, the first chip CHIP1 may be implemented as a processor such as a Central Processing Unit (CPU).

The first chip CHIP1 according to the above-described embodiment is implemented as a CPU for convenience of description and better understanding of the present disclosure. However, embodiments of the present disclosure are not limited thereto.

In addition, the first chip CHIP1 may include an interface circuit 910 to exchange signals with the stacked memory 800. The interface circuit 910 may be coupled to the first bus BUS1 through one or more contact nodes CND. The first bus BUS1 is coupled to the interface circuit 820 of the stacked memory 800, and thus the interface circuit 910 of the first chip CHIP1 may be electrically coupled to the interface circuit 820 of the stacked memory 800 through the bus BUS1.

The interface circuit 910 of the first chip CHIP1 may include a circuit structure (for example, a physical layer PHY) to perform memory interfacing between the first chip CHIP1 and the stacked memory 800.

The second chip CHIP2 may exchange signals with the stacked memory 800 through the second bus BUS2. In an embodiment, the second chip CHIP2 may be implemented as a System on Chip (SoC). In the embodiment shown in FIG. 18, the second chip CHIP2 may be implemented as a processor, for example, a Graphics Processing Unit (GPU) or an accelerator.

The second chip CHIP2 according to the above-described embodiment is implemented as a GPU or accelerator for convenience of description and better understanding of the present disclosure. However, embodiments of the present disclosure are not limited thereto, e.g., the second chip CHIP2 may a CPU or the same type of chip as the first chip CHIP1.

The second chip CHIP2 may include an interface circuit 920 to exchange signals with the stacked memory 800. The interface circuit 920 of the second chip CHIP2 may be coupled to the second bus BUS2 through one or more contact nodes CND. The second bus BUS2 is coupled to the interface circuit 830 of the stacked memory 800, and thus the interface circuit 920 of the second chip CHIP2 may be electrically coupled to the interface circuit 830 of the stacked memory 800 through the second bus BUS2.

The interface circuit 920 of the second chip CHIP2 may include a circuit structure (for example, a physical layer PHY) to perform memory interfacing between the second chip CHIP2 and the stacked memory 800.

The interface channel 900 may be disposed below the first and second chips CHIP1 and CHIP2 and the stacked memory 800. The interface channel 900 may be an interposer channel to exchange signals between the stacked memory 800 and the chips CHIP1 and CHIP2.

The interface channel 900 may include of the first and second buses BUS1 and BUS2 and first and second input/output (I/O) buses IO_A and IO_B. The first bus BUS1 may couple the interface circuit 910 of the first chip CHIP1 and the interface circuit 820 of the stacked memory 800 through corresponding contact nodes CND. The second bus BUS2 may couple the interface circuit 920 of the second chip CHIP2 and the interface circuit 830 of the stacked memory 800 through corresponding contact nodes CND. In an embodiment, each of the first and second buses BUS1 and BUS2 may be an interposer channel through which a corresponding pair of the interface circuits 910, 820, 830 and 920 are electrically coupled to each another.

The first I/O bus IO_A may be a bus through which the first chip CHIP1 is coupled to an external device (e.g., an external chip). The second I/O bus IO_B may be a bus through which the second chip CHIP2 is coupled to an external device (e.g., an external chip).

In a conventional memory system where a plurality of memories are coupled to a plurality of chips on a one to one basis, it is necessary for each of the plurality of chips to include an additional memory for data transmission therefrom. In this case, since the conventional memory system does not include a channel through which the respective memories are coupled to each other during data transmission of each memory, the conventional memory system must allow data of each memory to pass through different chips every data transmission, resulting in reduction in data transmission efficiency.

For example, in a conventional memory system, a plurality of memories are coupled to a plurality of chips, respectively, and two or more chips are coupled to each other through I/O buses. When data is transmitted from a first memory to a second memory, because the first memory and the second memory is not directly coupled through a channel, the data is transmitted from the first memory to a first chip coupled to the first memory, transmitted from the first chip to a second chip coupled to the second memory through one or more I/O buses, and then transmitted from the second chip to the second memory.

In contrast, according to an embodiment of the present disclosure, multiple chips (e.g., the first and second chips CHIP1 and CHIP2 in FIG. 18) are configured to share the stacked memory 800 through the shared bus 840 of the stacked memory 800, and thus the multiple chips may share data stored in the stacked memory 800. In addition, the shared bus 840 may directly transmit data between the first chip CHIP1 and the second chip CHIP2 without accessing the stacked memory 800. As a result, data transmission efficiency may be increased and power consumption caused by such data transmission may be reduced.

Figure 19:
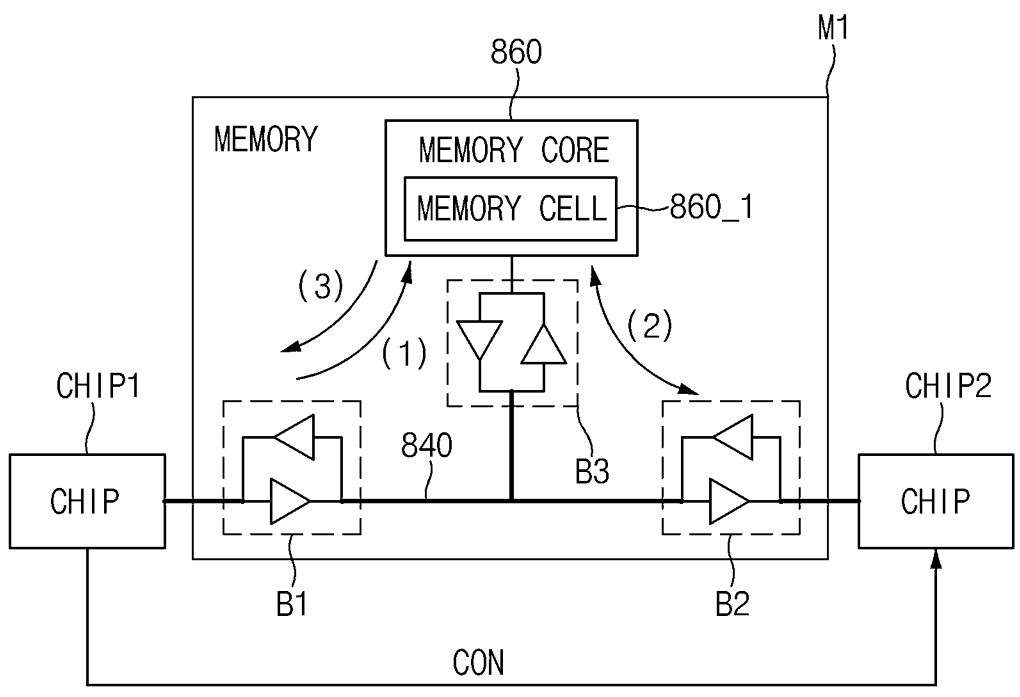
FIG. 19 illustrates a memory (or a memory device) shown in FIG. 1 according to an embodiment of the present disclosure.

FIG. 19 illustrates a memory M1 shown in FIG. 18 according to an embodiment of the present disclosure. Since the memories M1~M4 according to an embodiment of the present disclosure are substantially identical in structure to each other, a detailed structure of the memory M1 from among the memories M1~M4 will be described below for convenience of description and better understanding of the present disclosure, and descriptions for the remaining memories M2~M4 will be omitted for the interest of brevity. In addition, some of constituent elements of the memory M1 that are used for data transmission will hereinafter be described with reference to FIG. 19.

The memory M1 may include a shared bus 840, first, second, and third buffers B1, B2, and B3, and a memory core 860.

The first buffer B1 may buffer at least one signal received from a first chip CHIP1, and may transmit the buffered signal to the shared bus 840. In addition, the first buffer B1 may buffer at least one signal received from the shared bus 840, and may transmit the buffered signal to the first chip CHIP1.

The second buffer B2 may buffer at least one signal received from the second chip CHIP2, and may transmit the buffered signal to the shared bus 840. In addition, the second buffer B2 may buffer at least one signal received from the shared bus 840, and may transmit the buffered signal to the second chip CHIP2.

The third buffer B3 may buffer at least one signal applied to the shared bus 840, and may transmit the buffered signal to the memory core 860. In addition, the buffer B3 may buffer at least one signal received from the memory core 860, and may transmit the buffered signal to the shared bus 840.

In an embodiment, the first and second chips CHIP1 and CHIP2 may perform data communication with each other through the shared bus 840 without passing through the memory core 860. In an embodiment, addresses, commands, and control signals may also be communicated between the first chip CHIP1 and the second chip CHIP2 through the shared bus 840.

The memory core 860 may include not only a plurality of memory cells 861, each of which stores data therein, but also a plurality of circuits for performing one or more core operations of the memory cells 861.

In an embodiment, when a single stacked memory 800 is shared by the first and second chips CHIP1 and CHIP2, a time (or an access time) at which the first chip CHIP1 or the second CHIP starts to access the single stacked memory 800 may be controlled. For convenience of description and better understanding of the present disclosure, in the embodiment of FIG. 19, one chip (e.g., the first chip CHIP1) may have higher priority over the other chip (e.g., the second chip CHIP2), and the higher-priority chip CHIP1 may control an access time to the shared bus 840. In accordance with the embodiment shown in FIG. 19 of the present disclosure, the first chip CHIP1 may generate a control signal CON, and may transmit the generated control signal CON to the second chip CHIP2, thereby controlling an access time to the stacked memory 800.

For example, when the first chip CHIP1 gains access to the memory core 860, the first chip CHIP1 may transmit an activated (or enabled) control signal CON to the second chip CHIP2. The second chip CHIP2 may enter a standby mode in response to the activated control signal CON. After the first chip CHIP1 has completed an operation of accessing the memory core 860, the first chip CHIP1 may transmit a deactivated (or disabled) control signal CON to the second chip CHIP2. As a result, the second chip CHIP2 may perform an operation of accessing the memory core 860.

In an embodiment, the single stacked memory 800 is shared by the first chip CHIP1, the second chip CHIP2, and a third chip (not shown). The first chip CHIP1 may have higher priority over the second chip CHIP2, and the second chip CHIP2 may have higher priority over the third chip. For example, when the first chip CHIP1 accesses the memory core 860, the first chip CHIP1 may transmit an activated (or enabled) first control signal (not shown) to the second chip CHIP2 and the third chip. As a result, each of the second chip CHIP2 and the third chip may enter a standby mode in response to the activated first control signal. After the first chip CHIP1 has completed an operation of accessing the memory core 860, the first chip CHIP1 may transmit a deactivated (or disabled) first control signal to the second chip CHIP2 and third chip. When the second chip CHIP2 receives the deactivated first control signal from the first chip CHIP1, the second chip CHIP2 may access the memory core 860 and transmit an activated second control signal (not shown) to the third chip. As a result, the third chip may enter a standby mode in response to the activated second control signal. When the third chip receives the deactivated first control signal and a deactivated second control signal, the third chip may access the memory core 860.

Operations of the memory M1 shown in FIG. 19 are as follows.

First of all, upon receiving a command (e.g., a command for processing data written in an arbitrary address, and a processing type about the written data, etc.) from a host (not shown), the first chip CHIP1 may access the memory M1. The first buffer B1 may buffer data received from the first chip CHIP1, and the buffered data may be transmitted to the shared bus 840. The third buffer B3 may buffer data received through the shared bus 840, and the buffered data may be stored in a specific region (e.g., a common region 863 in FIG. 22) of the memory cell 860_1 after passing through a first route (1).

Thereafter, the second chip CHIP2 may read data (e.g., data written by the first chip CHIP1) stored in a specific region (e.g., the common region 863 in FIG. 22) of the memory cell 861, and may perform a computation operation on the read data. The second chip CHIP2 may store data in the memory core 860 during a write operation, and may read data stored in the memory core 860 during a read operation.

For example, data read from the memory cell 860_1 may be buffered by third and second buffers B3 and B2, the buffered data may be transmitted to the second chip CHIP2, and then processed by the second chip CHIP2. Data processed by the second chip CHIP2 may be buffered by the second buffer B2, and the buffered data may be transmitted to the shared bus 840. The third buffer B3 may buffer the transmitted data to the shared bus 840, and the buffered data may be stored in a specific region (e.g., a second chip allocation region 862 in FIG. 22) of the memory cell 861 through a second route (2).

Subsequently, the first chip CHIP1 may read data stored in a specific region (e.g., the second chip allocation region 862 in FIG. 22) of the memory cell 861 through a third route (3), may confirm the data processing result of the second chip CHIP2 based on the read data, and may perform other operations based on the confirmed result.

As described above, in a memory system (e.g., the memory system 11_2 in FIG. 18) according to an embodiment of the present disclosure, data communicated between the plurality of chips CHIP1 and CHIP2 may be processed within a stacked memory device (e.g., the stacked memory 800), resulting in increased efficiency in data transmission.

Figure 20:
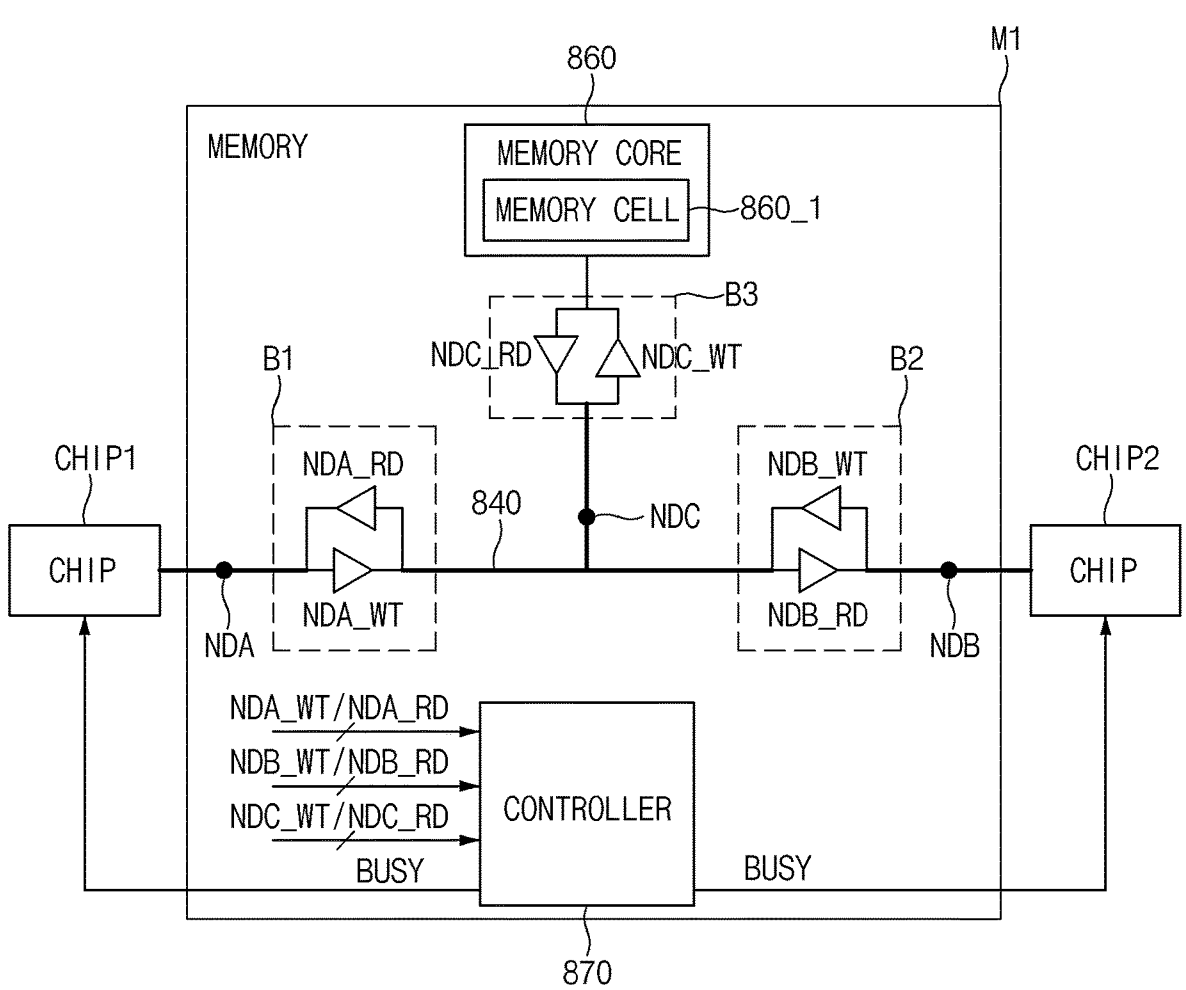
FIG. 20 illustrates a memory (or a memory device) shown in FIG. 18 according to an embodiment of the present disclosure.

FIG. 20 illustrates the memory M1 shown in FIG. 18 according to an embodiment of the present disclosure. The memory M1 shown in FIG. 20 may further include a controller 870 as compared to the memory M1 shown in FIG. 19.

Referring to FIG. 20, the controller 870 may adjust or control an access time at which either a first chip CHIP1 or a second chip CHIP2 starts to access the memory core 860. In other words, when a single stacked memory 800 is shared by the first and second chips CHIP1 and CHIP2, an interrupt may occur between the first and second chips CHIP1 and CHIP2, thereby resulting in an occurrence of data collision in the shared bus 840.

Therefore, during data communication between the memory core 860 and one of the chips CHIP1 and CHIP2, the controller 870 in FIG. 20 may determine an access state of the memory core 860, and the controller 870 may adjust or control an access time of one of the first and second chips CHIP1 and CHIP2 to the memory core 860 based on the determined access state of the memory core 860. In more detail, as can be seen from FIG. 20, the controller 870 may adjust or control an access time of one of the first and second chips CHIP1 and CHIP2 to the memory core 860.

In an embodiment, the controller 870 may detect an operation state of the memory core 860, and may output a busy signal (BUSY) to each of the chips CHIP1 and CHIP2, thereby adjusting or controlling an access time between the memory core 860 and one of the chips CHIP1 and CHIP2. When at least one of the buffers B1~B3 is in a write operation mode or in a read operation mode, the controller 870 may activate the busy signal BUSY.

For example, the controller 870 may receive a first write signal NDA_WT and a first read signal NDA_RD that are applied to a first node NDA between the first chip CHIP1 and the first buffer B1, may receive a second write signal NDB_WT and a second read signal NDB_RD that are applied to a second node NDB between the second chip CHIP2 and the second buffer B2, and may receive a third write signal NDC_WT and a third read signal NDC_RD that are applied to a third node NDC, such that the controller 870 may detect an operation state of the memory core 160 and may control the busy signal (BUSY).

Figure 21:
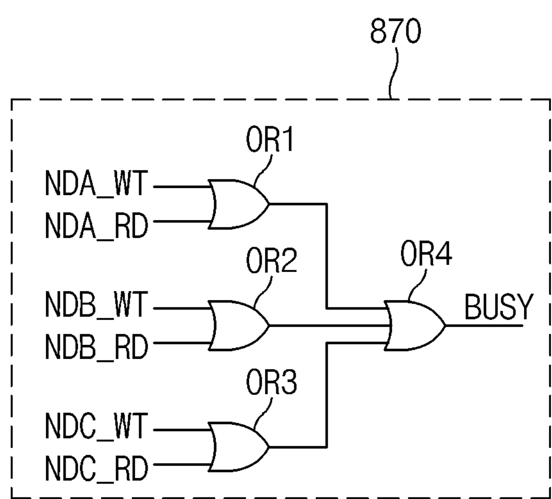
FIG. 21 illustrates a controller shown in FIG. 20 according to an embodiment of the present disclosure.

FIG. 21 illustrates the controller 870 shown in FIG. 20 according to an embodiment of the present disclosure.

Referring to FIG. 21, when one or more of the write signal and the read signal applied to each of the nodes NDA, NDB, and NDC of the stacked memory 800 is activated, the controller 870 may output a busy signal BUSY.

For example, when the busy signal BUSY is deactivated, it may be possible for each of the first and second chips CHIP1 and CHIP2 to access the memory core 860. In contrast, during a read operation or a write operation of the first chip CHIP1, the controller 870 may activate the busy signal BUSY. When the busy signal BUSY is activated, the second chip CHIP2 may determine that the first chip CHIP1 is accessing the memory core 860, and the chip CHIP2 may enter a standby mode without accessing the stacked memory 800. When the first chip CHIP1 receives the activated busy signal BUSY after the first chip CHIP1 has accessed the memory core 860, the first chip CHIP1 may continue to access the memory core 860.

In an embodiment, the controller 870 may include a plurality of logic circuits, for example, a plurality of OR gates OR1~OR4. The first OR gate OR1 may perform a logic OR operation on the first write signal NDA_WT and the first read signal NDA_RD. The second OR gate OR2 may perform a logic OR operation on the second write signal NDB_WT and the second read signal NDB_RD. The third OR gate OR3 may perform a logic OR operation on the write signal NDC_WT and the read signal NDC_RD. The fourth OR gate OR4 may generate a busy signal (BUSY) by performing a logic OR operation on output signals of the plurality of OR gates OR1~OR3.

Figure 22:
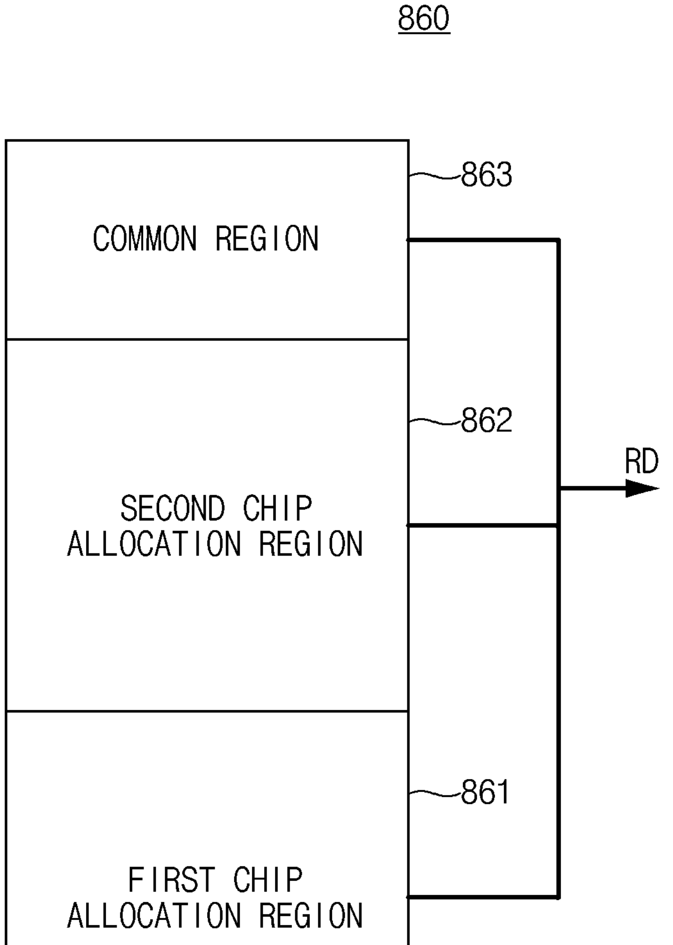
FIG. 22 illustrates a plurality of allocation regions of a memory core suitable for use in the memory shown in FIG. 19 according to an embodiment of the present disclosure.

FIG. 22 illustrates a plurality of allocation regions of the memory core 860 shown in FIG. 19 according to an embodiment of the present disclosure.

Referring to FIG. 22, the memory core 860 may store data received through the shared bus 840 during a write operation, or may output the stored data to the shared bus 840 during a read operation. During the write operation, the memory core 860 may identify a storage region for storing data using a row address, and may allocate data to the identified storage region. The memory core 860 may include a plurality of regions, for example, a first chip allocation region 861, a second chip allocation region 862, and a common region 863.

The memory core 160 may include the first chip allocation region 861 that stores data received from the first chip CHIP1. For example, the first chip allocation region 861 may be a memory region that is allocated to store data received from the first chip CHIP1, rather than from another chip (e.g., the second chip CHIP2).

The memory core 860 may include the second chip allocation region 862 that stores data received from the second chip CHIP2. For example, the second chip allocation region 862 may be a memory region that is allocated to store data received from the chip CHIP2, rather than from another chip (e.g., the first chip CHIP1).

In addition, the memory core 860 may include the common region 863 that stores not only data received from the first chip CHIP1 but also data received from the second chip CHIP2. The common region 863 may be a memory region that is commonly allocated to store data according to resources of two chips CHIP1 and CHIP2. In an embodiment, the common region 863 may include a first portion that stores data received from the first chip CHIP1 and a second portion that stores data received from the second chip CHIP2 and a ratio between the first portion and the second portion of the common region 863 may be dynamically adjusted.

The above-described embodiment of the present disclosure has disclosed that the storage region of the memory core 860 is divided into three division regions for convenience of description and better understanding of the present disclosure. However, embodiments of the present disclosure are not limited thereto, and one or more of the first chip allocation region 861, the second chip allocation region 862, and the common region 863 may be further divided into a plurality of division regions.

In a read operation of the memory M1, the respective chips CHIP1 and CHIP2 may read data RD from any of the first chip allocation region 861, the second chip allocation region 862, and the common region 863 in the memory core 860. In other words, during the read operation of the memory M1, a memory system including the first and second chips CHIP1 and CHIP2 may access all of the first chip allocation region 861, the second chip allocation region 862, and the common region 863 regardless of whether either the first chip CHIP1 or the second chip CHIP2 reads data RD from the memory core 860.

Figure 23:
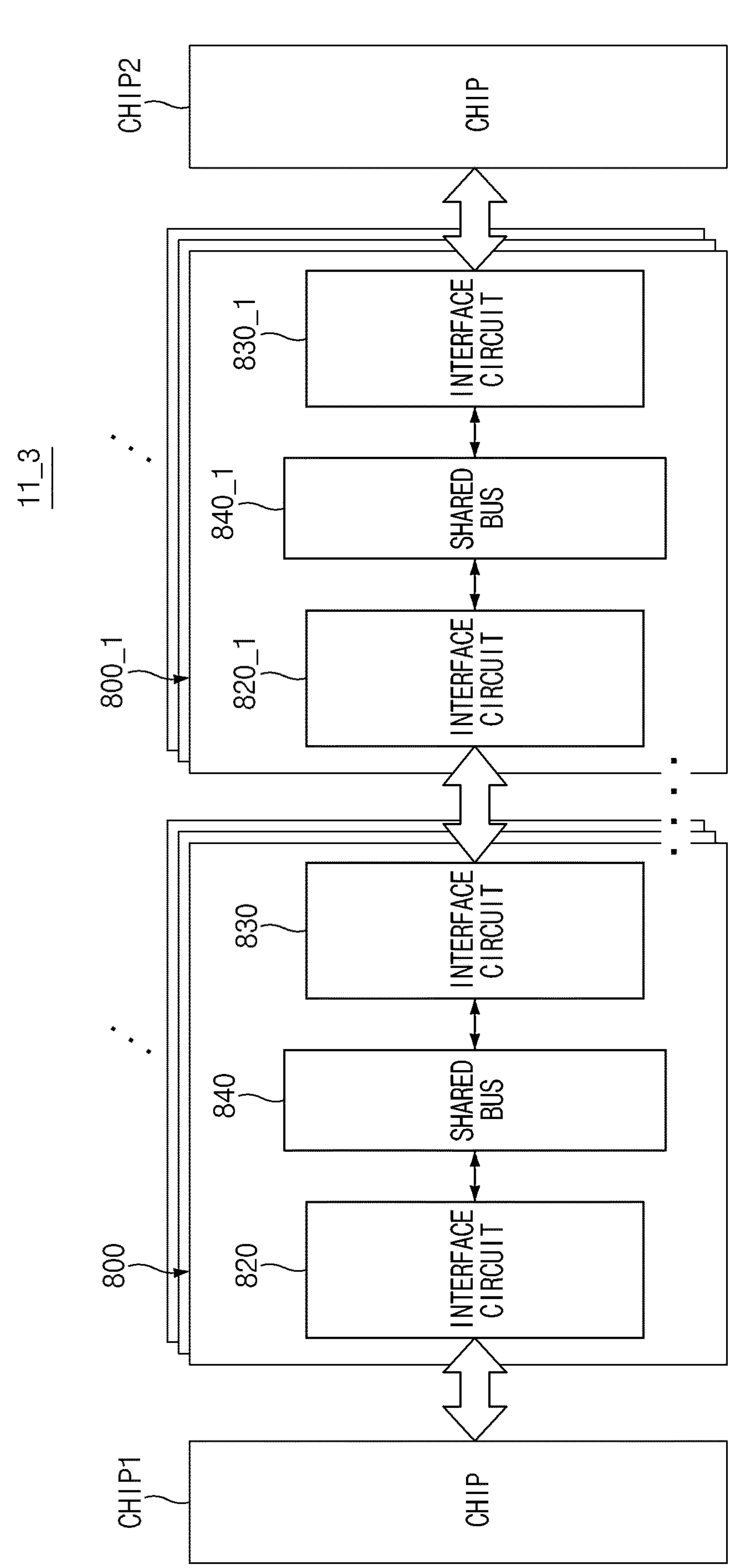
FIG. 23 illustrates a memory system according to another embodiment of the present disclosure.

FIG. 23 illustrates a memory system 11_3 according to another embodiment of the present disclosure.

The memory system 11_3 shown in FIG. 23 may include a plurality of stacked memories, for example, a first stacked memory 800 and a second stacked memory 800_1, whereas the memory system shown 10 in FIG. 18 includes a single stacked memory 800. Each of the first stacked memory (or first stacked memory device) 800 and the second stacked memory device (or second stacked memory device) 800_1 includes a plurality of memories (e.g., the memories M1 to M4 in FIG. 18), one or more interface circuits, and a shared bus (e.g., the shared bus 840 in FIG. 18). The remaining constituent elements not shown in FIG. 23 are identical in structure to those of FIG. 18, and thus detailed descriptions thereof will herein be omitted for the interest of brevity.

The memory system 11_3 shown in FIG. 23 may include two stacked memories 800 and 800_1 disposed between the first and second chips CHIP1 and CHIP2 for convenience of description and better understanding of the present disclosure. However, embodiments of the present disclosure are not limited thereto, and three or more stacked memories may also be disposed between the first and second chips CHIP1 and CHIP2.

The first chip CHIP1 and the first stacked memory 800 may be coupled to each other through an interface circuit 820. The first stacked memory 800 may be coupled to each of interface circuits 820 and 830 through a first shared bus 840 embedded therein. The interface circuit 830 of the first stacked memory 800 may be coupled to an interface circuit 820_1 of the second stacked memory 800_1 neighboring the first stacked memory 800.

The second chip CHIP2 and the second stacked memory 800_1 may be coupled to each other through an interface circuit 830_1. The second stacked memory 800_1 may be coupled to each of the interface circuits 820_1 and 830_1 through a second shared bus 840_1 embedded therein.

The first and second stacked memories 800 and 800_1 may be electrically coupled to each other through the interface circuits 820, 830, 820_1, and 830_1 and the first and second shared buses 840 and 840_1. As a result, data may be communicated between the first chip CHIP1 and the second chip CHIP2 through the first and second stacked memories 800 and 800_1.

For example, data may transmitted from the first chip CHIP1 to the second stacked memory device 800_1 through the first stacked memory device 800, and then may be stored in a memory of the second stacked memory device 800_1. Data may be transmitted from the second chip CHIP2 to the first stacked memory device 800 through the second stacked memory device 800_1, and then may be stored in a memory of the first stacked memory device 800.

As described above, the memory system 11_3 according to the embodiment shown in FIG. 23 may include the first and second stacked memories 800 and 800_1 coupled to each other in the form of a chain. However, embodiments of the present disclosure are not limited thereto, and the number of a plurality of stacked memories that share data to make a plurality of chips communicate with each other may be increased.

Figure 24:
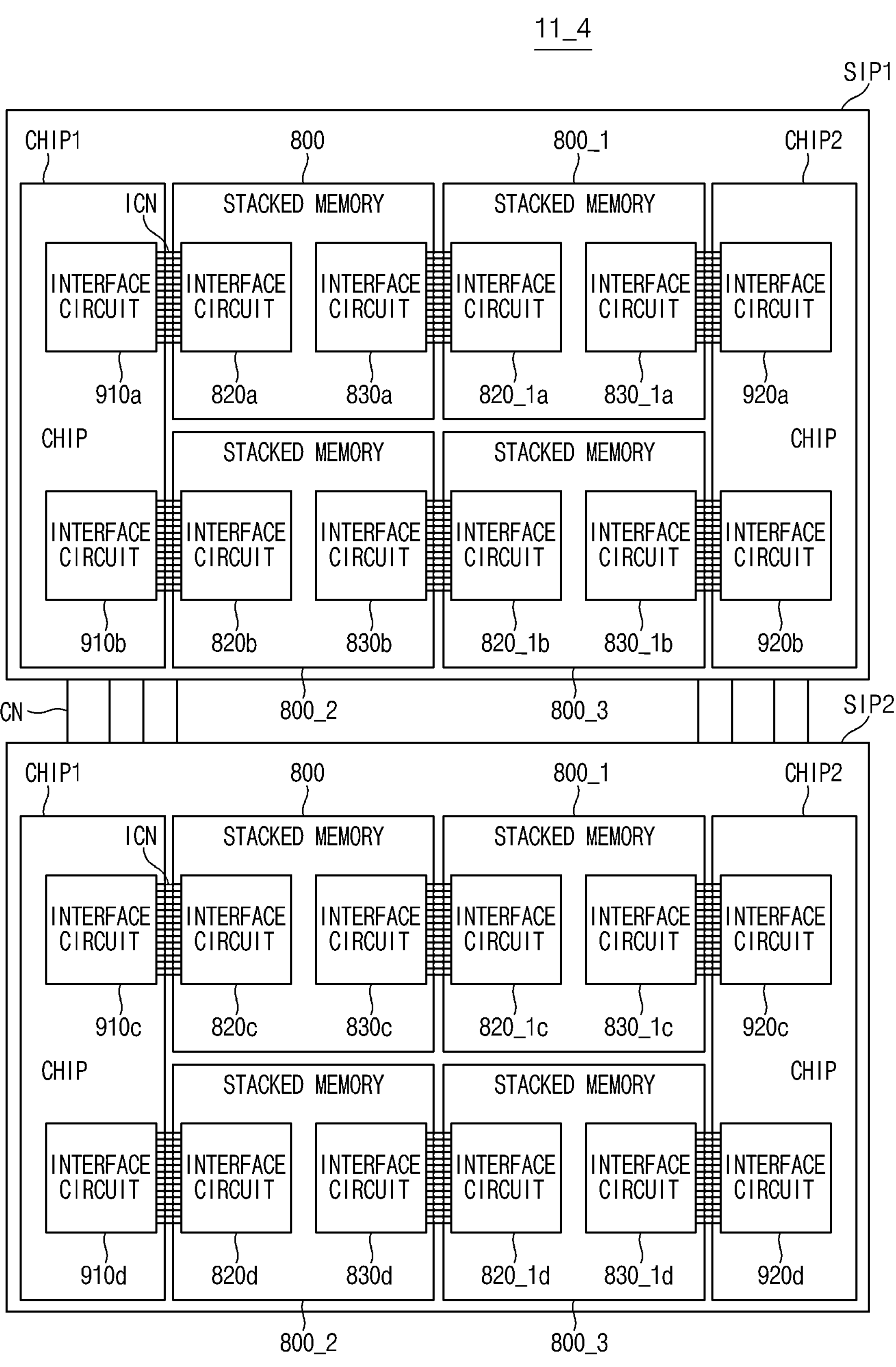
FIG. 24 illustrates a memory system according to still another embodiment of the present disclosure.

FIG. 24 illustrates a memory system 11_4 according to yet another embodiment of the present disclosure.

A plurality of memories may be integrated into a single package, and thus a single packaged product can operate at a high speed, process high-capacity data, and perform multi-functional operations. For example, System In Package (SIP) technology has been developed. In the SIP technology, microprocessor dies and memory dies can be implemented as a System In Package (SIP) using interposer interconnect technology.

The embodiment of FIG. 24 illustrates an example of a memory system 11_4 including at least one system-in-package (SIP). Referring to FIG. 24, the memory system 11_4 may include first and second system-in-packages (SIPs) SIP1 and SIP2. The first and second system-in-packages (SIPs) SIP1 and SIP2 shown in FIG. 24 are substantially identical in structure to each other, only the first system-in-package (SIP) SIP1 will be described hereinafter for convenience of description and better understanding of the present disclosure.

The first system-in-package SIP1 may include first, second, third, and fourth stacked memories (or stacked memory devices) 800~800_3 and first and second chips CHIP1 and CHIP2. Although the first system-in-package SIP1 according to the embodiment shown in FIG. 24 includes four stacked memories 800~800_3 for convenience of description, embodiments of the present disclosure are not limited thereto, and the number of stacked memories 800~800_3 may vary in other embodiments.

The stacked memories 800~800_3 may be disposed between the first chip CHIP1 and the second chip CHIP2. For example, the four stacked memories 800~800_3 may be arranged in row and column directions of a matrix.

The first and third stacked memories 800 and 800_2 may be disposed adjacent to the first chip CHIP1, and the first and third stacked memories 800 and 800_2 may be electrically coupled to interface circuit 910*a* and 910*b* of the first chip CHIP1 through interface circuits 820*a* and 820*b*, respectively. The second and fourth stacked memories 800_1 and 800_3 may be disposed adjacent to the second chip CHIP2, and the second and fourth stacked memories 800_1 and 800_3 may be electrically coupled to interface circuits 920*a* and 920*b* of the second chip CHIP2 through interface circuits 830_1*a* and 830_1*b*, respectively. The interface circuit 830*a* of the first stacked memory 800 and the interface circuit 830*b* of the third stacked memory 800_2 may be coupled to the interface circuit 820_1*a* of the second stacked memory 800_1 and the interface circuit 820_1*b* of the fourth stacked memory 800_3, respectively.

The interface circuits 910*a*, 910*b*, 920*a*, 920*b*, 820*a*, 820*b*, 830*a*, 830*b*, 820_1*a*, 820_1*b*, 830_1*a*, and 830_1*b* included in the first and second chips CHIP1 and CHIP2 and the stacked memories 800~800_3 may be interconnected through an interposer channel ICN. For example, the interface circuit 910*a* of the first chip CHIP1 may be coupled to the interface circuit 820*a* of the first stacked memory 800 through one or more interpose channels ICN, the interface circuit 830*a* of the first stacked memory 800 may be coupled to the interface circuit 820_1*a* of the second stacked memory 800_1 through one or more interpose channels ICN, and the interface circuit 830_1*a* of the second stacked memory 800_1 may be coupled to the interface circuit 920*a* of the second chip CHIP2 through one or more interpose channels ICN. In an embodiment, the interposer channel ICN may correspond to each of the buses BUS1 and BUS2 shown in FIG. 19 or may also correspond to the interface channel 900.

The first system-in-package SIP1 and the second system-in-package SIP2 may be coupled to each other through one or more channels CN. In an embodiment, the channel CN through which the system-in-package SIP1 and the other system-in-package SIP2 are coupled to each other may be implemented using a Printed Circuit Board (PCB).

As is apparent from the above description, a memory system according to embodiments of the present disclosure includes a plurality of chips interconnected through a shared channel within a memory, such that a data transfer rate and data transfer efficiency may be increased and power consumption for data transmission may be reduced.

Figure 25A:
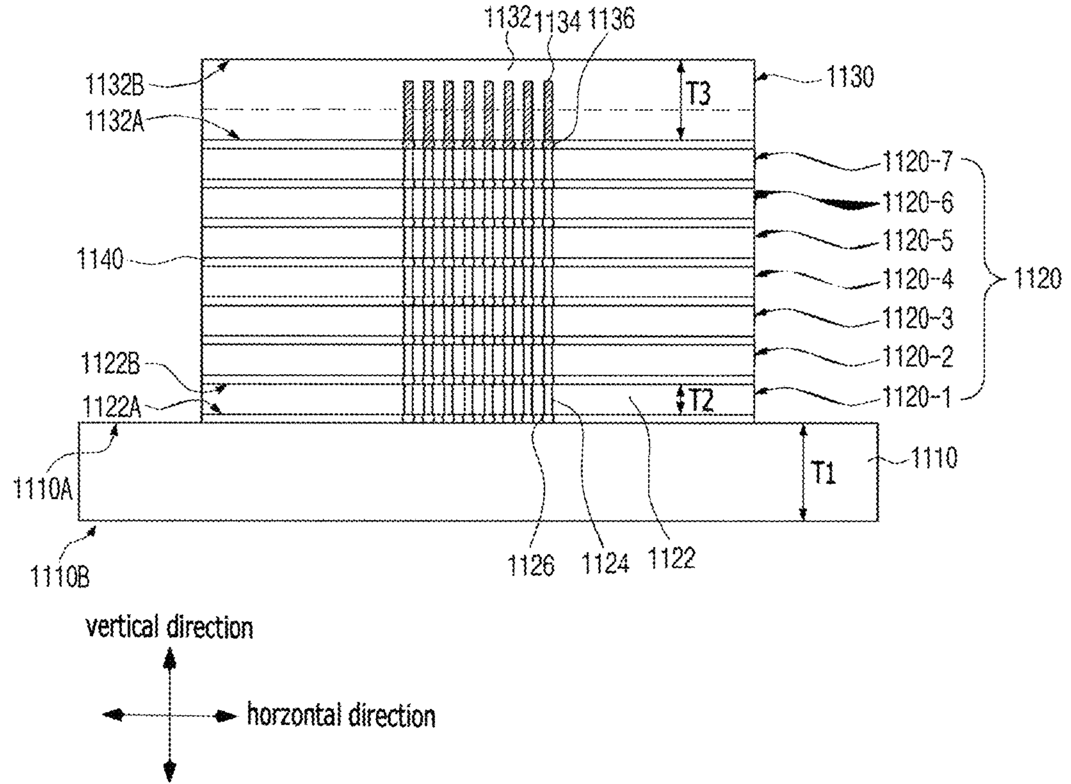
FIGS. 25A, 25B, 25C, 25D, 25E, and 25F are cross-sectional views illustrating a semiconductor package according to an embodiment of the present disclosure, and a method for fabricating the same.
Figure 25B:
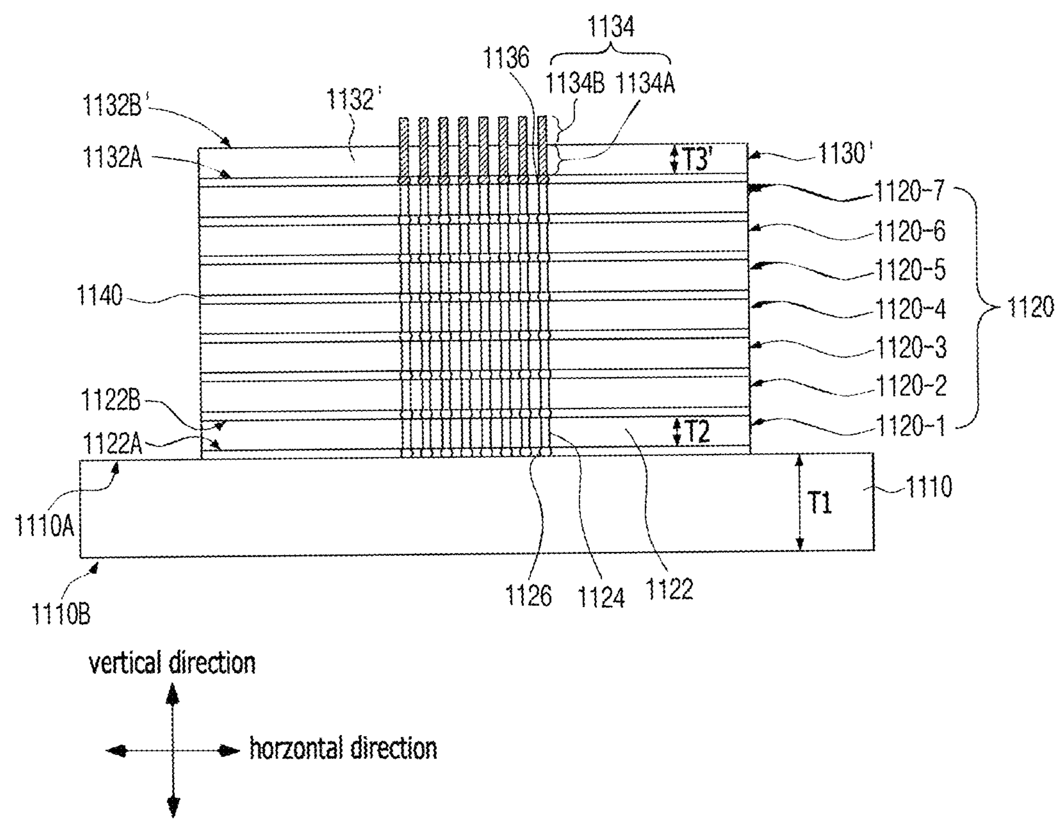
Figure 25C:
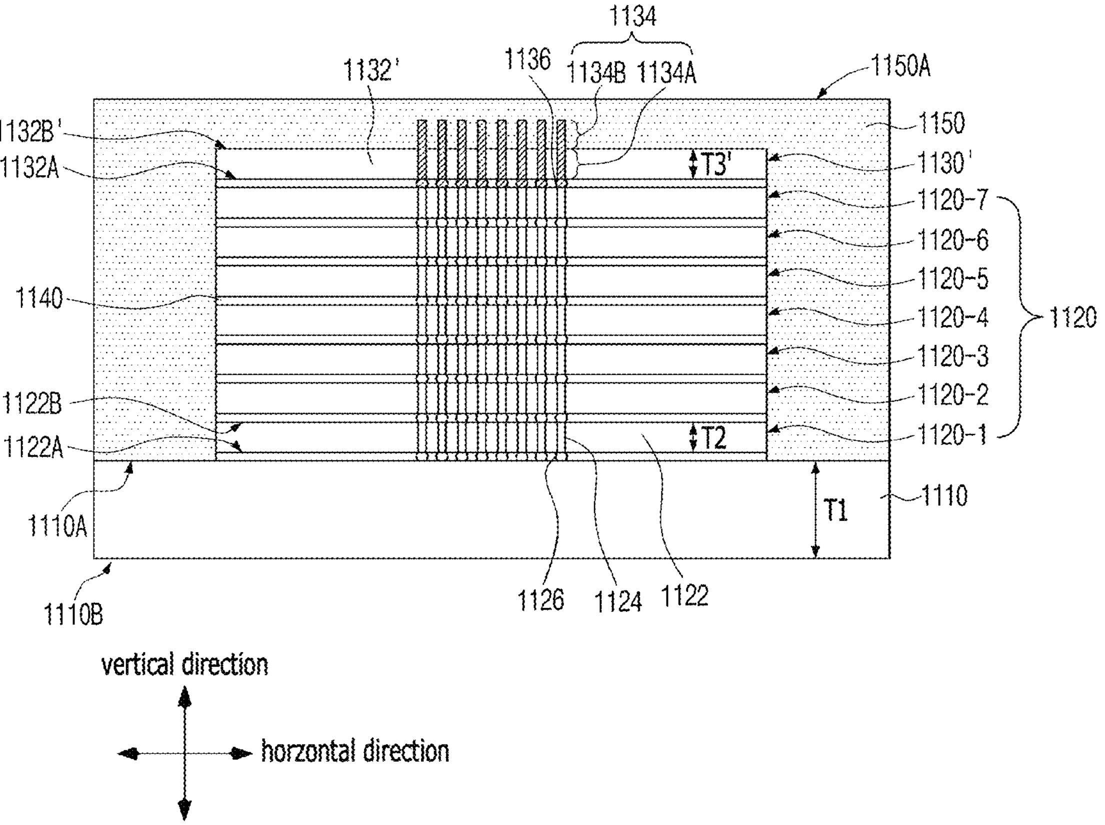
Figure 25D:
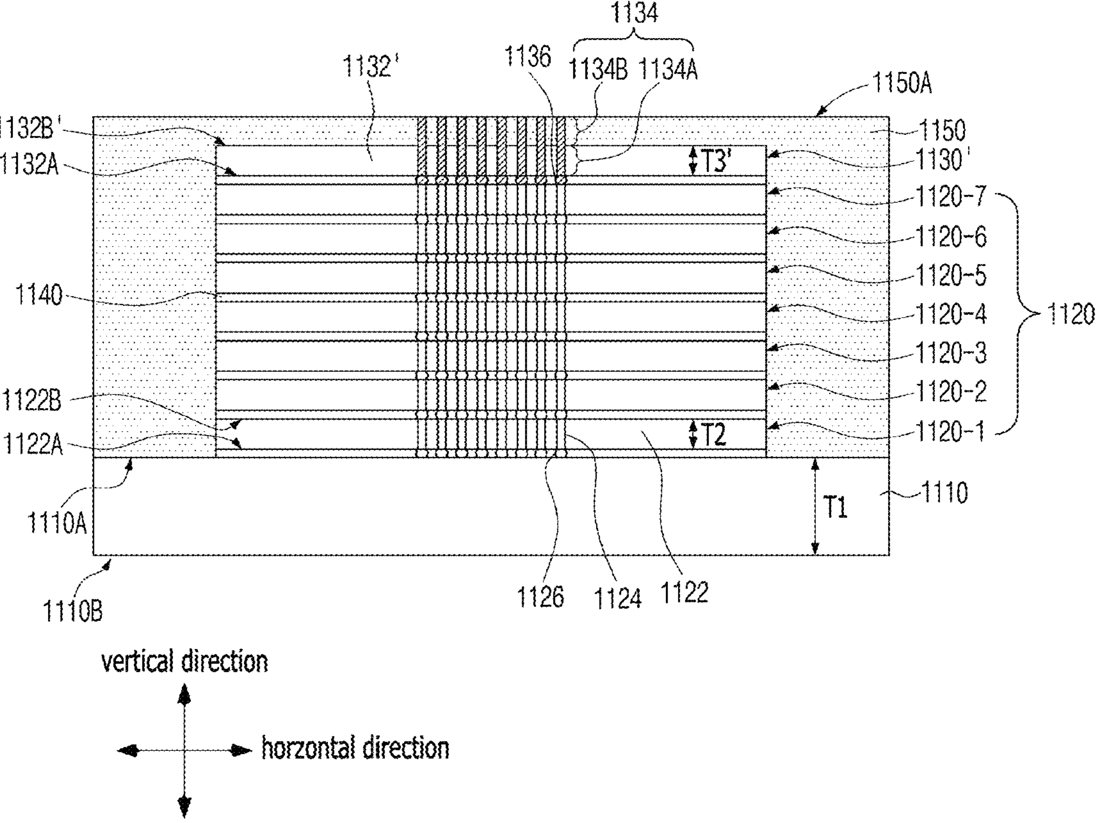
Figure 25E:
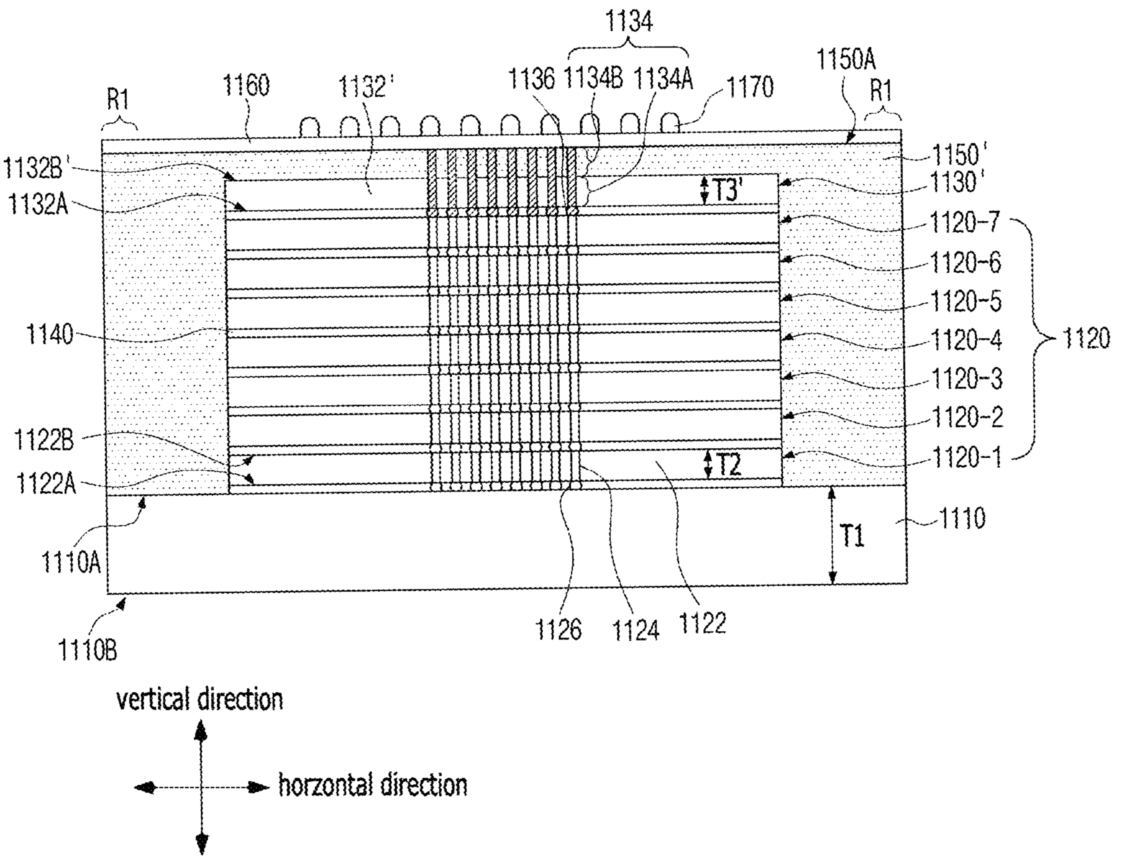
Figure 25F:
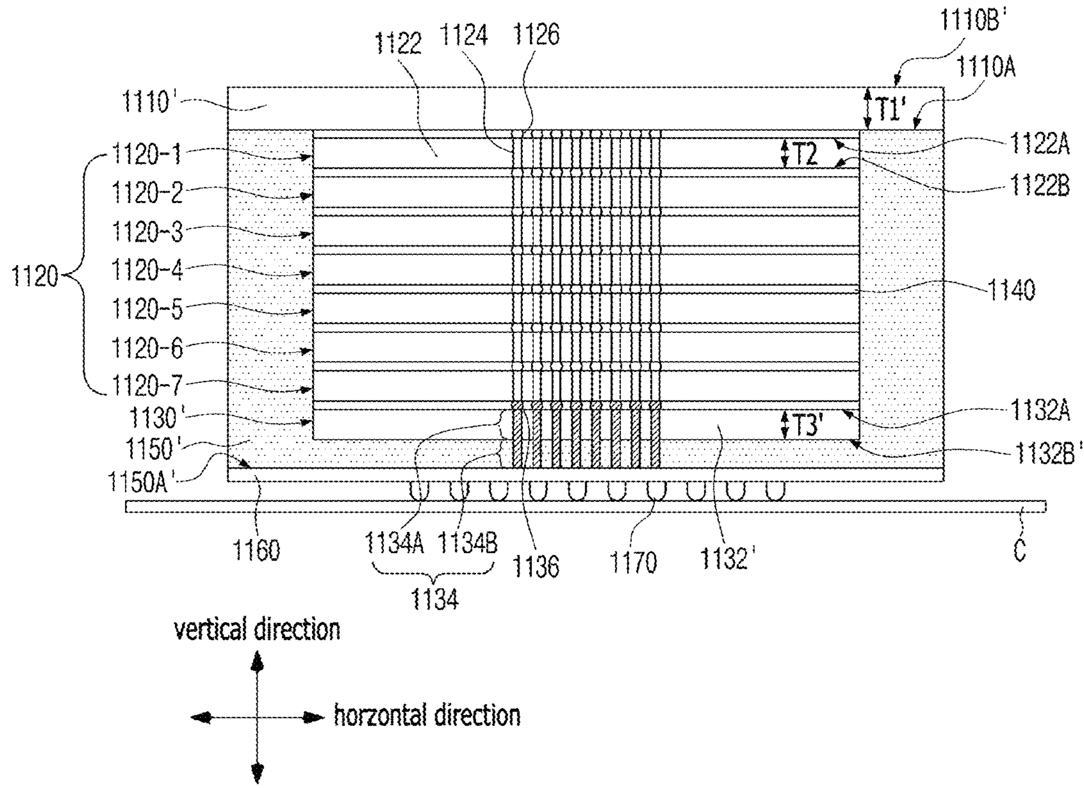

FIGS. 25A to 25F are cross-sectional views illustrating a semiconductor package according to an embodiment of the present disclosure, and a method for fabricating the same. FIG. 25F shows the semiconductor package of the present embodiment, and FIGS. 25A to 25E show intermediate process steps for fabricating the semiconductor package of FIG. 25F.

First, the fabricating method will be described.

Referring to FIG. 25A, a semiconductor wafer 1110 having a first surface 1110A and a second surface 1110B positioned opposite to the first surface 1110A may be provided.

The semiconductor wafer 1110 may be in a state before processing such as thinning or dicing is performed. The thickness of the semiconductor wafer 1110 before thinning is performed is indicated by reference numeral T1. In this process step, the first surface 1110A may correspond to an upper surface and the second surface 1110B may correspond to a lower surface. However, the upper and lower surfaces may be changed depending on how the semiconductor wafer 1110 is disposed. In the following description, upper, lower, left, and right positions may be relative, not absolute.

As an example, the semiconductor wafer 1110 may be in a state in which a circuit and/or wiring structure (not shown) is formed. The semiconductor wafer 1110 may include a circuit and/or wiring structure identical to a circuit or wiring structure of each of a plurality of first semiconductor chips 1120-1, 1120-2, 1120-3, 1120-4, 1120-5, 1120-6, and 1120-7 of a first semiconductor chip stack 1120, which will be described later. In this case, a semiconductor chip formed by processing the semiconductor wafer 1110 may be a chip of substantially the same type as each of the first semiconductor chips 1120-1 to 1120-7. For example, when each of the first semiconductor chips 1120-1 to 1120-7 is a memory chip, the semiconductor wafer 1110 may be processed to form the same memory chip.

Alternatively, as another example, the semiconductor wafer 1110 might not include a meaningful circuit and/or wiring structure. That is, the semiconductor wafer 1110 may be a dummy wafer that is not related to performing electrical functions.

Subsequently, a first semiconductor chip stack 1120 may be formed over the first surface 1110A of the semiconductor wafer 1110.

The first semiconductor chip stack 1120 may include a plurality of first semiconductor chips 1120-1 to 1120-7 that are stacked in a vertical direction. In the present embodiment, seven first semiconductor chips 1120-1 to 1120-7 are stacked, but the present disclosure is not limited thereto, and the number of first semiconductor chips that are included in the first semiconductor chip stack 1120 may be variously modified. For convenience of description, the first semiconductor chip closest to the semiconductor wafer 1110 is indicated by reference numeral 1120-1, and the first semiconductor chip furthest from the semiconductor wafer 1110 is) indicated by reference numeral 1120-7.

Each of the first semiconductor chips 1120-1 to 1120-7, which is in a state in which processing such as thinning and dicing has been completed, may be stacked over the semiconductor wafer 1110.

Each of the first semiconductor chips 1120-1 to 1120-7 may include a first body portion 1122, a first through electrode 1124, and a first connection electrode 1126.

The first body portion 1122 may include a first surface 1122A facing the first surface 1110A of the semiconductor wafer 1110, a second surface 1122B located opposite to the first surface 1122A, and a side surface connecting the first surface 1122A and the second surface 1122B. Accordingly, in this process step, the first surface 1122A may correspond to a lower surface and the second surface 1122B may correspond to an upper surface. The thickness of the first body portion 1122 is indicated by reference numeral T2. This thickness T2 may be smaller than the thickness T1 of the semiconductor wafer 1110. The planar areas of the first body portions 1122 of the first semiconductor chips 1120-1 to 1120-7 may be the same as each other. Further, the side surfaces of the first body portions 1122 of the first semiconductor chips 1120-1 to 1120-7 may be aligned with each other.

Although not shown, the first body portion 1122 may include a semiconductor body such as silicon, and an integrated circuit formed in the semiconductor body and having various functions. The integrated circuit may be variously implemented according to the type of the first semiconductor chips 1120-1 to 1120-7. For example, when the first semiconductor chips 1120-1 to 1120-7 are memory chips, the integrated circuit may include a memory array including a plurality of memory cells. The first semiconductor chips 1120-1 to 1120-7 may include volatile memory such as dynamic random access memory (DRAM) and static random access memory (SRAM), or nonvolatile memory such as NAND flash memory, resistive random access memory (RRAM), phase-change random access memory (PRAM), magneto-resistive random access memory (MRAM), and ferroelectric random access memory (FRAM).

The first through electrode 1124 may extend in the vertical direction to penetrate the first body portion 1122 and may have a pillar shape. In the vertical direction, one end, for example, a lower end of the first through electrode 1124 may be exposed to be positioned at substantially the same level as the first surface 1122A, and the other end, for example, an upper end of the first through electrode 1124 may be exposed to be positioned at substantially the same level as the second surface 1122B. When the first body portion 1122 includes a silicon body, the first through electrode 1124 may include a TSV (Through Silicon Via). The number and arrangement of the first through electrodes 1124 included in each of the first semiconductor chips 1120-1 to 1120-7 may be variously modified. The first through electrode 1124 may include a metal such as copper (Cu), tin (Sn), silver (Ag), tungsten (W), nickel (Ni), ruthenium (Ru), and cobalt (Co), or a compound thereof.

The first connection electrode 1126 may be formed over the first surface 1122A of the first body portion 1122 of each of the first semiconductor chips 1120-1 to 1120-7 to be connected to the one end of the first through electrode 1124. Further, the first connection electrode 1126, which is connected to the one end of the first through electrode 1124 of each of the first semiconductor chips 1120-1 to 1120-7, may be connected to the other end of the first through electrode 1124 of one of the first semiconductor chips 1120-1 to 1120-6, which is immediately lying thereunder, or the semiconductor wafer 1110. In this figure, the first connection electrode 1126 is in direct contact with the other end of the first through electrode 1124 located thereunder the one end of the first through electrode 1124 located thereover, in the vertical direction. However, the present disclosure is not limited thereto, and when each of the first semiconductor chips 1120-1 to 1120-7 further includes a redistribution layer (not shown) that is formed over the first surface 1122A or the second surface 1122B of the first body portion 1122, the first connection electrode 1126 may be electrically connected to the first through electrode 1124 via the redistribution layer. The number and arrangement of the first connection electrodes 1126 may be substantially the same as the number and arrangement of the first through electrodes 1124. The first connection electrode 1126 may be, as an example, a conductive bump. In particular, the first connection electrode 1126 may include a solder material that can be bonded to the first through electrode 1124. However, the present disclosure is not limited thereto, and the first connection electrode 1126 may include various metal materials, solder materials, or a combination thereof. In addition, the first connection electrode 1126 may have various shapes such as a pillar shape, a ball shape, or a combination thereof.

Accordingly, electrical connection between the plurality of first semiconductor chips 1120-1 to 1120-7 may be possible through the first through electrodes 1124 and the first connection electrodes 1126. Further, when the semiconductor wafer 1110 includes a circuit and/or a wiring structure, electrical connection between the plurality of first semiconductor chips 1120-1 to 1120-7 and the semiconductor wafer 1110 may also be possible.

Subsequently, an initial second semiconductor chip 1130 may be formed over the first semiconductor chip stack 1120. The initial second semiconductor chip 1130 may be in a state in which processing, excluding thinning, is completed.

The initial second semiconductor chip 1130 may include an initial second body portion 1132, a second through electrode 1134, and a second connection electrode 1136.

The initial second body portion 1132 may include a first surface 1132A facing the first surface 1110A of the semiconductor wafer 1110, an initial second surface 1132B positioned opposite to the first surface 1132A, and a side surface connecting the first surface 1132A and the initial second surface 1132B. Accordingly, in this process step, the first surface 1132A may correspond to a lower surface and the initial second surface 1132B may correspond to an upper surface. The thickness of the initial second body portion 1132 is indicated by reference numeral T3. This thickness T3 may be greater than the thickness T2 of the first body portion 1122. The planar area of the initial second body portion 1132 may be substantially the same as the planar area of the first body portion 1122. Further, the side surface of the initial second body portion 132 may be aligned with the side surfaces of the first body portions 1122.

Although not shown, the initial second body portion 1132 may include a semiconductor body, such as silicon, and an integrated circuit formed in the semiconductor body and having various functions. The integrated circuit may be implemented in various ways depending on the type of the initial second semiconductor chip 1130. For example, when the first semiconductor chips 1120-1 to 1120-7 are memory chips, the initial second semiconductor chip 1130 may be a logic chip for controlling the memory chips. As an example, the initial second semiconductor chip 1130 as a logic chip may perform an operation of providing data read from the first semiconductor chip stack 1120 as a memory chip stack to a host (not shown), or storing data provided from the host to the first semiconductor chip stack 1120. The initial second semiconductor chip 1130 may include a central processing unit (CPU), a controller, an application specific integrated circuit (ASIC), an application processor (AP), or the like.

The second through electrode 1134 may have a pillar shape, and may extend in the vertical direction from the first surface 1132A toward the initial second surface 1132B while having a thickness that does not completely penetrate the initial second body portion 1132. That is, the thickness of the second through electrode 134 may be smaller than the thickness T3 of the initial second body portion 1132. Accordingly, in the vertical direction, one end, for example, a lower end of the second through electrode 1134 may be exposed to be positioned at substantially the same level as the first surface 1132A, while the other end, for example, an upper end of the second through electrode 1134 may be positioned below the initial second surface 1132B and covered by the initial second body portion 1132. When the initial second body portion 1132 includes a silicon body, the second through electrode 1134 may include a TSV. The number and arrangement of the second through electrodes 1134 may be variously modified. As an example, the number and arrangement of the second through electrodes 1134 may be the same as the number and arrangement of the first through electrodes 1124. The second through electrode 1134 may include a metal such as copper (Cu), tin (Sn), silver (Ag), tungsten (W), nickel (Ni), ruthenium (Ru), and cobalt (Co), or a compound thereof.

The second connection electrode 1136 may be formed over the first surface 1132A of the initial second body portion 1132 of the initial second semiconductor chip 1130 to be connected to the one end of the second through electrode 1134. In addition, the second connection electrode 1136 may be connected to the other end of the first through electrode 1124 of the first semiconductor chip 1120-7 immediately lying thereunder. In this figure, the second connection electrode 1136 is in direct contact with the one end of the second through electrode 1134 positioned thereover and the other end of the first through electrode 1124 positioned thereunder, in the vertical direction. However, the present disclosure is not limited thereto, and when a redistribution layer (not shown) is further formed over the first surface 1132A of the initial second body portion 1132 and/or the second surface 1122B of the first body portion 1122 of the first semiconductor chip 1120-7, the second connection electrode 1136 and the second through electrode 1134 and/or the first through electrode 1124 of the first semiconductor chip 1120-7 may be electrically connected via the redistribution layer. The number and arrangement of the second connection electrodes 1136 may be substantially the same as the number and arrangement of the first through electrodes 1124 and the number and arrangement of the second through electrodes 1134. The second connection electrode 1136 may be, as an example, a conductive bump. In particular, the second connection electrode 1136 may include a solder material that can be bonded to the first through electrode 1124 and the second through electrode 1134. However, the present disclosure is not limited thereto, and the second connection electrode 1136 may include various metal materials, solder materials, or a combination thereof. In addition, the second connection electrode 1136 may have various shapes such as a pillar shape, a ball shape, or a combination thereof.

As a result, electrical connection between the first semiconductor chip stack 1120 and the initial second semiconductor chip 1130 may be possible.

Spaces between the semiconductor wafer 1110 and the first semiconductor chip 1120-1, between the first semiconductor chips 1120-1 to 1120-7, and between the first semiconductor chip 1120-7 and the initial second semiconductor chip 1130 may be filled with a filling material 1140 such as an underfill.

Meanwhile, although not shown, two or more stacked structures, each stacked structure including the first semiconductor chip stack 1120 and the initial second semiconductor chip 1130, may be formed over the semiconductor wafer 1110. In this case, the two or more stacked structures 1120 and 1130 may be formed to be spaced apart from each other in a horizontal direction. The two or more stacked structures 1120 and 1130 may be separated from each other by a dicing process to be described later to form one package.

Referring to FIG. 25B, by removing a part of the initial second body portion 1132 from the initial second surface 1132B of the initial second semiconductor chip 1130 of FIG. 25A to a surface indicated by a dotted line, a second body portion 1132' having a second surface 1132B' that is lower than the initial second surface 1132B may be formed. The thickness of the second body portion 1132' is indicated by reference numeral T3'. This thickness T3' may be smaller than the thickness T1 of the semiconductor wafer 1110.

The process of forming the second body portion 1132' may be performed using an etching method such as dry etching. For reference, the removed part of the initial second body portion 1132 might not include a circuit and/or a wiring structure. That is, the removed part of the initial second body portion 1132 may include only a semiconductor material such as silicon.

During the process of forming the second body portion 1132', the second through electrode 1134 may be substantially maintained. That is, the second through electrode 1134 might not be lost or may be lost to a very small extent. This may be possible by performing etching under a condition in which an etching selectivity of a semiconductor material to a metal is high during the process of forming the second body portion 1132'. As a result, the second through electrode 1134 may protrude over the second surface 1132B' of the second body portion 1132' while penetrating the second body portion 1132'. A portion of the second through electrode 1134 that is buried in the second body portion 1132' and penetrates the second body portion 1132' will be referred to as a through portion 1134A, and a portion of the second through electrode 1134 that protrudes over the second body portion 1132' will be referred to as a protruding portion 1134B.

Accordingly, a second semiconductor chip 1130' including the second body portion 1132', the second through electrode 1134, and the second connection electrode 1136 may be formed.

Meanwhile, in the present embodiment, the process of FIG. 25B is performed after the process of FIG. 25A, that is, after the initial second semiconductor chip 1130 is stacked over the first semiconductor chip stack 1120, but the present disclosure is not limited thereto. In another embodiment, after forming the second semiconductor chip 1130' of FIG. 25B, the second semiconductor chip 1130' may be stacked over the first semiconductor chip stack 1120.

Referring to FIG. 25C, an initial molding layer 1150 covering a stacked structure of the first semiconductor chip stack 1120 and the second semiconductor chip 1130' may be formed over the first surface 1110A of the semiconductor wafer 1110.

The initial molding layer 1150 may be formed to surround the side surfaces of the first semiconductor chip stack 1120 and the second semiconductor chip 1130', and cover the second through electrode 1134 of the second semiconductor chip 1130'. Accordingly, the initial molding layer 1150 may have one surface 1150A positioned at a higher level than the other end of the second through electrode 1134 in the vertical direction. The initial molding layer 1150 may include a molding material such as EMC (Epoxy Molding Compound).

Referring to FIG. 25D, a molding layer 1150' may be formed by removing a part of the initial molding layer 1150 so that the other end of the second through electrode 1134 is exposed. As a result, the one surface 1150A of the initial molding layer 1150 shown in FIG. 25C may be lowered to be positioned at substantially the same level as the other end of the second through electrode 1134, and accordingly, the other end of the second through electrode 1134 may be exposed. The lowered one surface is indicated by reference numeral 1150A'. This one surface 1150A' may form a flat surface with the other end of the second through electrode 1134.

The molding layer 1150' may be formed by grinding, chemical mechanical polishing (CMP), or the like.

Referring to FIG. 25E, a package redistribution layer 1160 and an external connection electrode 1170 may be formed over the one surface 1150A' of the molding layer 1150'.

The package redistribution layer 1160 may be to provide electrical connection between the second through electrode 1134 of the second semiconductor chip 1130' and the external connection electrode 1170. Although not shown, the package redistribution layer 1160 may include various types of conductive patterns and insulating layers in which these conductive patterns are buried. One end of the conductive patterns of the package redistribution layer 1160 may be connected to the other end of the second through electrode 1134, and the other end of the conductive patterns of the package redistribution layer 1160 may be connected to the external connection electrode 1170. The package redistribution layer 1160 may be distinguished from the redistribution layer (not shown) included in the first semiconductor chips 1120-1 to 1120-7 and/or the second semiconductor chip 1130' described above.

The external connection electrode 1170 may be for connecting the semiconductor package of the present embodiment with an external component, and may include various electrical interconnectors such as solder balls, conductive bumps, or a combination thereof.

The package redistribution layer 1160 may be omitted. In this case, the external connection electrode 1170 may directly contact the other end of the second through electrode 1134. When the external connection electrode 1170 directly contacts the other end of the second through electrode 1134, unlike the illustration, the external connection electrodes 1170 may have the same arrangement as the second through electrodes 1134.

Referring to FIG. 25F, after attaching the external connection electrode 1170 to a carrier C such as a tape or an insulating film, the resultant structure of FIG. 25E may be reversed. As a result, as shown in FIG. 25F, the upper and lower positions of the components of FIG. 25E may be reversed.

Subsequently, a thinning process and a dicing process may be performed on the resultant structure of FIG. 25E.

For example, the thinning process may be performed so that the semiconductor package of the present embodiment has a desired thickness, that is, to be thinned to a target thickness. Because the semiconductor wafer 1110 is located at the uppermost portion in this process step, the thinning process may be performed on a part of the semiconductor wafer 1110 from the second surface (see 1110B in FIG. 25E) of the semiconductor wafer 1110. The thinning process may be performed by grinding, CMP, etching, or the like. In addition, when the semiconductor wafer 1110 includes a circuit and/or wiring structure, the part of the semiconductor wafer 1110, which has been removed by the thinning process, might not include the circuit and/or wiring structure. That is, the part of the semiconductor wafer 1110, which has been removed by the thinning process, may include only a semiconductor material such as silicon.

In addition, the dicing process may be for separating the stacked structure of the first semiconductor chip stack 1120 and the second semiconductor chip 1130' from an adjacent stacked structure (not shown). The dicing process may be performed by removing the semiconductor wafer 1110, the molding layer 1150', and the package redistribution layer 1160 in a region between two adjacent stacked structures 1120 and 1130' (see R1 in FIG. 25E), using laser sawing.

The thinned and diced semiconductor wafer 1110 will be hereinafter referred to as a third semiconductor chip 1110'. The thickness T1' of the third semiconductor chip 1110' may be smaller than the thickness T1 of the semiconductor wafer 1110. In addition, the thickness T1' of the third semiconductor chip 1110' may be the same as/similar to the thickness T2 of each of the first semiconductor chips 1120-1 to 1120-7 and/or the thickness T3' of the second semiconductor chip 1130'. The planar area of the third semiconductor chip 1110' may be greater than the planar area of each of the first semiconductor chips 1120-1 to 1120-7 and the planar area of the second semiconductor chip 1130'. A side surface of the third semiconductor chip 1110' may be aligned with a side surface of the diced molding layer 1150' and a side surface of the diced package redistribution layer 1160.

As described above, the third semiconductor chip 1110' may be a semiconductor chip of the same type as each of the first semiconductor chips 1120-1 to 1120-7, for example, a memory chip, or a dummy semiconductor chip.

Although not shown, the carrier C may be removed after the thinning process and the dicing process. Thus, the semiconductor package of the present embodiment may be obtained. The semiconductor package of the present embodiment will be described with reference to FIG. 25F again. In this case, detailed descriptions of the parts already described in the above-described fabricating method will be omitted.

Referring again to FIG. 25F, the semiconductor package of the present embodiment may include the second semiconductor chip 1130', the first semiconductor chip stack 1120 including the plurality of first semiconductor chips 1120-1 to 1120-7 which are disposed over the second semiconductor chip 1130' and stacked in the vertical direction, the molding layer 1150' surrounding the side surfaces of the first semiconductor chip stack 1120 and the second semiconductor chip 1130', and the third semiconductor chip 1110' disposed over the molding layer 1150' and the first semiconductor chip stack 1120.

The first semiconductor chips 1120-1 to 1120-7 may be memory chips, and the second semiconductor chip 1130' may be a logic chip. The third semiconductor chip 1110' may be the same memory chip as the first semiconductor chips 1120-1 to 1120-7 or may be a dummy semiconductor chip.

Here, the planar area of the third semiconductor chip 1110' may be greater than the planar area of each of the first semiconductor chips 1120-1 to 1120-7 and the planar area of the second semiconductor chip 1130'. For this reason, the third semiconductor chip 1110' may overlap the first semiconductor chip stack 1120 and the second semiconductor chip 1130', and may also overlap the molding layer 1150' that surrounds the side surfaces of the first semiconductor chip stack 1120 and the second semiconductor chip 1130'. The planar area of each of the first semiconductor chips 1120-1 to 1120-7 and the planar area of the second semiconductor chip 1130' may be the same as each other, and the side surfaces thereof may be aligned with each other. Also, the side surface of the third semiconductor chip 1110' and the side surface of the molding layer 1150' may be aligned with each other.

The thickness T1' of the third semiconductor chip 1110', the thickness T2 of the first body portion 1122 of each of the first semiconductor chips 1120-1 to 1120-7, and the thickness T3' of the second body portion 1132' of the second semiconductor chip 1130' may have the same or similar value.

The second semiconductor chip 1130' and the first semiconductor chips 1120-1 to 1120-7 may be electrically connected to each other through the first through electrode 1124, the first connection electrode 1126, the second through electrode 1134, and the second connection electrode 1136. Further, the third semiconductor chip 1110' may be electrically connected to the first semiconductor chip stack 1120 and the second semiconductor chip 1130' through the first through electrode 1124, the first connection electrode 1126, the second through electrode 1134, and the second connection electrode 1136.

The second through electrode 1134 of the second semiconductor chip 1130' may include the through portion 1134A penetrating through the second body portion 1132', and the protruding portion 1134B that is integrally connected to the through portion 1134A and protrudes downward further than the second surface 1132B' of the second body portion 1132'. The molding layer 1150' may surround the side surface of the protruding portion 1134B of the second through electrode 1134 while covering the second surface 1132B' of the second body portion 1132'.

The other end of the second through electrode 1134, for example, a lower end of the protruding portion 1134B, may be exposed by the molding layer 1150', and may be connected to the external connection electrode 1170 via the package redistribution layer 1160, or directly.

The semiconductor package of the present embodiment May be electrically connected to an external component (not shown), for example, another semiconductor package, another semiconductor chip, a semiconductor substrate such as a printed circuit board (PCB), or the like, using the external connection electrode 1170.

According to the above-described semiconductor package and its fabricating method, the following advantages may be obtained.

First, because the first semiconductor chip stack 1120 and the second semiconductor chip 1130' are stacked over the thick semiconductor wafer 1110 is used, problems occurring in a comparative example in which a memory chip stack is formed over a thin logic wafer, may be solved. According to the comparative example, because the memory chip stack is formed over the thin logic wafer, and then a molding layer forming process, a thinning process, a dicing process, or the like, are performed, mechanical damage may be applied to the logic wafer, and thus defects such as cracking and chipping of the logic wafer may occur. In addition, a process of forming the memory chip stack may be difficult due to warpage of the thin logic wafer. On the other hand, according to the present embodiment, because the thick semiconductor wafer 1110 is used, the occurrence of defects such as cracking and chipping of the semiconductor wafer 1110 may be reduced, and the warpage of the semiconductor wafer 1110 may be mitigated to facilitate a process of forming the semiconductor chip stack 1120 and the second semiconductor chip 1130'. In addition, because the second semiconductor chip 1130' that can be used as a logic chip is formed over the first semiconductor chip stack 1120, direct dicing for the second semiconductor chip 1130' might not be performed. Therefore, cracking or chipping of the second semiconductor chip 1130' might not occur.

In addition, by performing the thinning process on the semiconductor wafer 1110, it may be possible to obtain the third semiconductor chip 1110' and/or the semiconductor package having a desired thin thickness.

In addition, because the semiconductor package includes the stacked structure of the plurality of first semiconductor chips 1120-1 to 1120-7, it may be possible to obtain a high integration/high capacity semiconductor package. In addition, because the semiconductor package includes the first semiconductor chip stack 1120 and the second semiconductor chip 1130' that have different functions, it may be possible to obtain a multifunctional semiconductor package. For example, it may be possible to implement an SIP (System in Package).

Furthermore, because the first semiconductor chip stack 1120 and the second semiconductor chip 1130' are surrounded by the molding layer 1150' and the third semiconductor chip 1110', it may be possible to mitigate damage to the semiconductor package in a subsequent process. For example, damage to the first semiconductor chip stack 1120 and the second semiconductor chip 1130' during the above-described dicing process may be mitigated. In addition, for example, when the semiconductor package of the present embodiment is transported, damage to the semiconductor package may be mitigated.

FIGS. 26A to 26F are cross-sectional views illustrating a semiconductor package according to another embodiment of the present disclosure, and a method for fabricating the same. It will be described focusing on differences from the above-described embodiment.

Figure 26A:
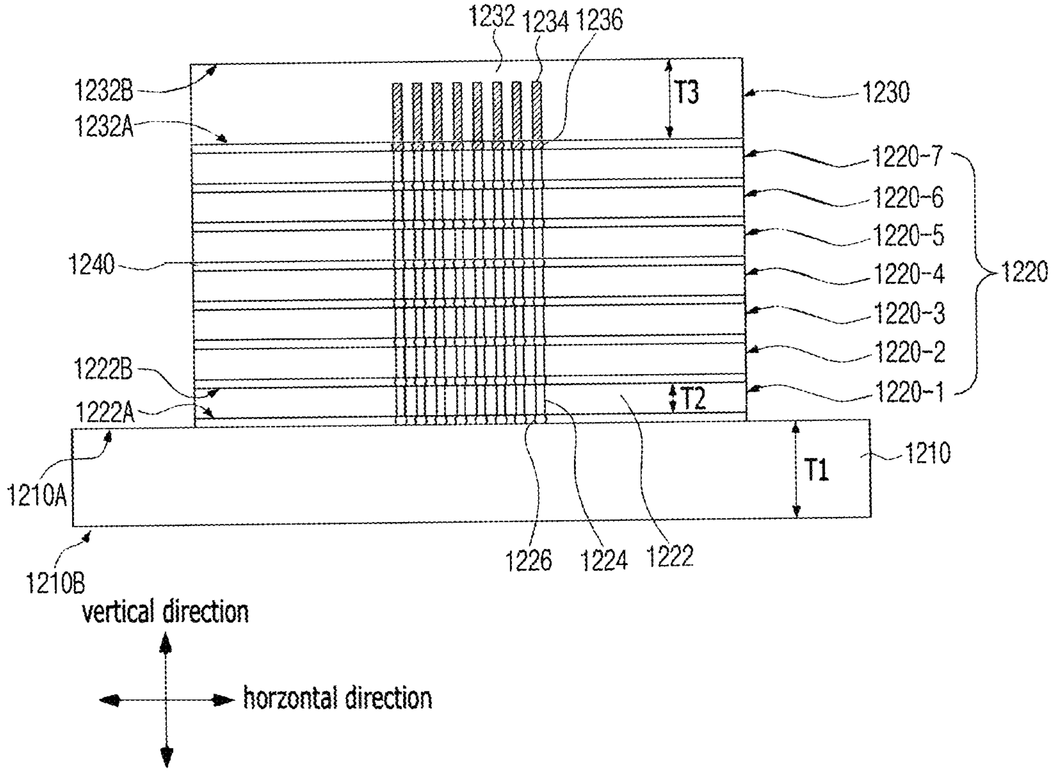
FIGS. 26A, 26B, 26C, 26D, 26E, and 26F are cross-sectional views illustrating a semiconductor package according to another embodiment of the present disclosure, and a method for fabricating the same.
Figure 26B:
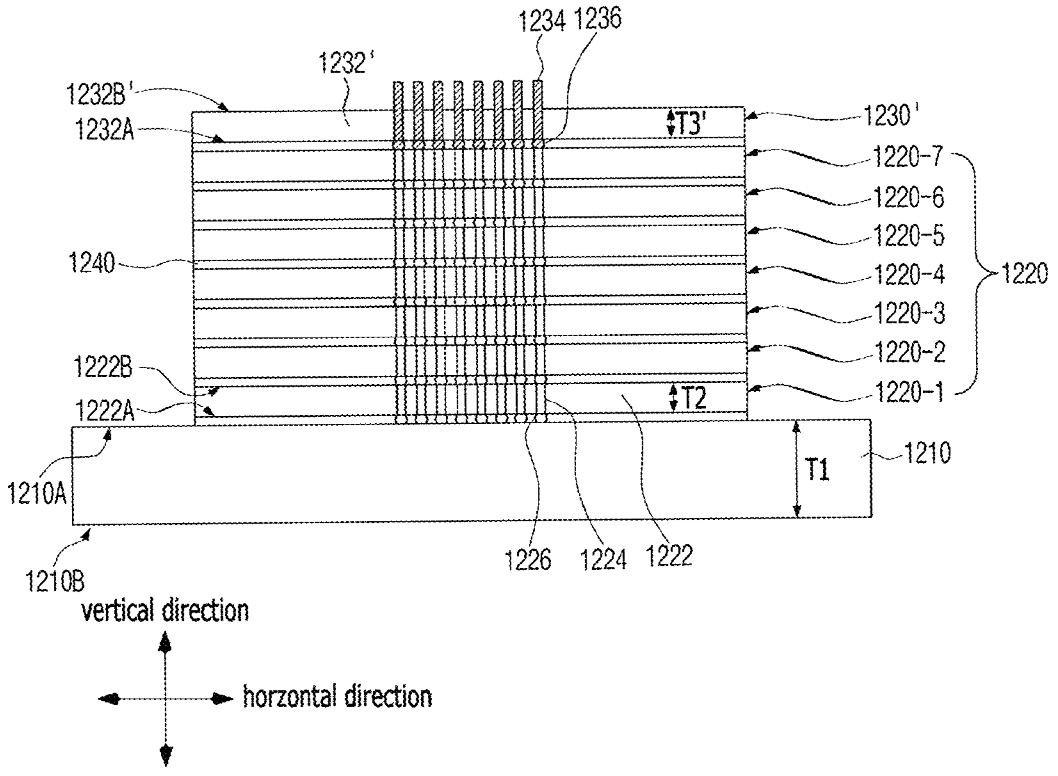

Referring to FIG. 26A, a semiconductor wafer 1210 having a first surface 1210A and a second surface 210B may be provided. The thickness of the semiconductor wafer 1210 is indicated by reference numeral T1.

Subsequently, a first semiconductor chip stack 1220 including a plurality of first semiconductor chips 1220-1 to 1220-7 stacked in a vertical direction, may be formed over the first surface 1210A of the semiconductor wafer 1210. Each of the first semiconductor chips 1220-1 to 1220-7 may include a first body portion 1222 having a first surface 1222A and a second surface 1222B, a first through electrode 1224, and a first connection electrode 1226. The thickness of the first body portion 1222 is indicated by reference numeral T2.

Subsequently, an initial second semiconductor chip 1230 may be formed over the first semiconductor chip stack 1220. The initial second semiconductor chip 1230 may include an initial second body portion 1232 having a first surface 1232A and an initial second surface 1232B, an initial second through electrode 1234, and a second connection electrode 1236. The thickness of the initial second body portion 1232 is indicated by reference numeral T3.

Spaces between the semiconductor wafer 1210 and the first semiconductor chip 1220-1, between the first semiconductor chips 1220-1 to 1220-7, and between the first semiconductor chip 1220-7 and the initial second semiconductor chip 1230 may be filled with a filling material 1240 such as an underfill.

Referring to FIG. 26, by removing a part of the initial second body portion 1232 from the initial second surface 1232B of the initial second semiconductor chip 1230 of FIG. 26A, a second body portion 1232' having a second surface 1232B' that is lowered than the initial second surface 1232B, may be formed. The thickness of the second body portion 1232' is indicated by reference numeral T3'. Accordingly, the initial second through electrode 1234 may protrude over the second surface 1232B' of the second body portion 1232' while penetrating the second body portion 1232'.

As a result, an intermediate second semiconductor chip 1230' including the second body portion 1232', the initial second through electrode 1234, and the second connection electrode 1236, may be formed.

Figure 26C:
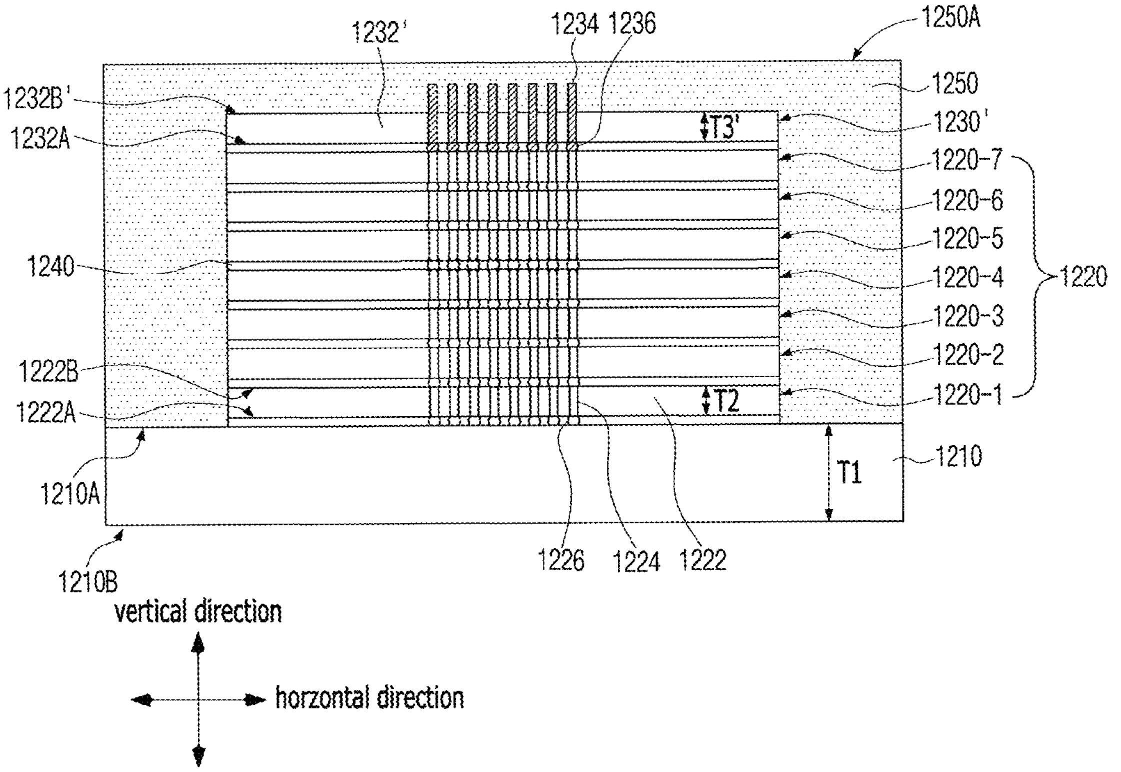

Referring to FIG. 26C, an initial molding layer 1250 may be formed over the first surface 1210A of the semiconductor wafer 1210 to cover the stacked structure of the first semiconductor chip stack 1220 and the intermediate second semiconductor chip 1230'.

The initial molding layer 1250 may surround the side surfaces of the first semiconductor chip stack 1220 and the intermediate second semiconductor chip 1230', and may cover the second through electrode 1234 of the intermediate second semiconductor chip 1230'. Accordingly, the initial molding layer 1250 may have one surface 1250A positioned at a higher level than the other end of the second through electrode 1234 in the vertical direction.

Figure 26D:
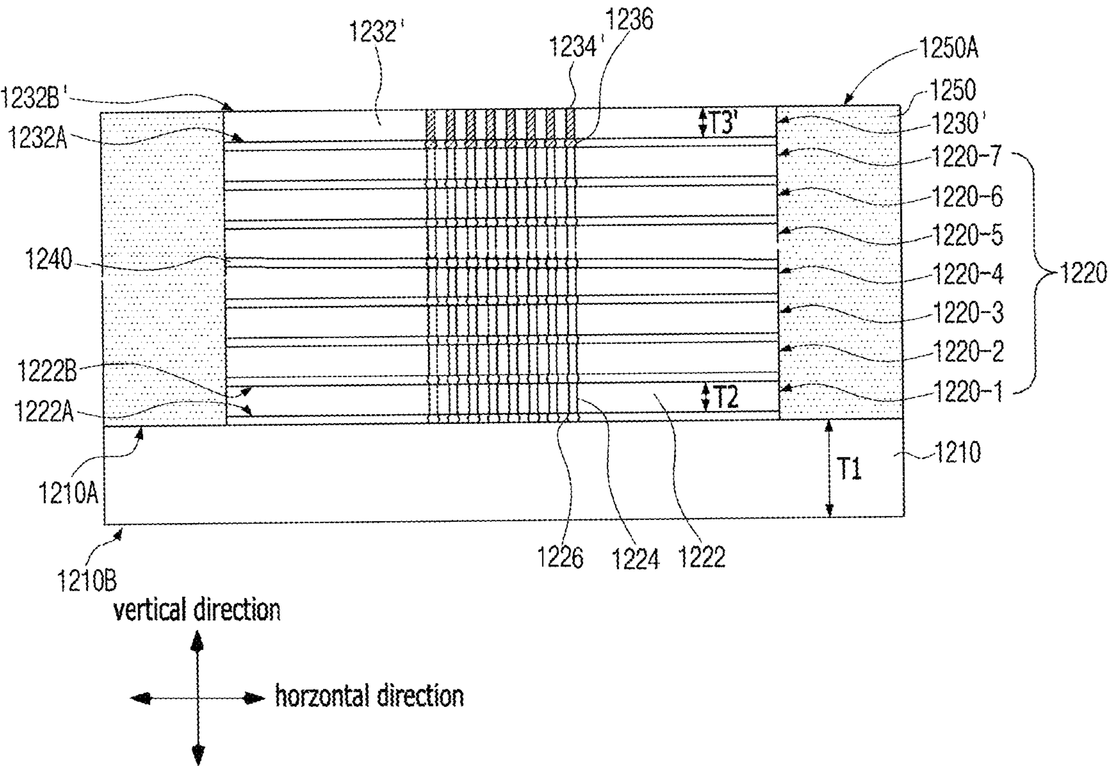

Referring to FIG. 26D, a planarization process, such as grinding or CMP, may be performed so that the second surface 1232B' of the second body portion 1232' is exposed. As a result, the protruding portion of the initial second through electrode 1234 may be removed to form a second through electrode 1234' that is buried in the second body portion 1232' while penetrating the second body portion 1232'. In the vertical direction, one end of the second through electrode 1234' may be exposed to be positioned at substantially the same level as the first surface 1232A of the second body portion 1232', and the other end of the second through electrode 1234' may be exposed to be positioned at substantially the same level as the second surface 1232B' of the second body portion 1232'. In addition, the one surface 1250A of the initial molding layer 1250 shown in FIG. 26C may be lowered to be positioned at substantially the same level as the other end of the second through electrode 1234' and the second surface 1232B' of the second body portion 1232'. The lowered one surface is indicated by reference numeral 1250A'. The one surface 1250A' may form a flat surface with the other end of the second through electrode 1234' and the second surface 1232B' of the second body portion 1232'.

As a result, a second semiconductor chip 1230" including the second body portion 1232', the second through electrode 1234', and the second connection electrode 1236, may be formed.

Meanwhile, a process sequence or method for obtaining the resultant structure of FIG. 26D may be variously modified. As an example, after forming the intermediate second semiconductor chip 1230' of FIG. 26B, the intermediate second semiconductor chip 1230' may be stacked over the first semiconductor chip stack 1220, and then, the processes of FIGS. 26C and 26D may be performed. Alternatively, as another example, after the process of FIG. 26A, the process of FIG. 26B may be omitted, and then, the process of forming the molding layer 1250 of FIG. 26C and the planarization process of the molding layer 1250 of FIG. 26D may be performed.

Figure 26E:
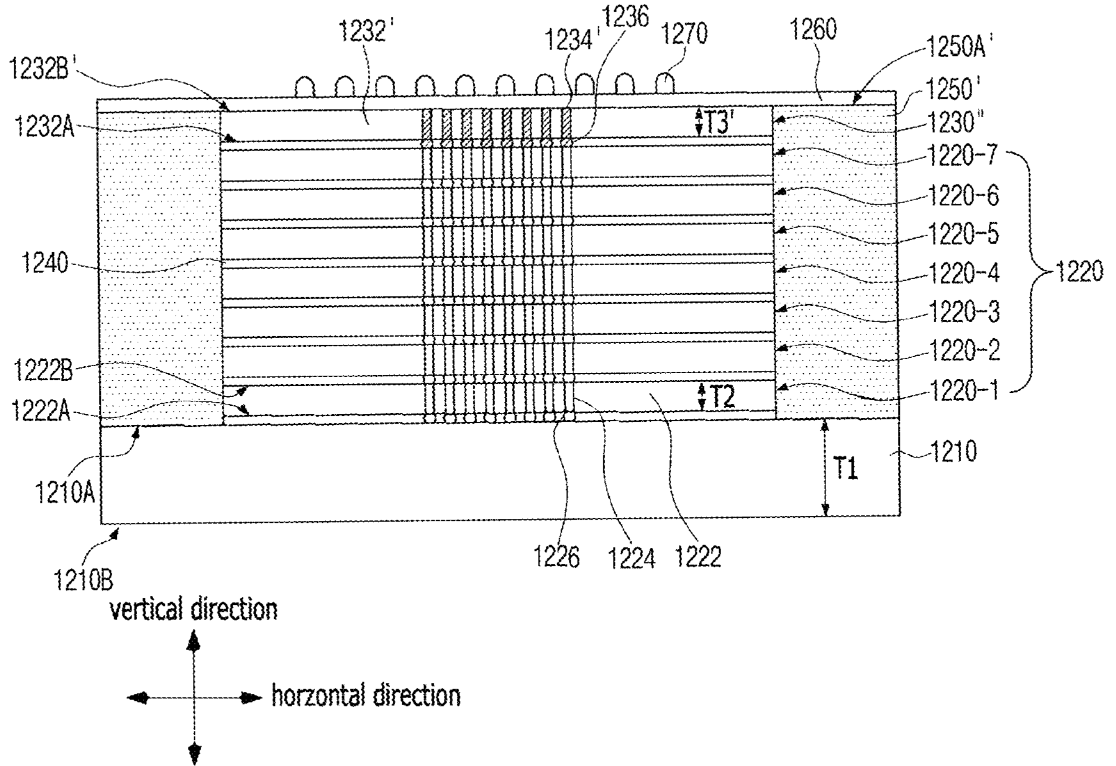

Referring to FIG. 26E, a package redistribution layer 1260 and an external connection electrode 1270 may be formed over the one surface 1250A' of the molding layer 1250'.

Figure 26F:
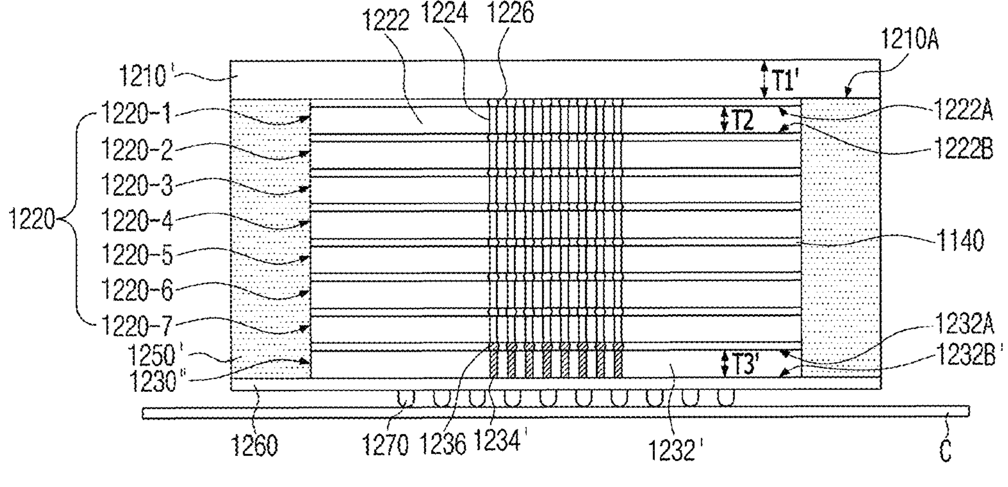
Figure 26F:
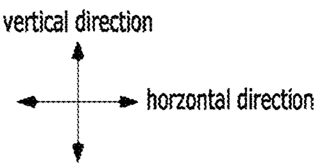

Referring to FIG. 26F, after attaching the external connection electrode 1270 to a carrier C, the resultant structure of FIG. 26E may be reversed. As a result, as shown in FIG. 26F, the upper and lower positions of the components of FIG. 26E may be reversed.

Subsequently, a thinning process and a dicing process may be performed on the resultant structure of FIG. 26E.

Subsequently, although not shown, by removing the carrier C, the semiconductor package of the present embodiment may be obtained. Here, the thinned and diced semiconductor wafer 1210 will be referred to as a third semiconductor chip 1210'. The thickness of the third semiconductor chip 1210' is indicated by reference numeral T1'.

Referring again to FIG. 26F, the semiconductor package of the present embodiment may include the second semiconductor chip 1230", the first semiconductor chip stack 1220 including the plurality of first semiconductor chips 1220-1 to 1220-7 that are disposed over the second semiconductor chip 1230" and stacked in the vertical direction, the molding layer 1250' surrounding the side surfaces of the first semiconductor chip stack 1220 and the second semiconductor chip 1230", and the third semiconductor chip 1210' disposed over the first semiconductor chip stack 1220 and the molding layer 1250'.

Here, apart from the above-described embodiment, the second through electrode 1234' might not protrude outside the second body portion 1232' while penetrating the second body portion 1232' within the second body portion 1232'. Accordingly, the other end, for example, a lower end of the second through electrode 1234' may be exposed to be positioned at substantially the same level as the second surface 1232B' of the second body portion 1232'. In addition, the one surface 1250A' of the molding layer 1250' may be located at substantially the same level as the other end of the second through electrode 1234' and the second surface 1232B' of the second body portion 1232' to expose them.

The other end of the second through electrode 1234', which has been exposed, may be connected to the external connection electrode 1270 via the package redistribution layer 1260, or directly.

Even according to the present embodiment, it may be possible to have all the advantages of the above-described embodiment.

Meanwhile, the structure of FIG. 25D described above, that is, the structure in which the second through electrode 1134 includes the protruding portion 1134B protruding from the second surface 1232' of the second body portion 1132', and the molding layer 1150' exposes the other end, for example, the upper end of the protruding portion 1134B, may be variously modified. This will be described, for example, with reference to FIGS. 27A to 29G below. In these figures, only portions corresponding to the second semiconductor chip 1130' and the molding layer 1150' surrounding it, are illustrated for convenience.

FIGS. 27A to 27D are partial cross-sectional views illustrating a semiconductor package according to another embodiment of the present disclosure, and a method for fabricating the semiconductor package.

Figure 27A:
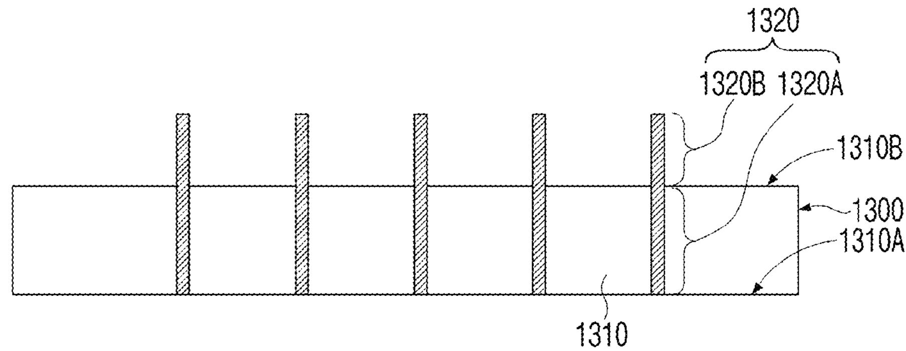
FIGS. 27A, 27B, 27C, and 27D are partial cross-sectional views illustrating a semiconductor package according to another embodiment of the present disclosure, and a method for fabricating the same.

Referring to FIG. 27A, a semiconductor chip 1300 including a body portion 1310 and a through electrode 1320 may be provided.

The body portion 1310 may include a first surface 1310A and a second surface 1310B positioned opposite to the first surface 1310A.

The through electrode 1320 may protrude over the second surface 1310B of the body portion 1310 while penetrating the body portion 1310. A portion of the through electrode 1320, which is buried in the body portion 1310 and penetrates the body portion 1310, will be referred to as a through portion 1320A, and a portion of the through electrode 1320, which protrudes over the body portion 1310, will be referred to as a protruding portion 1320B.

Figure 27B:
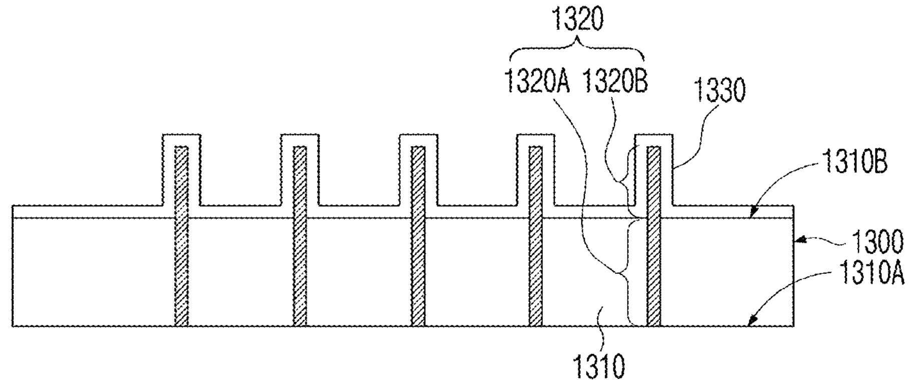

Referring to FIG. 27B, an initial protective layer 1330 may be formed along its lower profile, over the second surface 1310B of the body portion 1310 and the protruding portion 1320B of the through electrode 1320.

The initial protective layer 1330 may be formed using a deposition method having excellent step coverage characteristics such as chemical vapor deposition (CVD). In addition, the initial protective layer 1330 may include various insulating materials such as silicon oxide, silicon nitride, or a combination thereof.

Figure 27C:
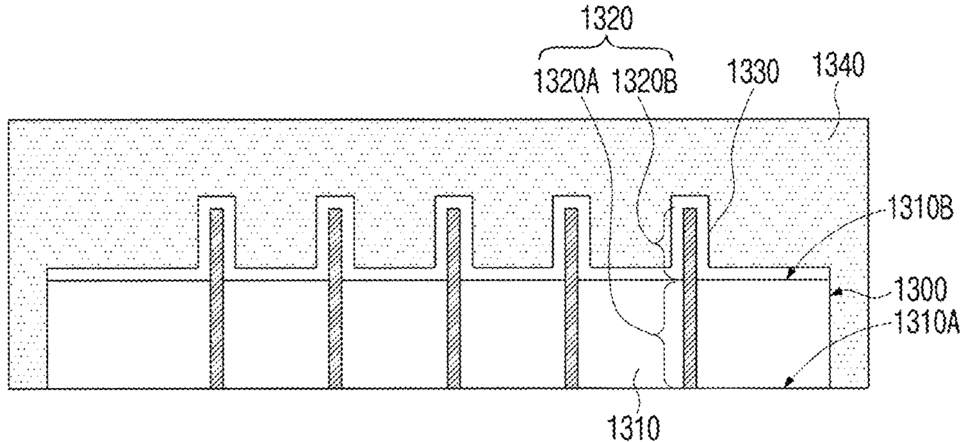

Referring to FIG. 27C, an initial molding layer 1340 covering the semiconductor chip 1300 may be formed.

The initial molding layer 1340 may be formed to cover the initial protective layer 1330 while surrounding the side surface of the semiconductor chip 1300. Accordingly, the initial molding layer 1340 may have an upper surface positioned at a level higher than the maximum height of the upper surface of the initial protective layer 1330.

Figure 27D:
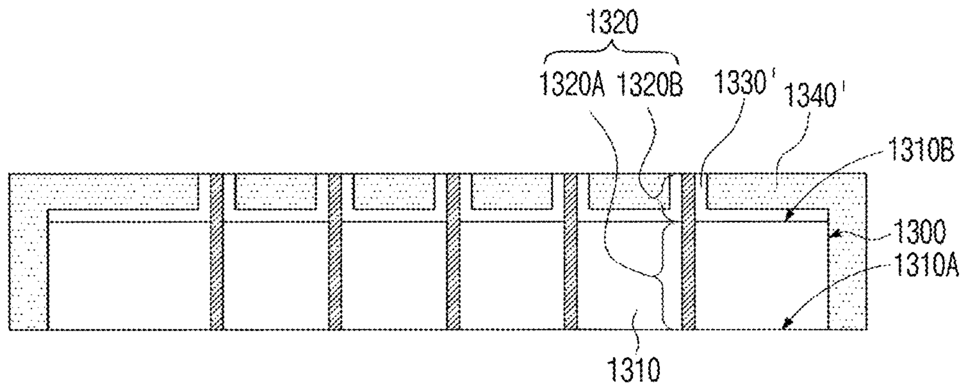

Referring to FIG. 27D, a planarization process may be performed so that the upper end of the through electrode 1320, that is, the upper end of the protruding portion 1320B is exposed. This planarization process may be performed using grinding, CMP, or the like.

During the planarization process, the protruding portion 1320B may be substantially maintained. That is, the protruding portion 1320B might not be lost or may be lost to a very small extent. However, the present disclosure is not limited thereto, and the protruding portion 1320B may be lost to a predetermined degree according to a recipe of the planarization process, and the height thereof may be lowered. The word "predetermined" as used herein with respect to a parameter, such as a predetermined degree, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

As a result of this process, a part of the initial molding layer 1340 and a part of the initial protective layer 1330, which are located over the protruding portion 1320B, may be removed to form a molding layer 1340' and a protective layer 1330', respectively.

The protective layer 1330' may be formed along its lower profile, over the side surface of the protruding portion 1320B and the second surface 1310B of the body portion 1310. The side and lower surfaces of the molding layer 1340' between the protruding portions 1320B may be surrounded by the protective layer 1330'. Accordingly, the protective layer 1330' may be interposed between the molding layer 1340' and the side surface of the protruding portion 1320B, and between the molding layer 1340' and the second surface 1310B of the body portion 1310.

In the vertical direction, the upper surface of the molding layer 1340' and the upper surface of the maximum height of the protective layer 1330' may be positioned at substantially the same level as the upper end of the protruding portion 1320B. That is, the upper surface of the molding layer 1340', the upper surface of the maximum height of the protective layer 1330', and the upper end of the protruding portion 1320B may form a flat surface.

Subsequent processes may be substantially the same as those described in FIGS. 25E and 25F. That is, although not illustrated, a package redistribution layer and/or an external connection electrode connected to the upper end of the through electrode 1320 may be formed over the flat surface.

The body portion 1310, the through electrode 1320, and the molding layer 1340' of FIG. 27D may correspond to the second body portion 1132', the second through electrode 1134, and the molding layer 1150' of FIG. 25D, respectively.

According to the present embodiment, because the protective layer 1330' is further interposed between the adjacent through electrodes 1320, it may be possible to mitigate the occurrence of defects due to movement of metal ions between the through electrodes 1320. This is because the protective layer 1330' as an insulating material mitigates movement of metal ions.

FIGS. 28A to 28F are partial cross-sectional views illustrating a semiconductor package according to another embodiment of the present disclosure, and a method for fabricating the same.

Figure 28A:
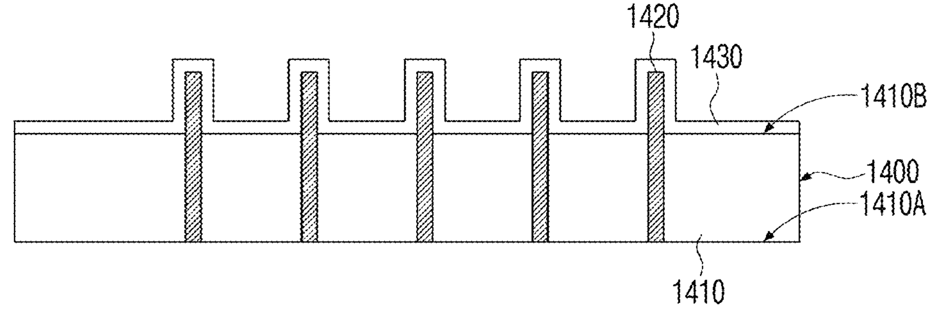
FIGS. 28A, 28B, 28C, 28D, 28E, and 28F are partial cross-sectional views illustrating a semiconductor package according to another embodiment of the present disclosure, and a method for fabricating the same.

Referring to FIG. 28A, a semiconductor chip 1400 including a body portion 1410 and an initial through electrode 1420 may be provided.

The body portion 1410 may include a first surface 1410A and a second surface 1410B positioned opposite to the first surface 1410A. The initial through electrode 1420 may protrude over the second surface 1410B of the body portion 1410 while penetrating the body portion 1410.

Subsequently, an initial first protective layer 1430 may be formed over the second surface 1410B of the body portion 1410 and the protruding portion of the initial through electrode 1420, along its lower profile.

The initial first protective layer 1430 may be formed using a deposition method having step coverage characteristics such as CVD. In addition, the initial first protective layer 1430 may include various insulating materials such as silicon oxide, silicon nitride, or a combination thereof.

Figure 28B:
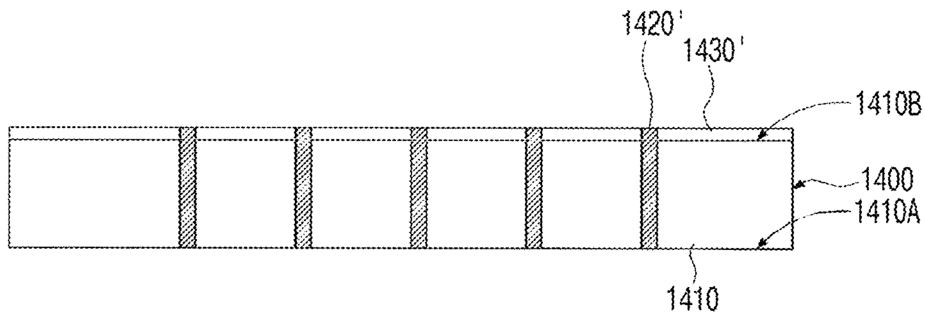

Referring to FIG. 28B, a planarization process, such as CMP, may be performed so that the protruding portion of the initial through electrode 1420 is removed. This planarization process may be performed by targeting an upper surface of a part of the initial first 5 protective layer 1430, which is positioned over the second surface 1410B of the body portion 1410.

As a result of the present process, a first protective layer 1430' positioned over the second surface 1410B of the body portion 1410, and a through electrode 1420' penetrating the body portion 1410 and the first protective layer 1430', may be formed. The upper surface of the first protective layer 1430' and the upper end of the through electrode 1420' may be positioned at the same level in the vertical direction to form a flat surface.

However, the present disclosure is not limited thereto, and in another embodiment, the planarization process may be performed so that the second surface 1410B of the body portion 1410 is exposed. In this case, the initial first protective layer 1430 may be removed, and the through electrode 1420' may penetrate the body portion 1410. Also, the second surface 1410B of the body portion 1410 may be positioned at the same level as the upper end of the through electrode 1420' to form a flat surface.

Figure 28C:
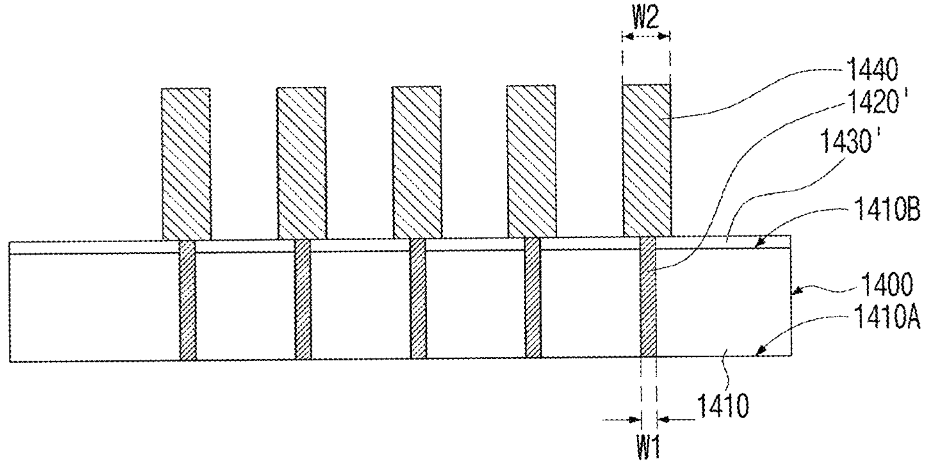

Referring to FIG. 28C, an additional connection electrode 1440 connected to the through electrode 1420' may be formed over the upper surfaces of the first protective layer 1430' and the through electrode 1420'.

The additional connection electrode 1440 may be, as an example, a conductive bump. However, the present disclosure is not limited thereto, and the additional connection electrode 1440 may include various metal materials, solder materials, or a combination thereof. In addition, the additional connection electrode 1440 may have various shapes such as a pillar shape, a ball shape, or a combination thereof.

The additional connection electrode 1440 may be formed by forming a photoresist (not shown), which has an opening exposing the through electrode 1420', over the upper surfaces of the first protective layer 1430' and the through electrode 1420', forming the additional connection electrode 1440 filling the opening by electroplating, and removing the photoresist by a strip process.

The additional connection electrode 1440 may be formed of the same material as the through electrode 1420', or may be formed of a different material from the through electrode 1420'. In addition, the additional connection electrode 1440 may have a width W2 greater than a width W1 of the through electrode 1420' in the horizontal direction.

Figure 28D:
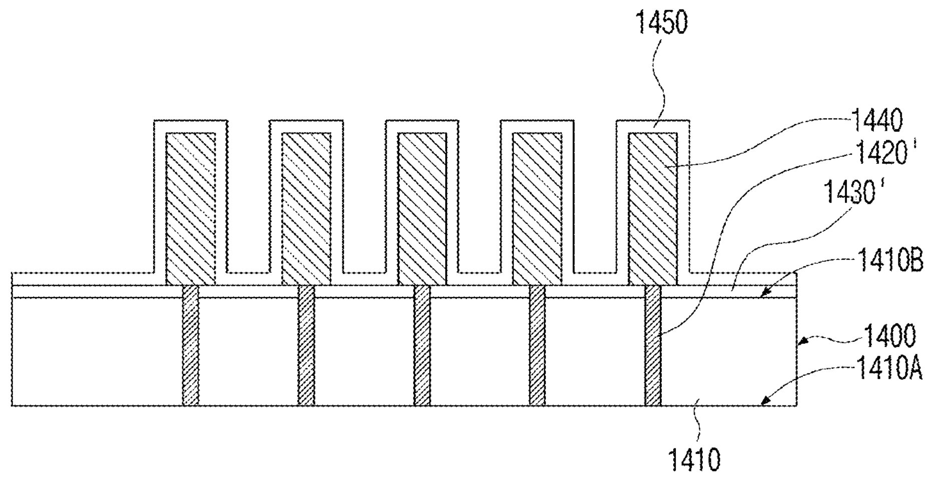

Referring to FIG. 28D, an initial second protective layer 1450 may be formed over the upper surfaces of the first protective layer 1430' and the additional connection electrode 1440, along its lower profile.

The initial second protective layer 1450 may be formed using a deposition method having excellent step coverage characteristics such as CVD. In addition, the initial second protective layer 1450 may include various insulating materials such as silicon oxide, silicon 5 nitride, or a combination thereof. The initial second protective layer 1450 may be formed of the same material as the first protective layer 1430', or may be formed of a different material from the first protective layer 1430'.

Figure 28E:
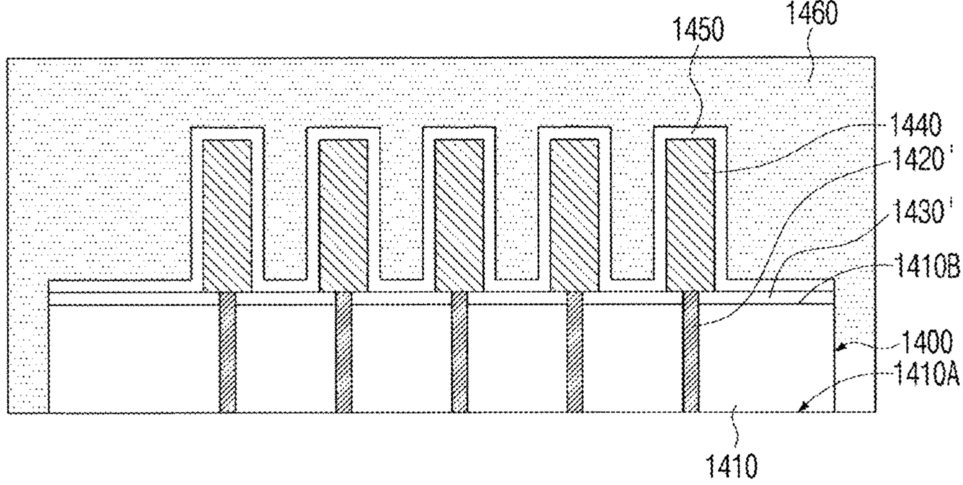

Referring to FIG. 28E, an initial molding layer 1460 covering the semiconductor chip 1400 in which the initial second protective layer 1450 is formed, may be formed.

The initial molding layer 1460 may be formed to cover the initial second protective layer 1450 while surrounding the side surface of the semiconductor chip 1400. Accordingly, the initial molding layer 1460 may have an upper surface positioned at a higher level than the upper surface of the maximum height of the second initial protective layer 1450.

Figure 28F:
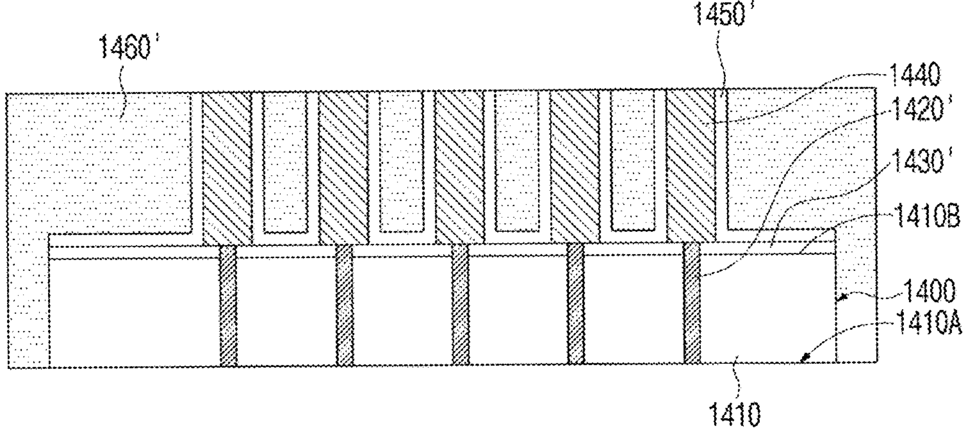

Referring to FIG. 28F, a planarization process may be performed so that the upper surface of the additional connection electrode 1440 is exposed. This planarization process may be performed using grinding, CMP, or the like.

During the planarization process, the additional connection electrode 1440 may be substantially maintained. That is, the additional connection electrode 1440 might not be lost or may be lost to a very small extent. However, the present disclosure is not limited thereto, and a part of the additional connection electrode 1440 may be lost.

As a result of this process, a part of the initial molding layer 1460 and a part of the initial second protective layer 1450, which are located over the additional connection electrode 1440, may be removed to form a molding layer 1460' and a second protective layer 1450', respectively.

The second protective layer 1450' may be formed over the side surface of the additional connection electrode 1440 and the upper surface of the first protective layer 1430', along its lower profile. Side and lower surfaces of the molding layer 1460' between the additional connection electrodes 1440 may be surrounded by the second protective layer 1450'. Accordingly, the second protective layer 1450' may be interposed between the molding layer 1460' and the side surface of the additional connection electrode 1440, and between the molding layer 1460' and the upper surface of the first protective layer 1430'. In the vertical direction, the upper surface of the molding layer 1460', the upper surface of the maximum height of the second protective layer 1450', and the upper surface of the additional connection electrode 1440 may form a flat surface.

The body portion 1410 and the molding layer 460' of FIG. 28F may correspond to the second body portion 1132' and the molding layer 1150' of FIG. 25D, respectively. The through electrode 1420' and the additional connection electrode 1440 of FIG. 28F may substantially correspond to the second through electrode 1134 of FIG. 25D. In particular, the through electrode 1420' of FIG. 28F may perform substantially the same function as the through portion 1134A of the second through electrode 1134 of FIG. 25D, and the additional connection electrode 1440 of FIG. 28F may perform substantially the same function as the protruding portion 1134B of the second through electrode 1134 of FIG. 25D. However, the through portion 1134A and the protruding portion 1134B of FIG. 25D may be integrally formed, while the through electrode 1420' and the additional connection electrode 1440 of FIG. 28F may be formed in separate processes. Therefore, the through electrode 1420' and the additional connection electrode 1440 may have different widths and/or materials from each other.

Subsequent processes may be substantially the same as those described in FIGS. 25E and 25F. That is, although not shown, a package redistribution layer and/or an external connection electrode may be formed over the flat surface to be connected to the upper surface of the additional connection electrode 1440.

According to the present embodiment, because the second protective layer 1450' is further interposed between the adjacent additional connection electrodes 1440, it may be possible to mitigate occurrence of defects due to metal ion movement between the additional connection electrodes 1440.

Furthermore, because the width of the additional connection electrode 1440 is increased, alignment and connection with the package redistribution layer and/or the external connection electrode may be facilitated.

FIGS. 29A to 29G are partial cross-sectional views illustrating a semiconductor package according to another embodiment of the present disclosure, and a method for fabricating the same.

Figure 29A:
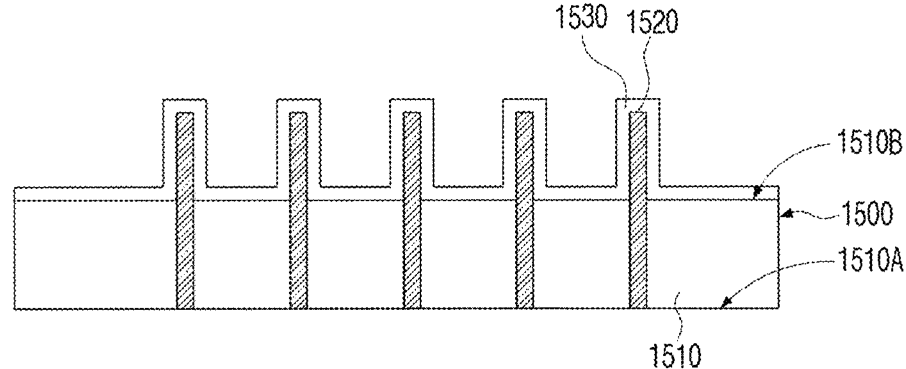
FIGS. 29A, 29B, 29C, 29D, 29E, 29F, and 29G are partial cross-sectional views illustrating a semiconductor package according to another embodiment of the present disclosure, and a method for fabricating the same.

Referring to FIG. 29A, a semiconductor chip 1500 including a body portion 1510 and an initial through electrode 1520 may be provided.

The body portion 1510 may include a first surface 1510A and a second surface 1510B positioned opposite to the first surface 1510A. The initial through electrode 1520 may protrude over the second surface 1510B of the body portion 1510 while penetrating the body portion 1510.

Subsequently, an initial first protective layer 1530 may be formed over the second surface 1510B of the body portion 1510 and the protruding portion of the initial through electrode 1520, along its lower profile.

The initial first protective layer 1530 may be formed using a deposition method having excellent step coverage characteristics such as CVD. In addition, the initial first protective layer 1530 may include various insulating materials such as silicon oxide, silicon nitride, or a combination thereof.

Figure 29B:
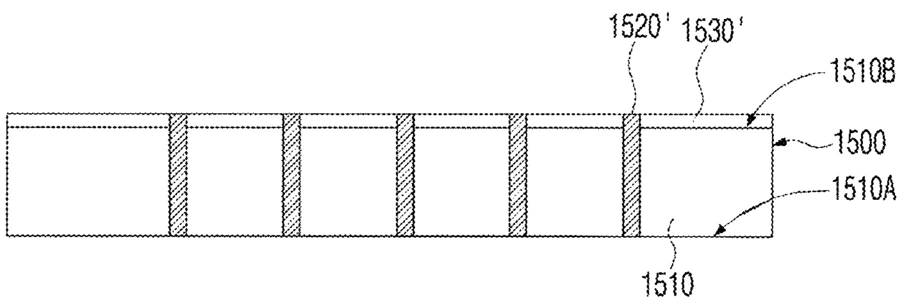

Referring to FIG. 29B, a planarization process, such as CMP, may be performed so that the protruding portion of the initial through electrode 1520 is removed. This planarization process may be performed by targeting an upper surface of a part of the initial first 5 protective layer 1530, which is positioned over the second surface 1510B of the body portion 1510.

As a result of the present process, a first protective layer 1530' positioned over the second surface 1510B of the body portion 1510, and a through electrode 1520' penetrating the body portion 1510 and the first protective layer 1530', may be formed. The upper surface of the first protective layer 1530' and the upper end of the through electrode 1520' may be positioned at the same level in the vertical direction to form a flat surface.

However, the present disclosure is not limited thereto, and in another embodiment, the planarization process may be performed so that the second surface 1510B of the body portion 1510 is exposed. In this case, the initial first protective layer 1530 may be removed, and the through electrode 1520' may penetrate the body portion 1510.

Figure 29C:
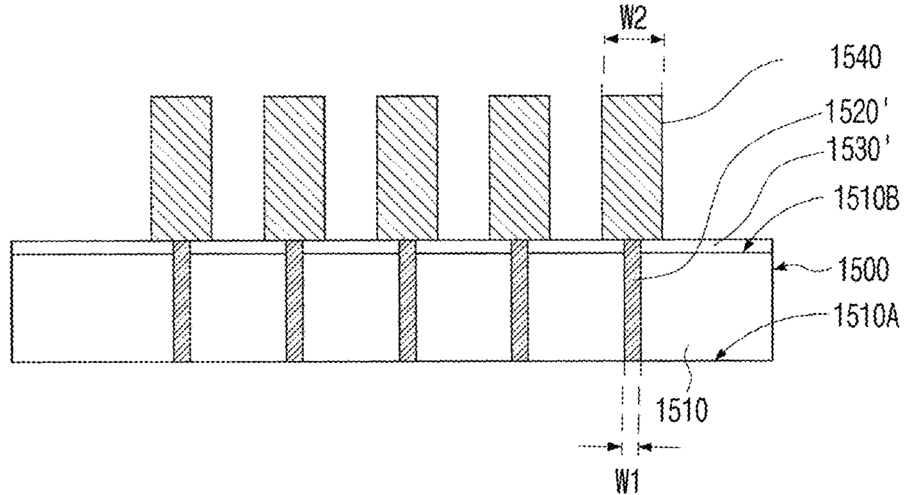

Referring to FIG. 29C, an additional connection electrode 1540 may be formed over the upper surfaces of the first protective layer 1530' and the through electrode 1520' to be connected to the through electrode 1520'.

The additional connection electrode 1540 may be, as an example, a conductive bump. However, the present disclosure is not limited thereto, and the additional connection electrode 1540 may include various metal materials, solder materials, or a combination thereof. In addition, the additional connection electrode 1540 may have various shapes such as a pillar shape, a ball shape, or a combination thereof. The additional connection electrode 1540 may be formed of the same material as the through electrode 1520', or may be formed of a different material from the through electrode 1520'. In addition, the additional connection electrode 1540 may have a width W2 greater than a width W1 of the through electrode 1520' in the horizontal direction.

Figure 29D:
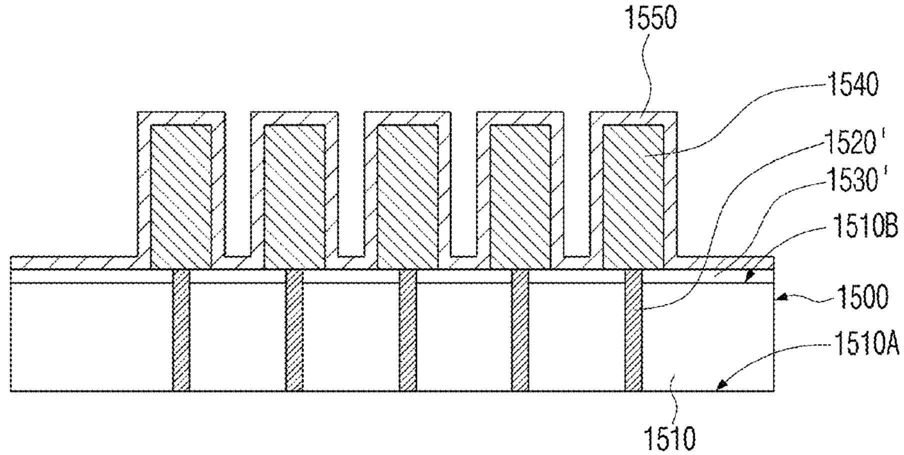

Referring to FIG. 29D, an initial metal barrier layer 1550 may be formed over the upper surfaces of the first protective layer 1530' and the additional connection electrode 1540, along its lower profile.

The initial metal barrier layer 1550 may serve to mitigate the movement of metal ions from the additional connection electrode 1540. The initial metal barrier layer 1550 may be formed by a deposition method having excellent step coverage characteristics such as CVD. In addition, the initial metal barrier layer 1550 may include a metal such as titanium or tantalum, or a compound of the metal.

Figure 29E:
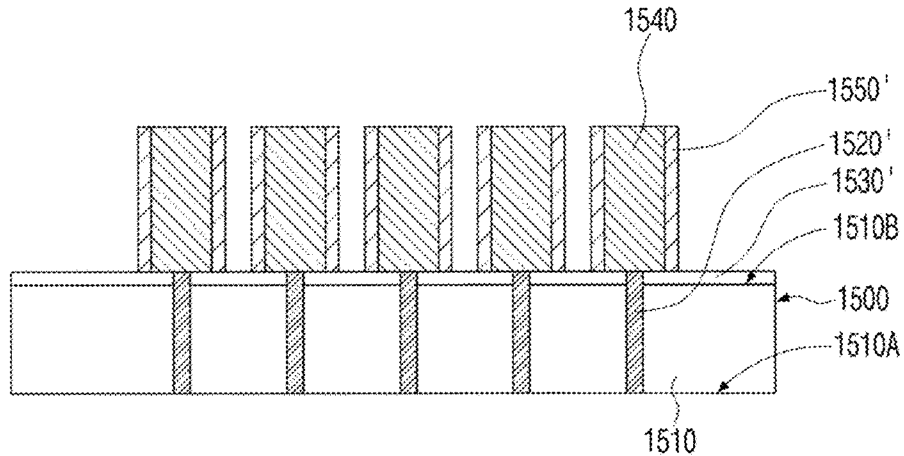

Referring to FIG. 29E, a metal barrier layer 1550' may be formed by removing a part of the initial metal barrier layer 1550, which is located over the upper surface of the first protective layer 1530'. That is, the metal barrier layer 1550', which is in contact with one of the additional connection electrodes 1540 may be electrically and physically separated from the metal barrier layer 1550', which is in contact with adjacent one of the additional connection electrodes 1540. If such electrical and physical separation is not made, an electrical short between the additional connection electrodes 1540 may occur.

In the present embodiment, the removal process of the part of the initial metal barrier layer 1550 may be performed by using a blanket dry etching method. In this case, the metal barrier layer 1550' may be formed only on the side surface of the additional connection electrode 1540. However, the present disclosure is not limited thereto, and the metal barrier layer 1550' may be further present on the upper surface of the additional connection electrode 1540.

Figure 29F:
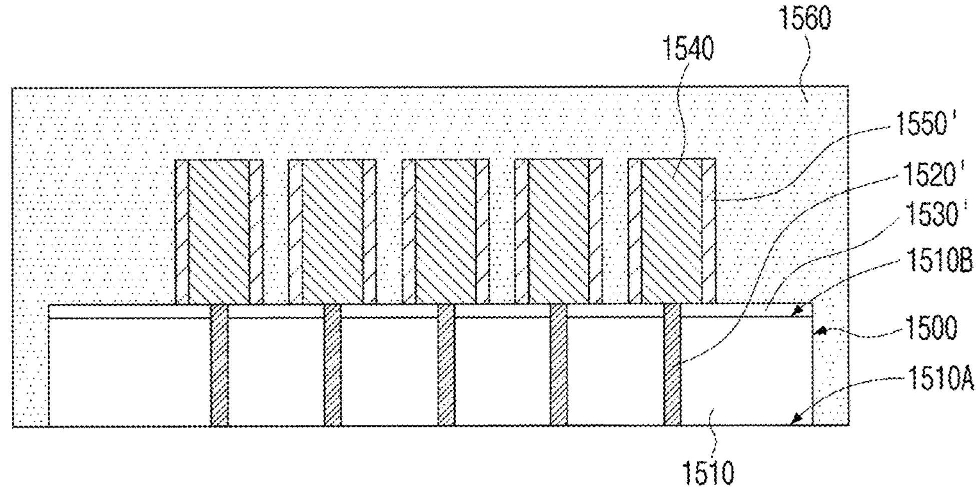

Referring to FIG. 29F, an initial molding layer 1560 covering the semiconductor chip 1500 in which the metal barrier layer 1550' is formed, may be formed.

The initial molding layer 1560 may be formed to cover the metal barrier layer 1550' and the additional connection electrode 1540 while surrounding the side surface of the semiconductor chip 1500. Accordingly, the initial molding layer 1560 may have an upper surface positioned at a higher level than the upper surfaces of the additional connection electrode 1540 and the metal barrier layer 1550'.

Figure 29G:
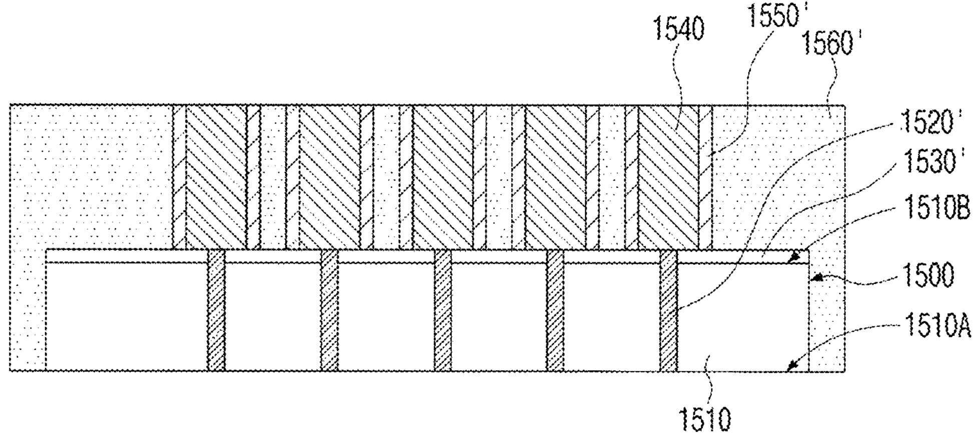

Referring to FIG. 29G, a planarization process may be performed so that the upper surface of the additional connection electrode 1540 is exposed. This planarization process may be performed using grinding, CMP, or the like.

During the planarization process, the additional connection electrode 1540 may be substantially maintained. That is, the additional connection electrode 1540 might not be lost or may be lost to a very small extent. However, the present disclosure is not limited thereto, and a part of the additional connection electrode 1540 may be lost.

As a result of the present process, a part of the initial molding layer 1560 located over the additional connection electrode 1540 may be removed to form a molding layer 1560'.

The metal barrier layer 1550' may be interposed between the side surface of the additional connection electrode 1540 and the molding layer 1560'. In the vertical direction, the upper surface of the molding layer 1560', the upper surface of the metal barrier layer 1550', and the upper surface of the additional connection electrode 1540 may form a flat surface.

The body portion 1510 and the molding layer 1560' of FIG. 29G may correspond to the second body portion 132' and the molding layer 1150' of FIG. 25D, respectively. The through electrode 1520' and the additional connection electrode 1540 of FIG. 29G may substantially correspond to the second through electrode 1134 of FIG. 25D. In particular, the through electrode 1520' of FIG. 29G may perform substantially the same function as the through portion 1134A of the second through electrode 1134 of FIG. 25D, and the additional connection electrode 1540 of FIG. 29G may perform substantially the same function as the protruding portion 1134B of the second through electrode 1134 of FIG. 25D. However, the through portion 1134A and the protruding portion 1134B of FIG. 25D may be integrally formed, while the through electrode 1520' and the additional connection electrode 1540 of FIG. 29G may be formed in separate processes. Therefore, the through electrode 1520' and the additional connection electrode 1540 may have different widths and/or materials from each other.

Subsequent processes may be substantially the same as those described in FIGS. 25E and 25F. That is, although not shown, a package redistribution layer and/or an external connection electrode may be formed over the flat surface to be connected to the upper surface of the additional connection electrode 1540.

According to the present embodiment, because the metal barrier layer 1550' is further interposed between the adjacent additional connection electrodes 1540, it may be possible to mitigate the occurrence of defects due to the movement of metal ions between the additional connection electrodes 1540.

Furthermore, because the width of the additional connection electrode 1540 is increased, alignment and connection with the package redistribution layer and/or the external connection electrode may be facilitated.

According to the above embodiments of the present disclosure, it may be possible to provide a semiconductor package capable of having a thin thickness and reducing process defects while satisfying the demands of high integration/high capacity.

Figure 30:
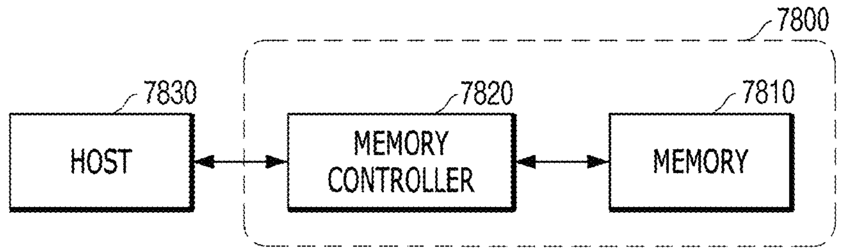
FIG. 30 shows a block diagram illustrating an electronic system employing a memory card including a semiconductor package, according to an embodiment.

FIG. 30 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 31:
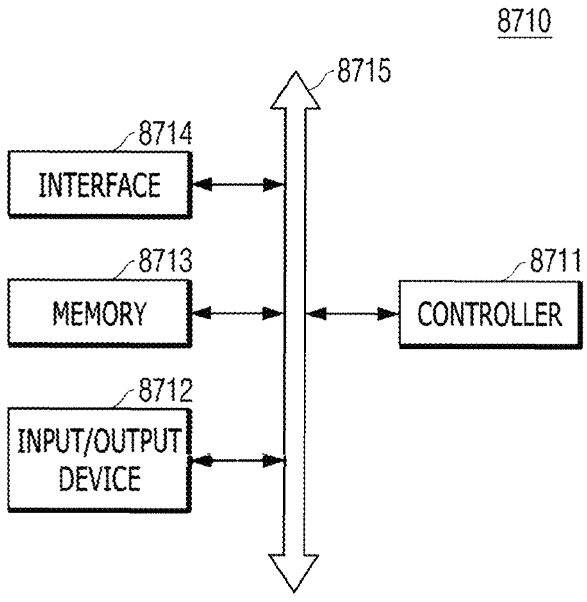
FIG. 31 shows a block diagram illustrating another electronic system including a semiconductor package, according to an embodiment.

FIG. 31 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A memory system comprising:

a first chip configured to perform a first operation; and a stacked memory device configured to include a stacked structure of a plurality of memory cells, the stacked memory device being configured to be accessed by the first chip through a shared bus, and a second semiconductor chip including a second body portion, a second through electrode that penetrates the second body portion, and a second connection electrode that is connected to one end of the second through electrode, wherein the stacked memory device is disposed over the second semiconductor chip and includes a plurality of first semiconductor chips stacked in a vertical direction, and each of the plurality of first semiconductor chips includes a first body portion, a first through electrode penetrating the first body portion, and a first connection electrode connected to one end of the first through electrode, wherein, the second semiconductor chip and the plurality of first semiconductor chips are electrically connected through the second through electrode, the second connection electrode, the first through electrodes, and the first connection electrodes, wherein the stacked memory device includes a memory chip, and the second semiconductor chip includes a logic chip for controlling the memory chip.

2. The memory system according to claim 1, wherein the stacked memory device includes at least one Through Silicon Via (TSV) coupling the plurality of memory cells.

3. The memory system according to claim 1, further comprising:

a buffer layer configured to electrically couple the shared bus to the first chip; and an interface channel disposed below the first chip and the buffer layer.

4. The memory system according to claim 3, wherein the buffer layer includes:

a first interface circuit coupling the first chip to the shared bus.

5. The memory system according to claim 4, wherein the shared bus includes:

a first bus through which the first interface circuit and a second interface circuit are electrically coupled to each other, the first bus extending in a first direction; and a second bus through which the first bus is coupled to the plurality of memory cells, the second bus extending in a second direction.

6. The memory system according to claim 1, further comprising:

a molding layer surrounding side surfaces of the second semiconductor chip and the stacked memory device;

a third semiconductor chip disposed over the molding layer and the stacked memory device; and an external connection electrode electrically connected to an other end of the second through electrode.

7. The memory system according to claim 6, further comprising:

the third semiconductor chip which is a dummy semiconductor chip.

8. The memory system according to claim 7, wherein a planar area of the third semiconductor chip is greater than a planar area of the first semiconductor chip and a planar area of the stacked memory device.

9. The memory system according to claim 6, further comprising:

a package redistribution layer disposed between the second semiconductor chip and the external connection electrode, and electrically connecting the other end of the second through electrode and the external connection electrode.

10. The memory system according to claim 6, wherein the second connection electrode is disposed over a first surface of the second body portion, and the molding layer has one surface located at the same level as a second surface of the second body portion, which is located opposite to the first surface of the second body portion.

11. The memory system according to claim 6, wherein the second connection electrode is disposed over a first surface of the second body portion, the second through electrode includes a through portion penetrating the second body portion, and a protruding portion connected to the through portion and protruding over a second surface of the second body portion, which is located opposite to the first surface of the second body portion, and the molding layer covers the second surface of the second body portion and surrounds a side surface of the protruding portion.

12. The memory system according to claim 6, further comprising:

a protective layer interposed between the molding layer and the side surface of the protruding portion of the second through electrode.

13. The memory system according to claim 12, wherein the protective layer includes an insulating material.

14. The memory system according to claim 13, wherein the protective layer is further interposed between the second surface of the second body portion and the molding layer.

15. The memory system according to claim 6, wherein the second connection electrode is disposed over a first surface of the second body portion, and the memory system further comprising:

an additional connection electrode disposed over a second surface of the second body portion, which is located opposite to the first surface of the second body portion, and connected to the second through electrode, and wherein the molding layer covers the second surface of the second body portion and surrounds a side surface of the additional connection electrode.

16. The memory system according to claim 15, further comprising:

a protective layer interposed between the molding layer and the side surface of the additional connection electrode.

17. The memory system according to claim 16, wherein the protective layer includes an insulating material.

18. The memory system according to claim 16, wherein the protective layer is further interposed between the second surface of the second body portion and the molding layer.

19. The memory system according to claim 15, further comprising:

a metal barrier layer interposed between the side surface of the additional connection electrode and the molding layer.

20. The memory system according to claim 15, wherein a width of the additional connection electrode is greater than a width of the second through electrode.

21. The memory system according to claim 6, wherein a thickness of the third semiconductor chip, a thickness of the first body portion of each of the first semiconductor chips, and a thickness of the second body portion of the second semiconductor chip all have substantially the same value.

22. The memory system according to claim 1, wherein the memory chip includes at least one memory cell and one of the plurality of first semiconductor chips includes at least one memory cell.

23. The memory system according to claim 1, wherein the memory chip is a first memory die including at least one memory cell and one of the plurality of first semiconductor chips is a second memory die including at least one memory cell.

* * * * *